United States Patent [19]

Ooishi

[11] Patent Number: 5,801,576
[45] Date of Patent: Sep. 1, 1998

[54] SEMICONDUCTOR INTEGRATED CIRCUIT DEVICE HAVING A HIERARCHICAL POWER SOURCE CONFIGURATION

[75] Inventor: Tsukasa Ooishi, Hyogo, Japan

[73] Assignee: Mitsubishi Denki Kabushiki Kaisha, Tokyo, Japan

[21] Appl. No.: 957,341

[22] Filed: Oct. 24, 1997

Related U.S. Application Data

[62] Division of Ser. No. 546,747, Oct. 23, 1995, Pat. No. 5,751,651.

[30] Foreign Application Priority Data

Nov. 7, 1994 [JP] Japan .................................. 6-272592

[51] Int. Cl.$^6$ ........................................................ G11C 7/00
[52] U.S. Cl. ...................... 327/530; 327/535; 327/537; 327/538; 327/543; 327/545
[58] Field of Search ................................. 327/530, 535, 327/537, 538, 543, 545

[56] References Cited

U.S. PATENT DOCUMENTS 5,521,527  5/1996  Sakata et al. .
5,583,457  12/1996  Horiguchi et al. .
5,689,460  11/1997  Ooishi ................................. 365/189.07

OTHER PUBLICATIONS

"256Mb DRAM Technologies for File Application", Kitsukawa et al., *IEEE International Solid-State Circuits Conference*, Feb. 24, 1993, pp. 48–49.

"Subthreshold–Current Reduction Circuits for Multi–Gigabit DRAM's", Sakata et al., *IEEE Symposium on VLSI Circuits*, Digest of Technical Papers, May 19–21, 1993, pp. 45–46.

Primary Examiner—Viet Q. Nguyen
Attorney, Agent, or Firm—McDermott, Will & Emery

[57] ABSTRACT

A main source voltage transmission line for transmitting a source voltage VCH as one power source and a sub source voltage transmission line are provided corresponding to a gate circuit. A resistive element having a high resistance is provided between the main source voltage transmission line and the sub source voltage transmission line. A capacitor comprised of an insulated gate field effect transistor is connected to the sub source voltage transmission line. The gate circuit is operated with a voltage on the sub source voltage transmission line as an operating source voltage. Thus, the voltage on the sub source voltage transmission line can be maintained at a voltage level that balances with a sub-threshold current flowing through the gate circuit, and the voltage on the sub source line can be stably maintained by the capacitor. A semiconductor memory device can be realized which reduces the sub-threshold current that flows upon standby of the gate circuit and minimizes a difference in voltage between the sub source voltage transmission line and the main source voltage transmission line to operate at high speed with low current consumption.

12 Claims, 45 Drawing Sheets

SEMICONDUCTOR INTEGRATED CIRCUIT DEVICE HAVING A HIERARCHICAL POWER SOURCE CONFIGURATION

This application is a division of application Ser. No. 08/546,747 filed Oct. 23, 1995, now U.S. Pat. No. 5,751,651.

BACKGROUND OF THE INVENTION

1. Field of the Invention

The present invention relates to a semiconductor integrated circuit device, and particularly to a semiconductor memory device suitable to high integration, which stably operates with low power consumption. The present invention relates more specifically to a configuration of a power source for transmitting operating source voltages including a high voltage and a configuration of a voltage generating circuit.

2. Description of the Related Art

FIG. 71 is a diagram showing a configuration of an inverter which is a typical gate circuit. In FIG. 71, the inverter includes a p channel MOS (insulated gate type field effect) transistor PQ connected between a source node 1 and an output node 2, and an n channel MOS transistor NQ connected between the output node 2 and a ground node 3. An input node 4 is connected to the gates of the transistors PQ and NQ. The operation of the inverter shown in FIG. 71 will now be described in brief.

When an input signal IN is high in level, the p channel MOS transistor PQ is turned off and the n channel MOS transistor NQ is turned on. The output node 2 is discharged to a ground potential level through the n channel MOS transistor NQ which is in an on state. When an output signal OUT at the output node 2 is lowered to the ground potential level, a source (corresponding to a conduction terminal connected to the ground node 3) of the n channel MOS transistor NQ becomes equal in potential to a drain (corresponding to a conduction terminal electrically connected to the output node 2) thereof. As a result, no current flows through the n channel MOS transistor NQ.

On the other hand, when the input signal IN is low in level, the n channel MOS transistor NQ is turned off and the p channel MOS transistor PQ is turned on. The output node 2 is charged to a power source voltage Vcc level through the p channel MOS transistor PQ which is in an on state. When the output signal OUT at the output node 2 is raised to the power source voltage level, the source (corresponding to a conduction terminal connected to power source terminal 1) of the p channel MOS transistor PQ becomes equal in potential to the drain (corresponding to a conduction terminal connected to the output node 2) thereof, so that no current flows through the p channel MOS transistor PQ.

When the output signal OUT makes a transition to a high level or to a low level in the case of a CMOS (Complementary MOS) inverter using the p channel MOS transistor PQ and the n channel MOS transistor NQ, the transistors PQ and NQ are both brought into an off state eventually. As a result, no current consumption is produced in most cases. When the output signal OUT changes from the low level to the high level or vice versa, a through-current flows from the power source node 1 to the ground node 3 through the transistors PQ and NQ. Thus, the amount of current consumed can be reduced by using the inverter having the CMOS configuration shown in FIG. 71.

A drain current Ids, which flows through an MOS transistor, is represented as a function of a gate-to-source voltage of the MOS transistor. As the absolute value of the gate-to-source voltage is made greater than that of a threshold voltage of the MOS transistor, the drain current increases. Even when the absolute value of the gate-to-source voltage is less than or equal to that of the threshold voltage, the drain current Ids is not completely brought to 0. The drain current that flows in a gate-to-source voltage region, is called "sub-threshold current", and is exponentially proportional to the gate-to-source voltage.

FIG. 72 is a graph showing a sub-threshold current characteristic of an n channel MOS transistor. In FIG. 72, the axis of abscissas represents a gate-to-source voltage Vgs and the axis of ordinates represents a logarithmic value of a drain current Ids. Linear regions of curves A and B shown in FIG. 72 represent sub-threshold current regions. In the sub-threshold current regions, a gate-to-source voltage causing a drain current flow of 10 mA through a MOS transistor whose gate width (channel width) is 10 μm, for example, is defined as a threshold voltage. A threshold voltage Vth of a transistor having a sub-threshold current characteristic of the curve A is shown in FIG. 72. As is seen from FIG. 72, a sub-threshold current It flows even when the gate-to-source voltage Vgs of the MOS transistor is 0 V. When the number of MOS transistors used as components increases in a large scale integrated circuit device, the sum of values of sub-threshold currents attains a non-negligible, thereby causing a problem that the current consumption increases.

On the other hand, in a large scale integrated circuit device such as a large storage capacity semiconductor memory device or the like, an operating power source voltage Vcc tends to be set to a low voltage of 1.5 V, for example, for the purpose of reducing power dessipation, speeding up its operation owing to a reduction in the amplitude of a signal and using a battery power. When the power source voltage Vcc is lowered, it is necessary to scale down a MOS transistor depending on the power source voltage in accordance with a scaling rule. When the MOS transistor is scaled down, it is also necessary to lower the threshold voltage Vth proportionally (when an n channel MOS transistor is used). However, the threshold voltage cannot be lowered in accordance with the scaling rule.

Namely, when the threshold voltage Vth of the MOS transistor having the sub-threshold current characteristic indicated by the curve A is reduced as shown in FIG. 72, the sub-threshold current characteristic represented by the curve A changes into that represented by the curve B. In this case, a problem arises that the sub-threshold current It when the gate-to-source voltage Vgs is 0 V is increased to Ita, thereby causing an increase in consumed current.

Further, a high voltage Vpp greater than the operating source voltage Vcc is employed in a semiconductor memory device. By making use of the high voltage Vpp, the influence of a signal voltage loss produced by a threshold voltage of a MOS transistor is prevented and a signal having a power source voltage Vcc level is transmitted. Portions using such a high voltage Vpp will be described in detail later. However, a word driver for driving a word line into a selected state, for example, uses Vpp in the semiconductor memory device.

When the high voltage vpp is used, the high voltage Vpp is applied in place of the source voltage Vcc in FIG. 71. When the input signal IN is at a high voltage Vpp level, the p channel MOS transistor PQ is turned off. At this time, the n channel MOS transistor NQ is turned on and hence the output node 2 is discharged to the ground potential level. Since the high voltage Vpp is applied between the source and drain of the p channel MOS transistor PQ in this case, the voltage applied therebetween is made greater than the operating source voltage Vcc even if the gate-to-source voltage Vgs is 0 V, whereby an electric charge is accelerated and more current flows so as to increase a sub-threshold current. Namely, the curve A shown in FIG. 72 changes into the curve B thereby to increase the sub-threshold current. When the threshold voltage is determined, a drain voltage is set to a predetermined value. When the threshold voltage is reduced under the same drain voltage, the sub-threshold current increases. However, even if the MOS transistor has the same threshold voltage, if the drain voltage increases, then the curve A changes into the curve B.

The sub-threshold current characteristic of the p channel MOS transistor is represented by reversing the sign of the gate-to-source voltage Vgs of the curve shown in FIG. 72.

In the circuit operating with the internal voltage such as the operating source voltage Vcc or the high voltage Vpp as described above, it is necessary to reduce a leakage current (sub-threshold current) of MOS transistor operating in the sub-threshold current region as small as possible.

FIG. 73 is a diagram showing one example of a conventional power source arrangement for reducing the sub-threshold current. In FIG. 73, the power source arrangement includes a main power source voltage transmission line (hereinafter called simply "main source line") 10 connected to a source voltage supply node 11, a sub source voltage transmission line (hereinafter called "sub source line") 12 supplied with a power source voltage VC from the main source line 10, a switching transistor SW1 composed of a p channel MOS transistor, which is connected between the main source line 10 and the sub source line 12 and electrically connects the main source line 10 and the sub source line 12 to each other in response to a control signal φCT, and a current control circuit 15 provided between the main source line 10 and the sub source line 12. The current control circuit 15 is composed of an n channel MOS transistor 16 whose drain and gate are connected to the main source line 10 and whose source is connected to the sub source line 12. The n channel MOS transistor 16 serves as a diode and has a function of clamping the voltage on the sub source line 12 to VC-VT level. Here, VT represents a threshold voltage of the n channel MOS transistor 16.

Gate circuits G1 and G2 are connected between the sub source line 12 and other power source voltage transmission line (hereinafter called "ground line") 3. The number of the gate circuits is arbitrary. However, two gate circuits are typically illustrated in FIG. 73. The gate circuits G1 and G2 each have a configuration of a CMOS inverters. The gate circuits G1 and G2 respectively operates with voltage VC on the sub source line 12 and a ground voltage Vss on the ground line 3 both as operating source voltages so as to invert signals IN1 and IN2 supplied thereto and output signals OUT1 and OUT2 therefrom. The operation of the power source arrangement will now be described in brief with reference to FIG. 74.

When the gate circuits G1 and G2 are on standby (in a waiting state), the control signal φCT is at a high level corresponding to source voltage VCH level. At this time, the gate and drain of the switching transistor SW1 become identical in potential to each other and it is hence brought into an off state. When the voltage VC on the sub source line 12 is reduced owing to a leakage current, a current is supplied from the n channel MOS transistor 16 so that the voltage on the sub source line 12 is maintained at VC-VT level. When the input signal IN1 is at a high level corresponding to source voltage VC level upon standby of the gate circuit G1, a p channel MOS transistor PQ is turned off and an n channel MOS transistor NQ is turned on. Hence the output signal OUT1 is brought to ground voltage Vss level. At this time, the voltage VC applied to the source of the p channel MOS transistor PQ is lower than the voltage applied to the gate thereof so that the p channel MOS transistor PQ is brought into a deeper off state, thereby making it possible to suppress a sub-threshold current that flows through the p channel MOS transistor PQ. The input signal IN2 is also at a high level and hence the output signal OUT2 is low in level.

When the gate circuits enter into an operating cycle, the control signal φCT is brought to a low level corresponding to the ground voltage Vss level so that the switching transistor SW1 is turned on. Consequently, the sub source line 12 and the main source line 10 are electrically connected to one another to reset the voltage VC on the sub source line 12 to the source voltage VCH level (time T1). After the voltage VC on the sub source line 12 has been reset to the predetermined source voltage VCH level and settled, the input signal IN1 is reduced to the low level corresponding to the ground voltage level at a time T2 so that the output signal OUT1 is raised to a high level. During the operating cycle, the voltage VC on the sub source line 12 is identical in level to the voltage VCH on the main source line 10 and the n channel MOS transistor 16 is in an off state.

When the operating cycle is completed at a time T3, the control signal φCT is raised to the high level again to turn off the switching transistor SW1. Even if the voltage VC on the sub source line 12 is reduced due to a leakage current (including a sub-threshold current that flows through each of the gate circuits G1 and G2), when the voltage VC on the sub source line 12 is reduced to VCH-VT level or less, the n channel MOS transistor 16 is turned on so as to supply the current to the sub source line 12, so that the voltage VC on the sub source line 12 is maintained at the VCH-VT voltage level.

By arranging source lines into a hierarchical structure comprised of a main source line and a sub source line, a MOS transistor brought into an off state can be brought into a deeper off state so that a sub-threshold current can be reduced. With a decrease in the power source voltage, a MOS transistor having a threshold voltage reduced in accordance with a scaling rule can be used, thereby making it possible to ensure a high-speed operation using a low voltage power source.

However, when a diode-connected clamp transistor is used, voltage VC on the sub source line is reduced in level by a threshold voltage VT of the clamp transistor with reference to source voltage VCH. Even if the threshold voltage of a MOS transistor having a threshold voltage ranging from 0.8 V to 1.0 V for the power source voltage of 5 V is reduced to a level within 0.25 V to 0.3 V for the power source voltage of 1.5 V in accordance with the scaling rule and the MOS transistor having such a low threshold voltage is used, in a time interval T1-T0 shown in FIG. 74 it is required to restore the voltage VC on the sub source line 12 to the source voltage VCH level. The gate circuits G1 and G2 and the like are operated at a time T2 after the voltage VC on the sub source line 12 has been recovered and settled to the source voltage VCH level. Thus, a problem arises that operation start timing of each of the gate circuits G1 and G2 cannot be made earlier and when the semiconductor integrated circuit device is a semiconductor memory device, access times are made long and high-speed operation characteristics seen from the outside are impaired.

In the power source arrangement shown in FIG. 73, the input signals IN1 and IN2 are high in level upon standby. It is also necessary to determine a logic level of each input signal in advance. In a statically-operating circuit or the like, a voltage level of a signal inputted thereto during a standby cycle is unpredictable. Accordingly, the conventional power source arrangement has a drawback that the arrangement is merely applicable to a device that is able to predict the logic level of an input signal.

Further, when a semiconductor memory device is used, a substrate bias voltage that is a negative voltage Vbb, is generally applied to a substrate region (substrate or well region) for the purpose of, for example, reducing junction capacitance, preventing a parasitic MOS transistor from occurring and stabilizing a threshold voltage of a MOS transistor. The high voltage Vpp and the negative voltage Vbb are both generated by a charge pump operation of a capacitor based on the voltages VC and Vss. A low power source voltage configuration is required to efficiently generate a high voltage Vpp at a high voltage level and a negative voltage vbb at a low voltage level. It is also necessary to provide a power source arrangement that is able to make power consumed by a circuit for generating the high voltage Vpp and the negative voltage Vbb as low as possible.

SUMMARY OF THE INVENTION

It is therefore an object of the present invention to provide a semiconductor integrated circuit device which can be operated stably and at high speed with low current consumption even in the case of a low power source voltage.

It is another object of the present invention to provide a semiconductor integrated circuit device having a power source arrangement that is able to sufficiently suppress a sub-threshold current which flows through an MOS transistor.

It is a further object of the present invention to provide an internal voltage generating circuit capable of stably generating a high voltage and a negative voltage even in the case of a low power source voltage.

It is a still another object of the present invention to provide a semiconductor integrated circuit device having a source arrangement which reduces a load on the internal voltage generating circuit.

It is a yet another object of the present invention to provide a semiconductor integrated circuit device having a power source arrangement capable of sufficiently controlling a sub-threshold current even when a logic level of an input signal during a standby cycle cannot be predicted.

It is a still further object of the present invention to provide a semiconductor integrated circuit device capable of easily realizing a power source arrangement for suppressing a sub-threshold current.

According to a first aspect of the present invention, there is provided a semiconductor integrated circuit device including a main voltage transmission line for transmitting a voltage of a first logic level, a sub voltage transmission line, a resistive element connected between the main voltage transmission line and the sub voltage transmission line, a capacitor connected between the sub voltage transmission line and a node for supplying a voltage of a second logic level and composed of an insulated gate type field effect transistor, and a gate circuit operating with a voltage on the sub voltage transmission line as one operating source voltage to perform a predetermined logic process on a received signal and output the processed signal therefrom.

According to a second aspect of the present invention, there is provided a semiconductor integrated circuit device including a main voltage transmission node for supplying a voltage of a first logic level, a sub voltage transmission node, a voltage supply node for supplying a voltage of a second logic level, a gate circuit operating with a voltage on the sub voltage transmission node and a voltage on the voltage supply node both as operating source voltages to perform a predetermined logic process on a received signal and output the processed signal therefrom, and a transistor element connected between the sub voltage transmission node and the main voltage transmission node so that a resistance value thereof is reduced when a signal outputted from the gate circuit is at the first logic level.

In the semiconductor integrated circuit device according to the first aspect of the present invention, when a sub-threshold current flows through the resistive element connected between the main voltage transmission line and the sub voltage transmission line, the voltage on the sub voltage transmission line is reduced so as to bring a transistor in the gate circuit into a deeper off state. Consequently, the sub-threshold current is decreased so as to prevent an increase in the sub-threshold current. Further, the potential on the sub voltage transmission line is restrained from reduction, thereby to reduce the amplitude of the voltage on the sub voltage transmission line. On the other hand, the capacitor connected to the sub voltage transmission line is provided in a MOS capacitor configuration, and the capacitor provides compensation for a current increasing upon operation of the gate circuit with a small occupying area and reduces a variation in the voltage on the sub voltage transmission line.

In the semiconductor integrated circuit device according to the second aspect of the present invention, the resistance value of the transistor element electrically connected between the main voltage transmission line and the sub voltage transmission line is reduced when the output signal of the gate circuit is at the first logic level thereby to produce the amount of supply of current enough to provide a large driving capability between the main voltage transmission line and the sub voltage transmission line to change the output signal at high speed. Further, when the output signal of the gate circuit is at the second logic level, the resistance value thereof is increased, thereby to suppress the flow of current between the main voltage transmission line and the sub voltage transmission line so as to reduce the amount of consumed current.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
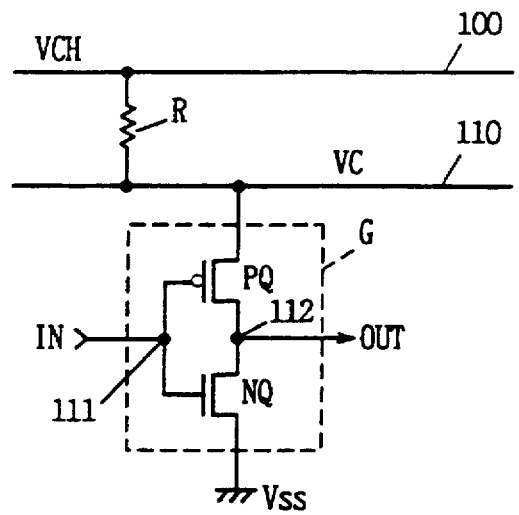
FIG. 1 is a view schematically showing the structure of a principal part of a semiconductor integrated circuit device according to a first embodiment of the present invention.

FIG. 1 is a diagram schematically showing the structure of a principal part of a semiconductor integrated circuit device according to a first embodiment of the present invention. In FIG. 1, there are shown a main source voltage transmission line 100 for transmitting an inner voltage VCH, a sub source voltage transmission line 110 supplied with a current from the main source voltage transmission line 100, a resistive element R connected between the main source voltage transmission line 100 and the sub source voltage transmission line 110, and a gate circuit G operating with a voltage VC on the sub source voltage transmission line 110 as one operating source voltage.

The voltage VCH on the main source voltage transmission line 100 may be a normal operating source voltage Vcc. Alternatively, the voltage VCH may be a high voltage Vpp greater than the normal operating source voltage employed in a semiconductor memory device. This voltage will be described simply as "power source voltage VCH" below. Further, the main source voltage transmission line 100 and the sub source voltage transmission line 110 will be also called simply "main source line 100" and "sub source line 110".

The gate circuit G includes a p channel MOS transistor PQ having a source connected to the sub source line 110, a gate connected to an input node 111 supplied with an input signal IN and a drain connected to an output node 112, and an n channel MOS transistor NQ having a drain connected to the output node 112, a gate connected to the input node 111 and a source connected to receive the other operating source voltage (hereinafter called simply "ground voltage") VSS. The operation of the semiconductor integrated circuit device will now be described in brief.

When the input signal IN is at a logical high level (voltage VCH level), the transistor PQ is in an off state, the transistor NQ is in an on state and the output node 112 is discharged to ground voltage VSS level through the transistor NQ.

The transistor PQ is operated in the sub-threshold current region. When a sub-threshold current Is flows through the transistor PQ, a voltage drop is developed across the resistive element R because the current Is is supplied from the main source line 100 through the resistive element R, and thus the voltage VC on the sub source line 110 attains VC=VCH−R·Is. In this condition, a potential applied to the gate of the transistor PQ is at the voltage VCH level. Thus, the gate potential becomes higher than a potential applied to the source of the transistor PQ, thereby to restrain the sub-threshold current that flows through the transistor PQ.

Namely, when the sub-threshold current that flows through the transistor PQ increases, the voltage VC on the sub source line 110 is reduced through the resistive element R so that the transistor PQ is brought into a deeper off state, thereby making it possible to suppress the sub-threshold current which flows through the transistor PQ. Thus, the level of the voltage VC on the sub source line 110 reaches a voltage level that the sub-threshold current flowing through the transistor PQ equilibrates with the voltage drop developed across the resistive element R.

Figure 2:
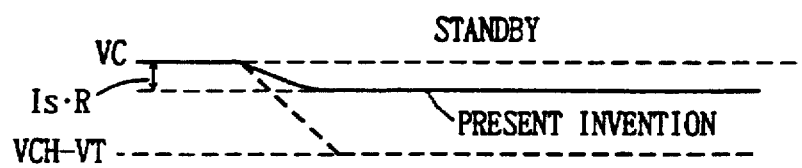
FIG. 2 is a diagram schematically illustrating the operation of the semiconductor integrated circuit device shown in FIG. 1.

Thus, the amount of a voltage VC drop at the time when the input signal IN is brought into a stationary state at the logical high level (at the period represented as a standby cycle in FIG. 2), is given by Is·R as shown in FIG. 2. Therefore, a difference (VCH−VC) in voltage between the main source line 100 and the sub source line 110 can be reduced as compared with a conventional configuration in which a voltage on the sub source line is clamped by a diode transistor.

Figure 3:
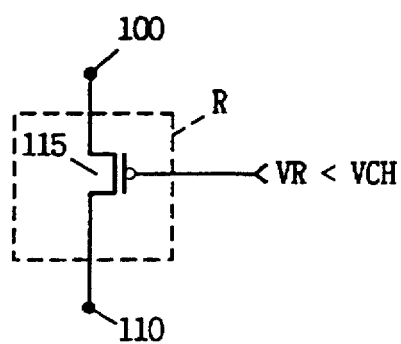
FIG. 3 is a diagram showing one example of a configuration of a resistive element shown in FIG. 1.

FIG. 3 is a diagram showing one example of a specific configuration of the resistive element R shown in FIG. 1. In FIG. 3, the resistive element R is connected between main source line 100 and sub source line 110 and is comprised of a p channel MOS transistor whose gate is supplied with a predetermined reference voltage VR (<VCH). With the resistive element R comprised of the p channel MOS transistor whose gate is supplied with the predetermined voltage VR, when the voltage VC applied to the sub source line 110 is reduced, a current flows from the main source line 100 to the sub source line 110 in accordance with a so-called square characteristic so as to restore the voltage on the sub source line 110 to a predetermined voltage level. By making use of the p channel MOS transistor, the voltage level on the sub source line 110 can be stably maintained at the predetermined voltage level (voltage level at which a sub-threshold current flowing in the gate circuit G is equilibrated with a voltage drop developed across a channel resistor of a transistor 115 due to the sub-threshold current).

[Modification of Resistive Element]

Figure 4A:
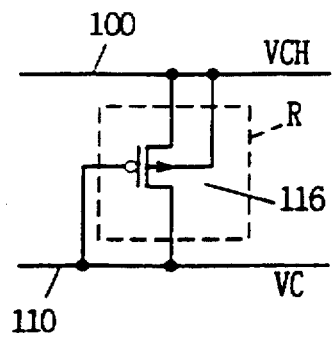
FIGS. 4A and 4B are diagrams illustrating examples of other configurations of the resistive element shown in FIG. 1.
Figure 4B:
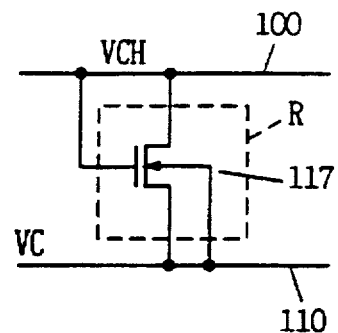

FIGS. 4A and 4B respectively illustrate modifications of the resistive element R shown in FIG. 1. In FIG. 4A, the resistive element R is comprised of a p channel MOS transistor 116 whose source and substrate are connected to main source line 100 and whose gate and drain are connected to sub source line 110. A channel width of the transistor 116 is set to the order of width that permits the supply of the sum of sub-threshold currents flowing into p channel MOS transistors of a gate circuit (which may be provided in plurality) connected to the sub source line 110. The sub-threshold current flows in the transistor 116 and voltage VC on the sub source line 110 is reduced from voltage VCH on the main source line 100 owing to a channel resistor of the transistor 116 and the sub-threshold current. Even in the case of the configuration shown in FIG. 4A, the transistor 116 is brought into an on state when the voltage VC on the sub source line 110 becomes lower than a predetermined value. As a result, the current supplied through the transistor 116 increases to restore the voltage VC on the sub source line 110 to a predetermined voltage level at high speed.

The resistive element R shown in FIG. 4B is comprised of an n channel MOS transistor 117 whose gate and drain are connected to main source line 100 and whose substrate region and source are connected to sub source line 110. By electrically connecting the substrate region of the n channel MOS transistor 117 to the sub source line 110 and bringing the source and the substrate region of the transistor 117 to the same voltage level with each other, the influence of a substrate effect can be eliminated and the threshold voltage of the transistor 117 can be reduced. Even in the case of the configuration of the resistive element R shown in FIG. 4B, a voltage VC on the sub source line 110 can be set higher than VCH−VT by allowing a sub-threshold current to flow in the transistor 117.

In the configurations shown in FIGS. 4A and 4B, depletion type MOS transistors may be used for the transistors 116 and 117 so as to function as load resistances.

According to the first embodiment of the present invention, as described above, since the resistive element is connected between the main source line and the sub source line, the voltage level on the sub source line can be set to the voltage level at which the voltage drop developed across the resistive element is equilibrated with the sub-threshold current flowing in the gate circuit. Accordingly, the difference in voltage between the main source line and the sub source line can be reduced.

Second Embodiment

Figure 5:
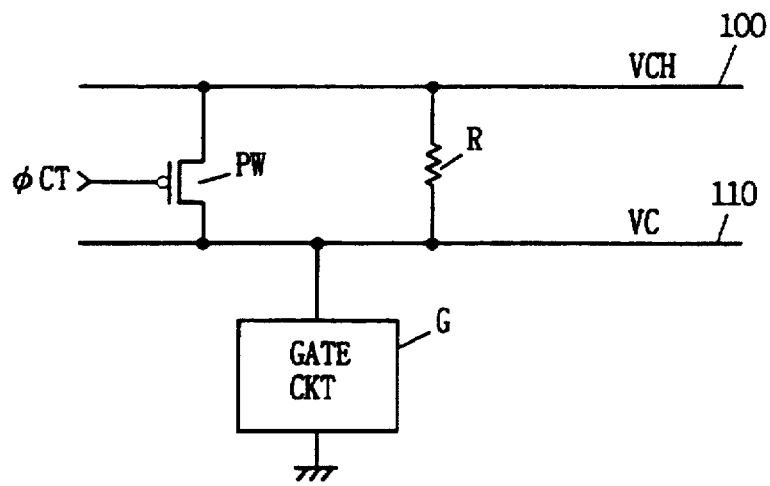
FIG. 5 is a diagram schematically showing the structure of a semiconductor integrated circuit device according to a second embodiment of the present invention.
Figure 6:
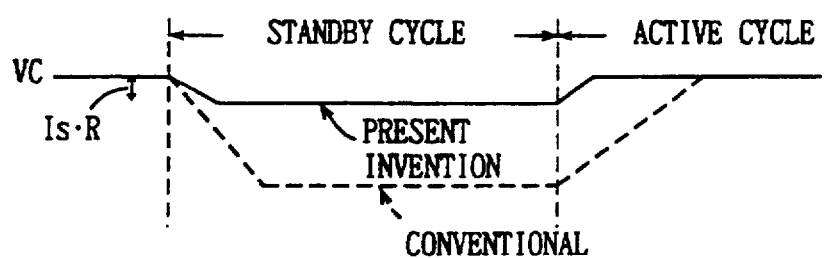
FIG. 6 is a signal waveform chart for describing the operation of the semiconductor integrated circuit device shown in FIG. 5.

FIG. 5 is a diagram showing the structure of a principal part of a semiconductor integrated circuit device according to a second embodiment of the present invention. In the structure shown in FIG. 5, a p channel MOS transistor PW brought into a conduction state when a control signal φCT is at a logical low level, is provided between main source line 100 and sub source line 110 so as to be connected in parallel with resistive element R. The semiconductor integrated circuit device has a standby cycle and an active cycle. During the standby cycle, the control signal φCT is brought to a logical high level corresponding to voltage VCH level on the main source line 100. During the active cycle, the control signal φCT is brought to a logical low level corresponding to ground voltage VSS level. The operation of the semiconductor integrated circuit device shown in FIG. 5 will now be described below with reference to FIG. 6 illustrating its operating waveform.

During the standby cycle, the control signal φCT is at a high level and the transistor PW is in an off state. Further, the main source line 100 and the sub source line 110 are electrically connected to each other through the resistive element R alone. In this condition, a sub-threshold current flows in a p channel MOS transistor PQ (see FIG. 1) included in gate circuit G and voltage VC on the sub source line 110 is brought to a voltage level corresponding to VCH−Is·R by the resistive element R. Symbol Is in this expression represents the sub threshold current that flows in the gate circuit G. A voltage drop developed across the resistive element R due to the sub-threshold current flowing through the resistive element R is relatively low as described previously by reference to FIG. 1. Thus, the difference between the voltage VCH on the main source line 100 and the voltage VC on the sub source line 110 can be minimized.

The transistor PW is required to simply perform a switching operation. It is unnecessary to particularly reduce the absolute value of a threshold voltage of the transistor PW. Thus, the sub-threshold current, which flows in the transistor PW, can be sufficiently reduced as compared with the sub-threshold current that flows in the gate circuit G.

When the gate circuit in the semiconductor integrated circuit device enters the active cycle, the control signal φCT is brought to a logical low level to turn on the switching transistor PW. As a result, the voltage VC on the sub source line 110 reaches the voltage VCH level on the main source line 100. During the standby cycle, the difference between the voltage VCH on the main source line 100 and the voltage VC on the sub source line 110 is sufficiently small. Thus, when the gate circuit in the semiconductor integrated circuit device enters the active cycle, the voltage VC on the sub source line 110 is recovered to the predetermined voltage VCH level at high speed. Accordingly, the gate circuit G can be activated in a quick timing as compared with a conventional configuration using a diode-connected clamp transistor. At this time, a transistor having a low threshold voltage (a small absolute value of the threshold voltage) can be employed in the gate circuit G (sub-threshold current is sufficiently suppressed). Therefore, a gate circuit G can be realized which operates at high speed with low current consumption even upon a low source voltage operation. Correspondingly, a semiconductor integrated circuit device operating at high speed with low current consumption even in the case of the use of the low source voltage, can be realized by utilizing the arrangement of a power source for such a gate circuit G.

According to the second embodiment of the present invention, as described above, since the switching transistor turned on and off according to the operating cycle is provided between the main source line and the sub source line, the voltage level of the sub source line can be changed depending on the operation cycle of the semiconductor integrated circuit device. Consequently, the sub-threshold current at the time of the standby cycle can be adequately reduced.

Third Embodiment

Figure 7:
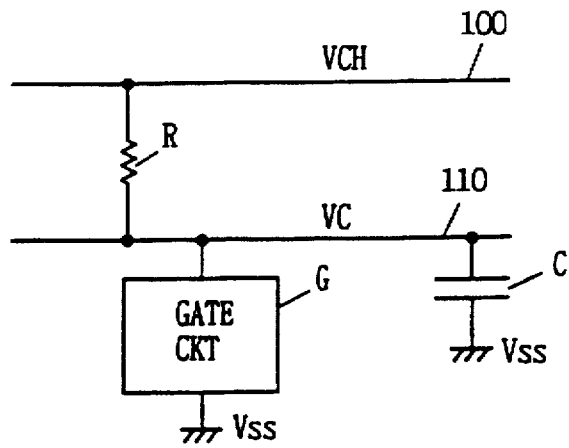
FIG. 7 is a diagram schematically showing the structure of a principal part of a semiconductor integrated circuit device according to a third embodiment of the present invention.

FIG. 7 is a diagram illustrating the structure of a principal part of a semiconductor integrated circuit device according to a third embodiment of the present invention. In the structure shown in FIG. 7, a stabilizing capacitor C having a relatively large capacitance is provided between a sub source line 110 and ground node, in addition to the structure shown in FIG. 1. Upon standby of gate circuit G (i.e., upon stabilization of an input signal and an output signal), voltage VC on the sub source line 110 is brought to a voltage level at which a sub-threshold current in the gate circuit G is equilibrated with a voltage drop developed across a resistive element R into balance.

Further, the capacitor C is also charged to the voltage VC level on the sub source line 110. In this condition, the input signal supplied to the gate circuit G is in a logical high level. When the input signal supplied to the gate circuit G changes from a high level to a low level, the output signal produced from the gate circuit G rises from a low level to a high level. The rise in the potential of the output signal can be realized by supplying a current through the main source line 100, the resistive element R and the sub source line 110. In this case, a relatively large current flows through the resistive element R as indicated by the broken line in FIG. 8 when the capacitor C is not provided, thereby to increase the voltage drop across the resistive element R. Thus, the voltage VC on the sub source line 110 is reduced and the time necessary for the output signal of the gate circuit G to reach a predetermined voltage level (VCH level) becomes longer.

Figure 8:
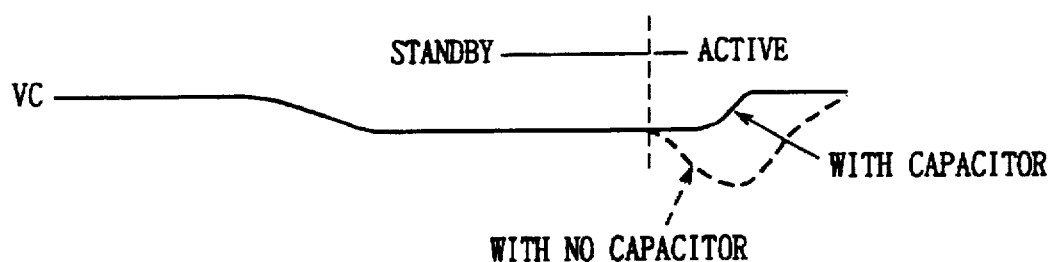
FIG. 8 is a diagram for describing the operation of the semiconductor integrated circuit device shown in FIG. 7.

However, since capacitor C is provided and a current used for the rise in the potential of the signal outputted from the gate circuit G is supplied from the capacitor C, the voltage drop across the resistive element R can be substantially eliminated as indicated by the solid line in FIG. 8, thereby making it possible to raise the output signal of the gate circuit G to the predetermined voltage VCH level at high speed. When the output signal of the gate circuit G reaches the voltage VCH level, the source and drain of a p channel MOS transistor used to charge an output node included in the gate circuit G are brought to the same voltage level with each other, so that no current flows through the resistive element R. Therefore, a voltage drop is not developed across the resistive element R, thus bringing the level of the voltage VC on the sub source line 110 to the same level as that of the voltage VCH on the main source line 100.

By providing the capacitor C and supplying the current from the capacitor C to the gate circuit G when the potential of the output signal of the gate circuit G rises, a semiconductor integrated circuit device can be realized which is capable of restraining the voltage VC on the sub source line 110 from being reduced, of causing the output signal to reach the predetermined voltage level at high speed and of operating at high speed with low current consumption.

Figure 9:
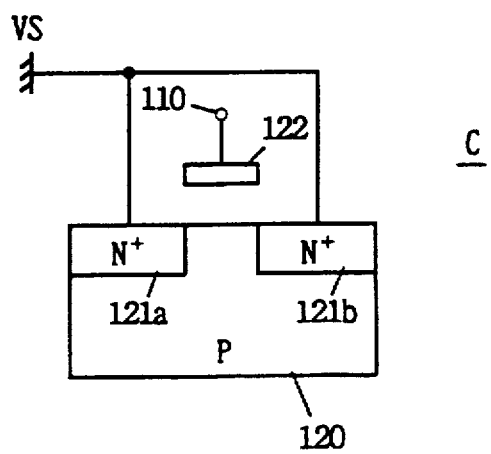
FIG. 9 is a diagram showing one example of a configuration of a capacitor shown in FIG. 7.

FIG. 9 is a diagram showing one example of a configuration of the capacitor C shown in FIG. 7. In FIG. 9, the capacitor C includes high concentration N type impurity regions 121a and 121b formed on the surface of a semiconductor substrate region (a semiconductor layer or a well region or a semiconductor substrate) 120, and a gate electrode 122 formed on a semiconductor surface (channel region) between the impurity regions 121a and 121b with a gate insulating film (not shown) underlaid. The gate electrode 122 is connected to sub source line 110 and the impurity regions 121a and 121b are connected to the ground node. The capacitor C shown in FIG. 9 takes a configuration of a MOS capacitor. The same effect as described above can be obtained even if the capacitor is connected between the main source line 100 and the sub source line 110. However, the following advantages can be brought about by connecting the capacitor between the sub source line 110 and the ground node.

The main source line 100 and the sub source line 110 are normally formed at an upper interconnection layer. In this case, it is necessary to use a capacitor having parallel electrode layers as the stabilizing capacitor. Namely, the MOS capacitor shown in FIG. 9 cannot be used in this case (because voltage levels on the sub source line 110 and the main source line 100 are substantially the same, an inversion layer is not formed in the channel region and one electrode layer of the capacitor is not formed). Thus, when the capacitor having such parallel electrode layers is used, a large area is required to obtain a desired capacitance and extra manufacturing steps are required to fabricate the capacitor. However, the MOS capacitor shown in FIG. 9 can be used if the capacitor C is provided between the sub source line 110 and the ground node, thus making it possible to realize a capacitor having a small occupied area and a large capacitance. Further, the capacitor C can be fabricated in the same manufacturing step as that for the n channel MOS transistor included in the gate circuit G, thereby making it possible to eliminate the need for the additional manufacturing steps.

A p channel MOS transistor may be used as the capacitor C as an alternative to the n channel MOS transistor. When the p channel MOS transistor is used, a gate electrode is connected to the ground node and impurity regions (source and drain regions) are connected to sub source line 110.

According to the third embodiment of the present invention, as described above, since the capacitor is connected between the sub source line and the ground node, the capacitor can supply the current when the output signal of the gate circuit changes, and the voltage drop on the sub source line at the time of the change in the output signal of the gate circuit can be suppressed, thereby making it possible to attain the output signal of the gate circuit to the predetermined voltage level at high speed.

Fourth Embodiment

Figure 10:
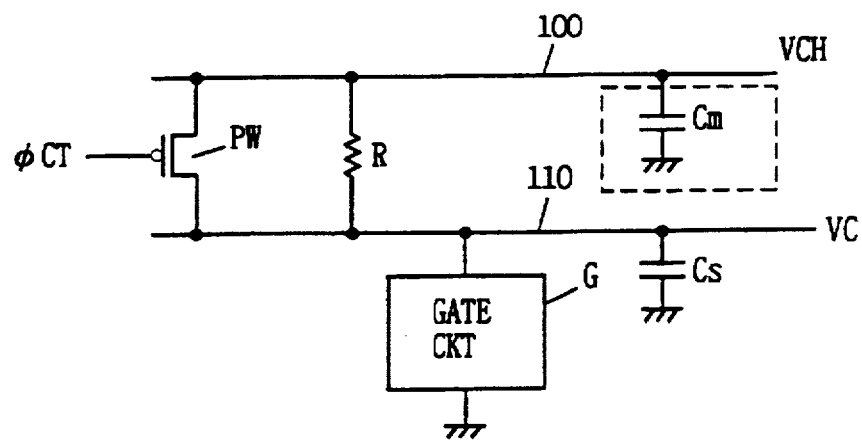
FIG. 10 is a diagram schematically illustrating the structure of a semiconductor integrated circuit device according to a fourth embodiment of the present invention.

FIG. 10 is a diagram illustrating the structure of a principal part of a semiconductor integrated circuit device according to a fourth embodiment of the present invention. In the structure shown in FIG. 10, a resistive element R is connected between main source line 100 and sub source line 10 and a p channel MOS transistor PW rendered conductive in response to a control signal φCT is connected in parallel with the resistive element R. Further, a capacitor Cs is connected between the sub source line 110 and the ground node. The main source line 100 include a parasitic capacitor Cm.

When a gate circuit G is on standby, the control signal φCT is at a high level and the transistor PW is in an off state. A voltage VC on the sub source line 110 is brought to a voltage level at which a sub-threshold current flowing in the gate circuit G balances a voltage drop across the resistive element R. When the gate circuit G enters an active cycle, the control signal φCT is brought to a low level and the transistor PW is turned on so as to electrically connect the main source line 100 and the sub source line 110 to each other, thereby raising the level of the voltage VC on the sub source line 110. Thereafter, the gate circuit G is operated so that the level of an output signal of the gate circuit G changes. Even when the gate circuit G is provided in plurality in this case and such plurality of gate circuits are simultaneously operated, a voltage VCH on the main source line 100 can be restrained from reduction by a current supplied from the capacitor Cs, thereby making it possible to stably and simultaneously operates the plurality of gate circuits G.

Figure 11:
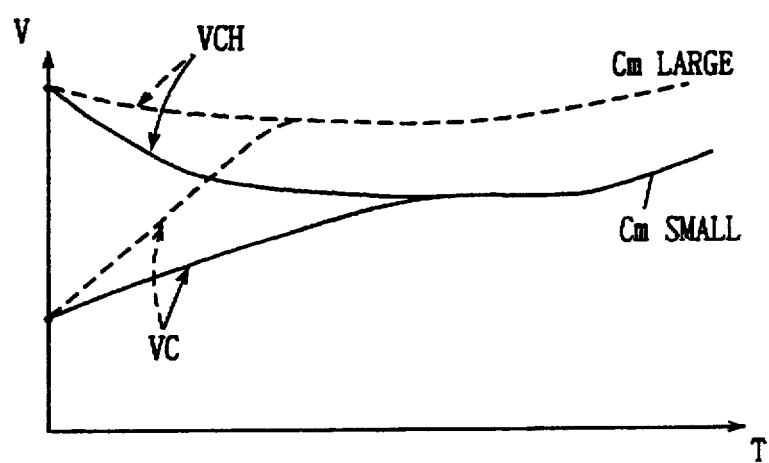
FIG. 11 is a diagram schematically showing the operation of the semiconductor integrated circuit device shown in FIG. 10.

FIG. 11 is a diagram showing the manner in which the voltage on the sub source line 110 is recovered by the parasitic capacitor Cm of the main source line 100 and the capacitor Cs coupled to the sub source line 110. In FIG. 11, the axis of ordinate represents a voltage and the axis of abscissa represents a time T. When the transistor PW is in an off state, the voltage VCH on the main source line 100 is different in level from the voltage VC on the sub source line 100. When the transistor PW is turned on, a current flows from the main source line 100 to the sub source line 110 so as to raise the level of the voltage VC on the sub source line 110. At this time, the voltage level on the main source line 100 is reduced in accordance with the supply of the current from the main source line 100 to the sub source line 110. The supply of the current from the main source line 100 to the sub source line 110 is equivalent to the charging from the parasitic capacitor Cm of the main source line 100 to the capacitor Cs of the sub source line 110. When the capacitance of the parasitic capacitor Cm is sufficiently large as compared with that of the capacitor Cs, the voltage level on the sub source line 110 is raised at high speed. On the other hand, when the capacitance of the parasitic capacitor Cm is relatively small, a rise in the potential on the sub source line 110 is relatively gentle.

After the voltage levels on the main source line 100 and the sub source line 110 have been made equal to each other, the voltages on the sub source line 110 and the main source line 100 increase at the same speed owing to the supply of current from an unillustrated power source.

As is apparent from the waveform chart shown in FIG. 11, it is preferable that the parasitic capacitor Cm of the main source line 100 is set to a relatively large capacitance in order to recover the level of the voltage VC on the sub source line 110 at high speed. When the capacitance of the parasitic capacitor Cm is relatively low, another capacitor may be provided to the main source line 100.

When the voltage VCH supplied to the main source line 100 is a high voltage Vpp, for example, a stabilizing capacitor having a sufficiently large capacitance may be provided at an output node of a high voltage generating circuit. When the gate circuit G is provided in plurality, a relatively large parasitic capacitance is present on the sub source line 110. Therefore, the capacitance of the capacitor Cs connected to the sub source line 110 is determined to a suitable value in consideration of the parasitic capacitance on the sub source line 110. Since the number of gate circuits connected to the sub source line 110 can be decided if a location where the sub source line 110 is applied is determined, the capacitance of the parasitic capacitor can be easily determined.

According to the fourth embodiment of the present invention, as described above, the level of the voltage on the sub source line 110 can be recovered to a predetermined voltage level.

Fifth Embodiment

Figure 12:
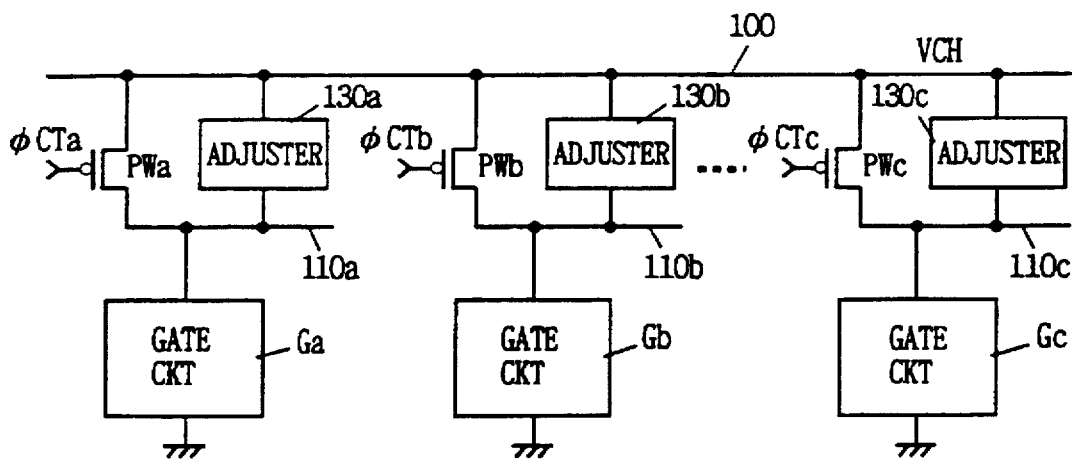
FIG. 12 is a diagram schematically illustrating the structure of a principal part of a semiconductor integrated circuit device according to a fifth embodiment of the present invention.

FIG. 12 is diagram showing the structure of a principal part of a semiconductor integrated circuit device according to a fifth embodiment of the present invention. In the structure shown in FIG. 12, a plurality of sub source lines 110a, 110b, . . . 110c are disposed to main source line 100. Switching transistors PWa, PWb and PWc comprised of p channel MOS transistors brought into conduction states in response to control signals φCTa, φCTb and φCTc respectively are provided between respective sub source lines 110a through 110c and main source line 100. Gate circuits Ga, Gb and Gc are connected to their corresponding sub source lines 110a, 110b and 110c. These gate circuits Ga through Gc are respectively operated with voltages on the sub source lines 110a through 110c as one operating source voltages. Adjusting circuits 130a, 130b, . . . 130c for adjusting the levels of the voltages on the sub source lines 110a, 110b, . . . 110c are respectively connected between the main source line 100 and the sub source lines 110a, 110b, . . . 110c. As the adjusting circuits 130a through 130c, only the resistive elements which have been described in the aforementioned embodiments, may be used. Alternatively, each of the adjusting circuits 130a through 130c may include both the resistive element R and the capacitor C.

All the control signals φCTa through φCTc may be set to active and inactive states at the same timings. Alternatively, the control signals φCTa through φCTc may be independently controlled so as to be brought into the active and inactive states. Since a current is supplied to only an operating gate circuit from the main source line 100 by independently setting the control signals φCTa through φCTc to the active state, a variation in voltage VCH on the main source line 100 can be suppressed and current consumption can be reduced. Changes in voltages on the sub source line 110a through 110c are identical to those described in the previous embodiments.

By providing the plurality of sub source line 110a through 110c, a parasitic capacitance of a single sub source line can be reduced, and the levels of the voltages on the sub source lines 110a through 110c at the time when their corresponding switching transistors are brought into on states can be recovered at high speed. Since a variation, if occurs, in voltage on a single sub source line is not transmitted to other sub source lines, the possibility that the voltages on all the sub source lines 110a through 110c vary simultaneously in the same manner, can be reduced. Correspondingly, the gate circuits Ga through Gc can be prevented from simultaneously malfunctioning as a whole and the influence of power source noise exerted on the gate circuits can be sufficiently suppressed.

According to the fifth embodiment of the present invention, as described above, since the sub source line is divided into a plurality of source lines, the parasitic capacitances of the sub source lines can be reduced. Correspondingly, each of the voltages on the sub source lines can be recovered to a predetermined voltage level at high speed upon operation of the corresponding gate circuit. A semiconductor integrated circuit device can be realized which is capable of suppressing the influence of the power source noise to a minimum and of being stably operating without exerting the influence of the variation in the voltage on a sub source line upon other sub source lines.

Sixth Embodiment

Figure 13:
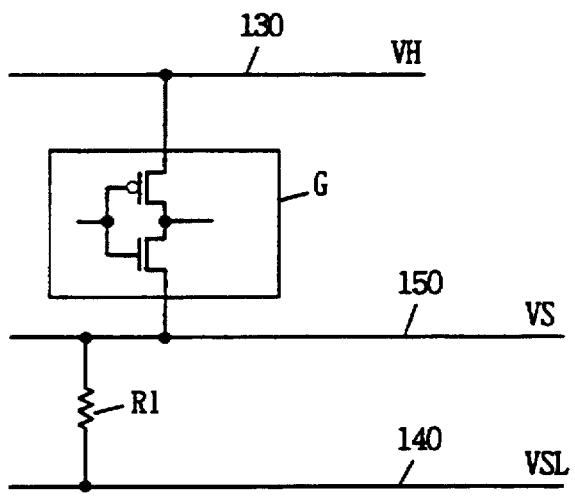
FIG. 13 is a diagram schematically depicting the structure of a principal part of a semiconductor integrated circuit device according to a sixth embodiment of the present invention.

FIG. 13 is a diagram showing the structure of a principal part of a semiconductor integrated circuit device according to a sixth embodiment of the present invention. In the structure shown in FIG. 13, there are shown a power source voltage transmission line (hereinafter called simply "source line") 130 for transmitting one operating source voltage (corresponding to a normal operating source voltage or a high voltage) VH, another source voltage transmission line (hereinafter called simply "main ground line") 140 for transmitting the other power source voltage (corresponding to a negative voltage or a ground voltage) VSL, a further sub source voltage transmission line (hereinafter called simply "sub ground line") 150 for transmitting a further source voltage (hereinafter called simply "ground voltage") VS, a resistive element R connected between the sub ground line 150 and the main ground line 140, and a gate circuit G operating with the voltage VH on the source line 130 and the voltage VS on the sub ground line 150 both as operating source voltages. In FIG. 13, signals inputted to and outputted from the gate circuit G are not shown. The gate circuit G may be a CMOS inverter as described in the previous embodiments or may be a multiinput logic gate of a CMOS configuration.

When the output signal of the gate circuit G is at a low level in the structure shown in FIG. 13, an output node discharging MOS transistor (normally n channel MOS transistor) included in the gate circuit G is in an on state and voltages applied to the source and drain of the n channel MOS transistor are identical to each other. Therefore, no current flows through the MOS transistor. Accordingly, the current does not flow even in the resistive element R1 so that the voltage VS on the sub ground line 150 becomes equal to the level of the voltage VSL on the main ground line 140.

When the output signal of the gate circuit G is at a high level (voltage VH level), the output discharging transistor included in the gate circuit G is brought into an off state (operates in the sub-threshold current region). In this case, a sub-threshold current flowing through the output discharging transistor included in the gate circuit G flows through the resistive element R1 so as to develop a voltage drop across the resistive element R1, thereby bringing the voltage VS on the sub ground line 150 to a voltage level higher than the level of the voltage VSL on the main ground line 140 (see FIG. 14). At this time, the gate of the output discharging transistor is supplied with the voltage having the ground voltage VSL level. Thus, the voltage applied to the gate of the discharging transistor is lower than the voltage (the voltage VS on the sub ground line 150) applied to the source thereof, to bring the output discharging transistor into a deeper off state, with the result that the sub-threshold current is reduced.

Figure 14:
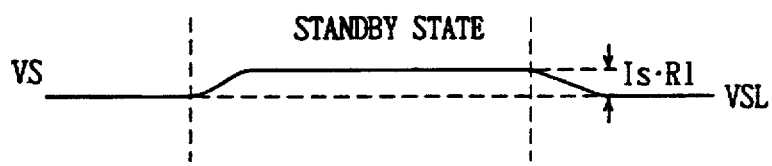
FIG. 14 is a diagram for describing the operation of the semiconductor integrated circuit device shown in FIG. 13.

If the sub-threshold current flowing through the n channel MOS transistor included in the gate circuit G increases, then the voltage drop across the resistive element R1 is made greater. Correspondingly, the voltage VS on the sub ground line 150 increases so as to bring the output discharging n channel MOS transistor into a deeper off state, resulting in a reduction in the sub-threshold current. On the other hand, when the sub-threshold current flowing through the n channel MOS transistor included in the gate circuit G decreases, then the voltage drop across the resistive element R1 becomes smaller to reduce the voltage VS on the sub ground line 150, so that the sub-threshold current flowing through the n channel MOS transistor included in the gate circuit G increases. Thus, the voltage VS on the sub ground line 150 is brought to a voltage level at which the sub-threshold current flowing through the output node discharging n channel MOS transistor included in the gate circuit G is balanced with the voltage drop across the resistive element R1. In FIG. 14, the voltage VS on the sub ground line 150 placed in the stabilized state is represented as Is·R1. Here, Is represents the sub-threshold current. A difference in voltage Is·R1 between the sub ground line 150 and the main ground line 140 can be sufficiently reduced and hence the voltage VS on the sub ground line 150 at the time when the gate circuit G is operated, can be recovered to the predetermined voltage level VSL at high speed.

Similarly to the case of the second embodiment referred to above, the resistive element R1 can also be realized using an n channel MOS transistor whose gate is supplied with a predetermined voltage. A resistor-connected MOS transistor may also be used as shown in FIG. 4.

According to the sixth embodiment of the present invention, as described above, when the output signal of the gate circuit is high in level upon standby, the sub-threshold current flowing through the output discharging MOS transistor included in the gate circuit can be effectively controlled. Further, the difference in voltage between the sub ground line and the main ground line can be sufficiently reduced. Upon operation of the gate circuit, the voltage VS on the sub ground line can be recovered to the predetermined voltage level VSL at high speed.

Seventh Embodiment

Figure 15:
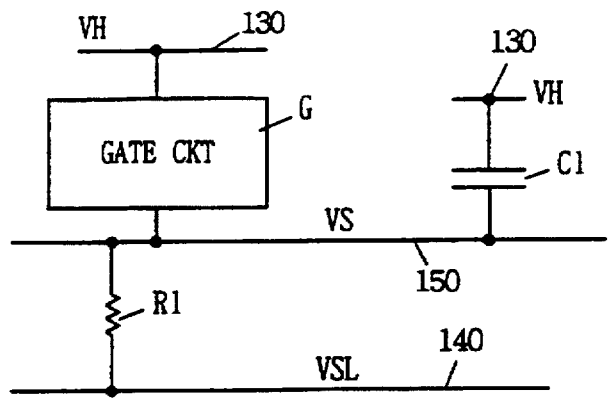
FIG. 15 is a diagram schematically showing the structure of a principal part of a semiconductor integrated circuit device according to a seventh embodiment of the present invention.

FIG. 15 is a diagram illustrating the structure of a principal part of a semiconductor integrated circuit device according to a seventh embodiment of the present invention. In the structure shown in FIG. 15, a capacitor C1 is provided between source line 130 and sub ground line 150, in addition to the structure shown in FIG. 13. The configuration of the capacitor C1 will be described later in detail. The capacitor C1 has a function of stabilizing a voltage VS on the sub ground line 150. When a signal outputted from gate circuit G is high in level upon standby of the gate circuit G, the voltage VS on the sub ground line 150 is brought to a voltage level (corresponding to a voltage drop across resistive element R1) higher than voltage VSL on main ground line 140 due to a sub-threshold current flowing through the gate circuit G. When the gate circuit G is operated and the output signal thereof is reduced from a high level to a low level, such a case may occur that a current for discharging the output signal flows into the resistive element R1 so as to raise the level of the voltage VS on the sub ground line 150 and to equivalently lower the voltage applied to the gate of a discharging transistor (see FIG. 13) included in the gate circuit G, thereby reducing a current driving capability of the discharging n channel MOS transistor. However, the capacitor C1 is provided, and therefore a discharging current of the gate circuit G is absorbed by the capacitor C1 to reduce a current flowing through the resistive element R1 so that the voltage VS on the sub ground line 150 is restrained from rising. Thus, the gate circuit G can lower its output signal to a low level at high speed.

The MOS capacitor shown in FIG. 9 may be used as the capacitor C1. In this case, the capacitor C1 may be comprised of a p channel MOS transistor. An advantage obtained by providing the capacitor C1 between the source line 130 and the sub ground line 150 is identical to that obtained by the capacitor C employed in the third embodiment described above.

Further, when a plurality of gate circuits are connected to the sub ground line, the capacitance of the capacitor may be decided in consideration of a parasitic capacitor on the sub ground line.

According to the seventh embodiment of the present invention, as described above, since the capacitor is connected to the sub ground line, the voltage on the sub ground line can be stabilized and hence the output signal of the gate circuit can be lowered to the low level at high speed. Even if noise is produced on the sub ground line 150 when the gate circuit is on standby, the noise is absorbed by the capacitor, thereby making it possible to stabilize the voltage on the sub ground line at the time that the gate circuit is in the standby state.

Eighth Embodiment

Figure 16:
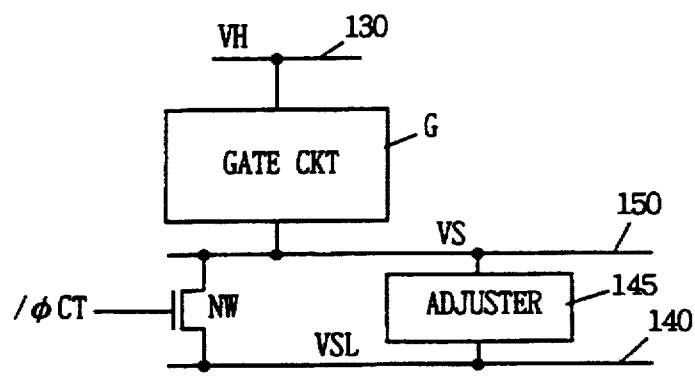
FIG. 16 is a diagram schematically illustrating the structure of a principal part of a semiconductor integrated circuit device according to an eighth embodiment of the present invention.

FIG. 16 is a diagram showing the structure of a principal part of a semiconductor integrated circuit device according to an eighth embodiment of the present invention. In the structure shown in FIG. 16, a switching transistor NW comprised of an n channel MOS transistor brought into a conduction state in response to a control signal φCT is connected between sub ground line 150 and main ground line 140. Further, an adjusting circuit 145 is provided between the sub ground line 150 and the main ground line 140. The adjusting circuit 145 may be of a circuit configuration for reducing a sub-threshold current that flows in a gate circuit G. Either of a circuit configuration including only the resistive element R1 shown in FIG. 13 and a circuit configuration including both the resistive element R1 and the capacitor C1 may be used. The gate circuit G is operated with a voltage VS on the sub ground line 150 and a voltage VH on source line 130 both as operating source voltages.

The control signal /φCT is brought to an active or inactive state in accordance with operating timing of the gate circuit G. When the gate circuit G is on standby (during a standby cycle), the control signal /φCT is at a low level corresponding to voltage VSL level and the transistor NW is brought into an off state. In this condition, the level of the voltage VS on the sub ground line 150 is maintained at a voltage level set by the adjusting circuit 145 and is kept at a voltage level higher than the level of a voltage VSL on the main ground line 140.

When the gate circuit G enters an active cycle for its operation, the control signal /φCT is brought to a high level and the transistor NW is brought into an on state. Thus, the sub ground line 150 is electrically connected to the main ground line 140 so that the voltage VS on the sub ground line 150 is reduced to the level of the voltage VSL on the main ground line 140. Thereafter, the gate circuit G is operated and a voltage level of a signal outputted from the gate circuit G changes (i.e., changes from a high level to a low level).

By providing the switching transistor brought into conduction or non-conduction depending on the operating cycle of the gate circuit G between the main ground line 140 and the sub ground line 150 as shown in FIG. 16, the voltage VS on the sub ground line 150 can be reduced to predetermined voltage VSL level at high speed upon transition from the standby cycle to the active cycle. Correspondingly, the operation start timing of the gate circuit G can be made earlier.

According to the eighth embodiment of the present invention, as described above, since the switching transistor brought into conduction or non-conduction state in accordance with the operating cycle of the gate circuit is provided between the main ground line and the sub ground line, the voltage level on the sub ground line can be recovered at high speed upon transition from the standby cycle to the active cycle. Further, the sub-threshold current, which flows through the gate circuit, can be sufficiently reduced by the adjusting circuit.

Ninth Embodiment

Figure 17:
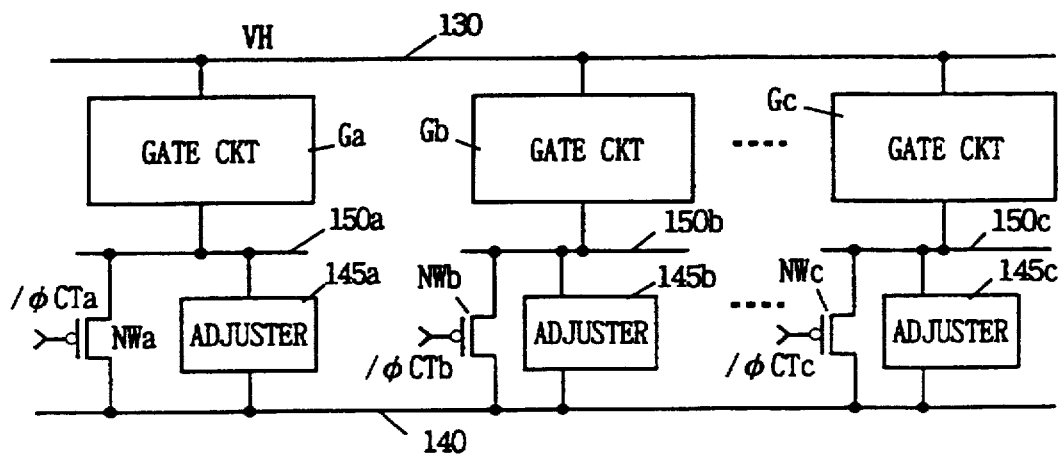
FIG. 17 is a diagram schematically depicting the structure of a principal part of a semiconductor integrated circuit device according to a ninth embodiment of the present invention.

FIG. 17 is a diagram showing the structure of a principal part of a semiconductor integrated circuit device according to a ninth embodiment of the present invention. In FIG. 17, a plurality of sub ground lines 150a, 150b, . . . 150c are provided corresponding to a plurality of gate circuits Ga, Gb, . . . Gc. Adjusting circuits 145a, 145b, . . . 145c are respectively provided between the sub source lines 150a, 150b, . . . 150c and a main ground line 140. A switching transistor NWa comprised of an n channel MOS transistor, which is brought into a conduction state in response to a control signal φCTa and electrically connects the sub ground line 150a and the main ground line 140 to each other, is connected to the sub ground line 150a in parallel with the adjusting circuit 145a.

A switching transistor NWb brought into a conduction state when a control signal /φCTb is high in level to electrically connect the sub ground line 150b and the main ground line 140 to each other, is provided to the sub ground line 150b. A switching transistor NWc, which electrically connects the sub ground line 150c to the main ground line 140 in response to a control signal φCTc, is provided between the sub ground line 150c and the main ground line 140 in parallel with the adjusting circuit 145c. Each of the gate circuits Ga, Gb, . . . Gc is commonly supplied with one operating source voltage VH from a source line 130. Each of the control signals /φCTa through /φCTc may be brought into an active or inactive state at the same timing. Alternatively, the control signals /φCTa through /φCTc may be respectively brought into the active or inactive state independent of each other according to the operating conditions of corresponding gate circuits.

Voltage adjustments to the sub ground lines 150a, 150b, . . . 150c are identical to those described above with reference to FIGS. 13 through 16. By dividing the sub ground line into a plurality of sub ground line, i.e., the sub ground lines 150a, 150b, . . . 150c, the number of the gate circuits connected to the corresponding sub ground lines 150a through 150c can be reduced and interconnection lengths of the sub ground lines can be shortened, thereby making it possible to reduce capacitances of the respective sub ground lines 150a, 150b, . . . 150c. Thus, when the switching transistors NWa through NWc are brought into a conduction state, voltages on the sub ground lines 150a through 150c can be recovered to a predetermined voltage level at high speed. As a consequence, a semiconductor integrated circuit device can be realized which can make the operation start timing of each of the gate circuits Ga through Gc earlier and can operate at high speed with low current consumption.

According to the ninth embodiment of the present invention, as described above, since the sub ground line is divided into the plurality of sub ground lines, the load capacitance of each sub ground line can be reduced and the potential on each sub ground line can be recovered at quick speed when each switching transistor is turned on.

Further, since the sub ground lines are separated from each other, the semiconductor integrated circuit device can be realized which can reduce the influence of voltage noise developed in each sub ground line, which is exerted upon other sub ground line, and can provide excellent noise immunity (the present effect is similar to that obtained in the fifth embodiment).

Tenth Embodiment

Figure 18:
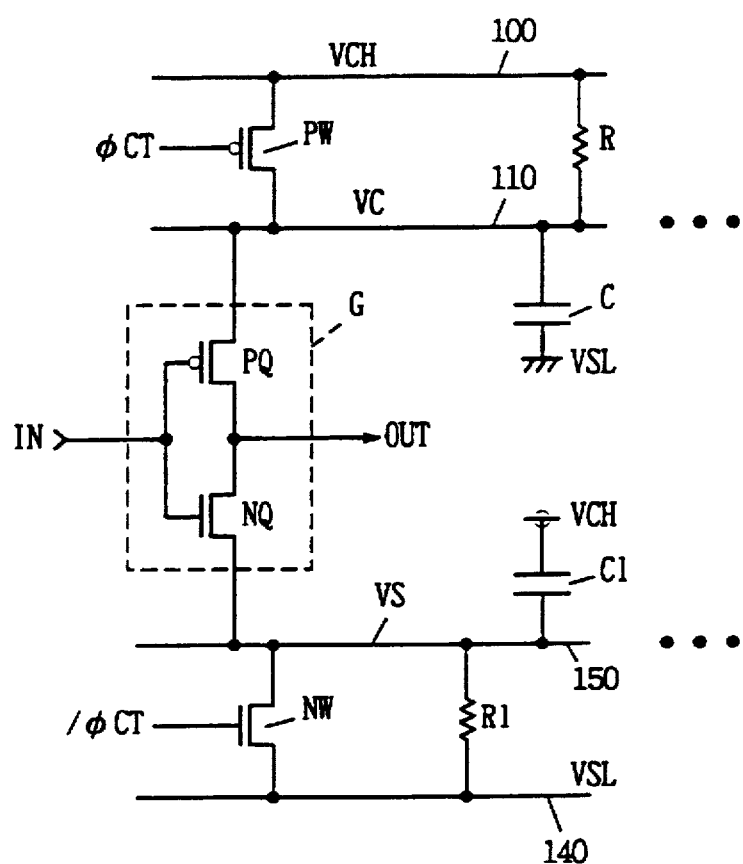
FIG. 18 is a diagram schematically illustrating the structure of a principal part of a semiconductor integrated circuit device according to a tenth embodiment of the present invention.

FIG. 18 is a diagram showing the structure of a principal part of a semiconductor integrated circuit device according to an eighteenth embodiment of the present invention. In FIG. 18, main source line 100 and sub source line 110, and main ground line 140 and sub ground line 150 are provided to gate circuit G. A resistive element R is connected between the main source line 100 and the sub source line 110. Further, a switching transistor PW comprised of a p channel MOS transistor brought into a conduction state when a control signal $\phi$CT is low in level to thereby electrically connect the main source line 100 and the sub source line 110, is provided between the main source line 100 and the sub source line 110 in parallel with the resistive element R. Furthermore, a capacitor C is provided between the sub source line 110 and the main ground line 140.

A resistive element R1 is connected between the main ground line 140 and the sub ground line 150. Further, a switching transistor NW comprised of an n channel MOS transistor brought into a conduction state when a control signal /$\phi$CT is high in level, is provided in parallel with the resistive element R1. A capacitor C1 is provided between the sub ground line 150 and the main source line 100.

As one example, the gate circuit G has a circuit configuration of a CMOS inverter composed of a p channel MOS transistor PQ and an n channel MOS transistor NQ. The operation of the semiconductor integrated circuit device will be described in brief.

Figure 19:
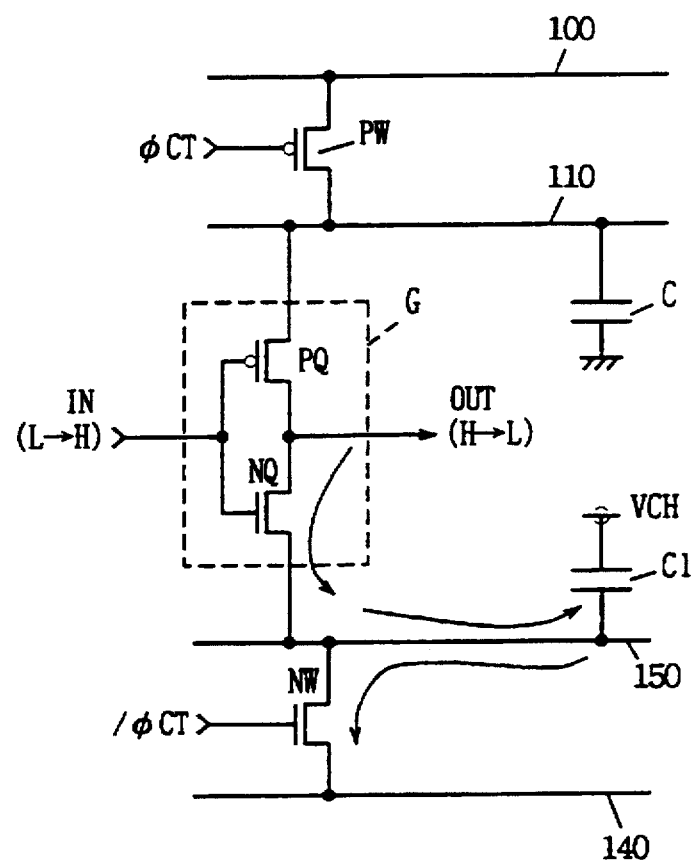
FIG. 19 is a diagram for describing an discharging operation on an output node of the semiconductor integrated circuit device shown in FIG. 18.

The operation of the semiconductor integrated circuit device at the time when an input signal IN changes from a low (L) level to a high (H) level, will now be described below with reference to FIG. 19. When the input signal IN is at the low level and the gate circuit G is in a standby state, the control signals $\phi$CT and /$\phi$CT are respectively the high level and the low level, i.e., an inactive state. Thus, the transistors PW and NW are both brought into an off state. The source and drain of the transistor PQ in the gate circuit G are identical in potential to each other and hence no current flows through the transistor PQ. On the other hand, since a potential applied to the gate of the transistor NQ is lower than that (voltage on the sub ground line 150) applied to the source thereof, a sub-threshold current that flows through the transistor NQ, is reduced (the resistive element R1 is not shown in FIG. 19).

Next, when the gate circuit G is operated, the control signals $\phi$CT and /$\phi$CT are both brought into an active state so that the transistors PW and NW are turned on. Thus, a voltage on the sub ground line 150 is reduced to a voltage level on the main ground line 140 and a voltage on the sub source line 110 is raised to a voltage level on the main source line 100. When the input signal IN rises from the low level to the high level at this time, the transistor NQ is turned on so that an output signal OUT thereof is lowered from the high level to the low level. Even when the voltage level on the sub ground line 150 is not sufficiently reduced at this time, a discharging current supplied through the transistor NQ is temporarily absorbed by the capacitor C1 and then flows from the capacitor C1 to the main ground line 140 through the transistor NW. Thus, even if the gate circuit G is operated so that the output signal OUT thereof is lowered from the high level to the low level where the voltage level on the sub ground line 150 is not sufficiently reduced to the voltage level on the main ground line 140, the output signal OUT can be reduced to a predetermined voltage level at high speed.

The operation of the semiconductor integrated circuit device at the time when an input signal IN changes from a high level to a low level, will next be described with reference to FIG. 20. When the input signal IN is at a high level and in a stable state, control signals $\phi$CT and /$\phi$CT are in an inactive state and transistors PW and NW are both in an off state (i.e., they are placed in a standby cycle). In this condition, the output signal OUT is at a low level and the source and drain of a transistor NQ are identical in potential to each other, thus causing no current flow through the transistor NQ.

Figure 20:
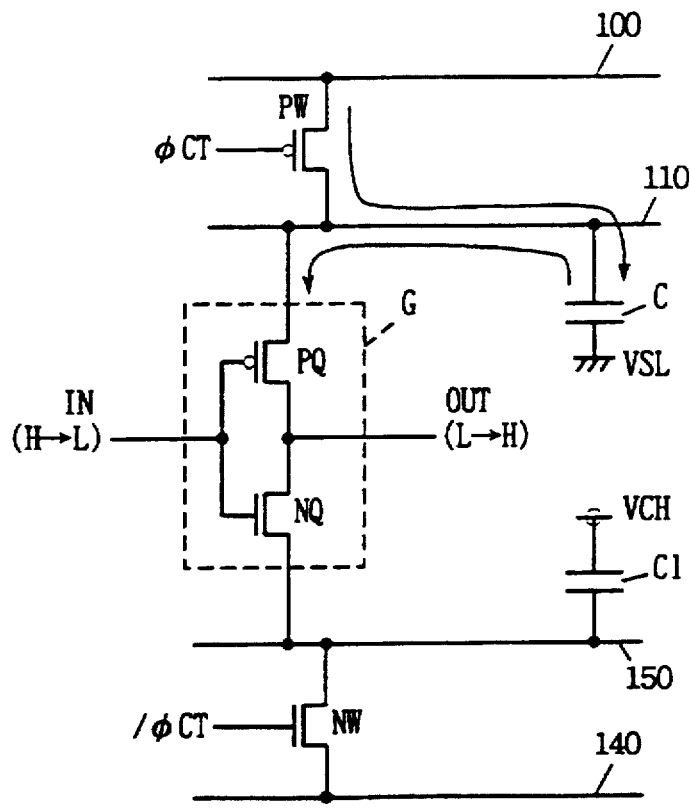
FIG. 20 is a diagram for explaining an charging operation on the output node of the semiconductor integrated circuit device shown in FIG. 18.

On the other hand, since the gate of the transistor PQ is supplied with a signal having a high level corresponding to a voltage level on main source line 100 and the source thereof is connected to sub source line 110, a sub-threshold current is restrained from flowing through the transistor PQ (a resistive element R is not shown in FIG. 20). A capacitor C has been charged up to a voltage level on the sub source line 110.

When a gate circuit G is operated, the control signals $\phi$CT and /$\phi$CT are respectively brought to a low level and a high level both indicative of an active state, the transistors PW and NW are turned on so that the sub source line 110 and the sub ground line 150 are respectively electrically connected to the main source line 100 and the main ground line 140. When the input signal IN falls from the high level to the low level, the transistor PQ is turned on and the transistor NQ is brought into an off state. Since a charging current for causing the potential of the output signal OUT to rise is also supplied from the capacitor C, the voltage on the sub ground line 110 can be restrained from reduction and hence the output signal OUT can be raised to a high level at quick speed.

FIG. 20 shows the manner in which after the charging current has temporarily flowed into the capacitor C through the transistor PW, the capacitor C supplies a current to an output node through the transistor PQ. However, the charging of the capacitor C by the transistor PW and the supply of the current from the transistor PW to the transistor PQ are simultaneously performed. Owing to the supply of the charging current from the capacitor C, the potential or voltage on the sub source line 110 can be restrained from reduction.

Figure 21:
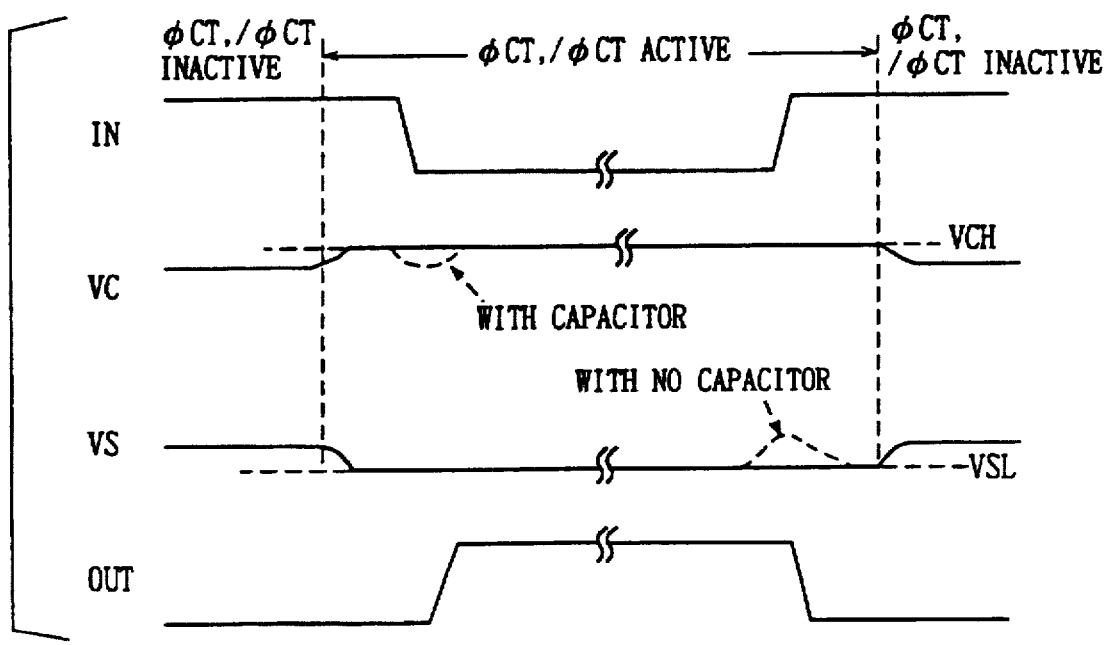
FIG. 21 is a signal waveform chart for describing the operation of the semiconductor integrated circuit device shown in FIG. 18.

Namely, when the capacitor C is not provided, the voltage VC on the sub source line 110 is slightly reduced as indicated by the broken line in FIG. 21 owing to the charging current supplied through the transistor when the input signal IN falls from the high level to the low level (the current supplied from the transistor PW is supplied after a reduction in the potential on the sub source line 110 and a delay in the response for its current supply is caused). However, the charging current can be supplied to the transistor PQ through the sub source line 110 owing to the provision of the capacitor C in the present invention, thereby making it possible to prevent the voltage level on the sub source line 110 from reduction. Similarly, even when the input signal IN rises from the low level to the high level, the discharging current flowing through the transistor NQ is temporarily absorbed into the capacitor C1. It is therefore possible to prevent the voltage on the sub ground line 150 from increasing (In. FIG. 21, a change in the voltage VS where the capacitor C1 is not connected to the sub ground line, is indicated by the broken line in the same figure).

Thus, by forming both the source lines and the ground lines into main/sub hierarchical configurations as shown in FIG. 18 and taking a configuration of supplying the operating source voltages from the sub source line and the sub ground line to the gate circuit, the sub-threshold current can be suppressed even if the input signal IN supplied to the gate circuit G is either the high level or the low level. Further, the voltage levels on the sub source line and the sub ground line can be respectively recovered to the voltage levels on the main source line 100 and the main ground line 140 at high speed. Furthermore, changes in the voltages on the sub source line 110 and the sub ground line 150 at the time of the operation of the gate circuit can be suppressed. Thus, a stably-operating semiconductor integrated circuit device can be obtained. In the structure shown in FIG. 18, the configurations employed in the aforementioned embodiments can be used as the configurations of the resistive elements R and R1 and the capacitors C and C1.

According to the tenth embodiment of the present invention, as described above, since both the source lines and the ground lines are formed into the main/sub hierarchical configurations, the sub-threshold current can be reliably suppressed even if the logic level of the input signal supplied to the gate circuit is either the high level or the low level. Further, the voltages on the sub source line and the sub ground line can be recovered at high speed upon operation of the gate circuit.

Eleventh Embodiment

Figure 22:
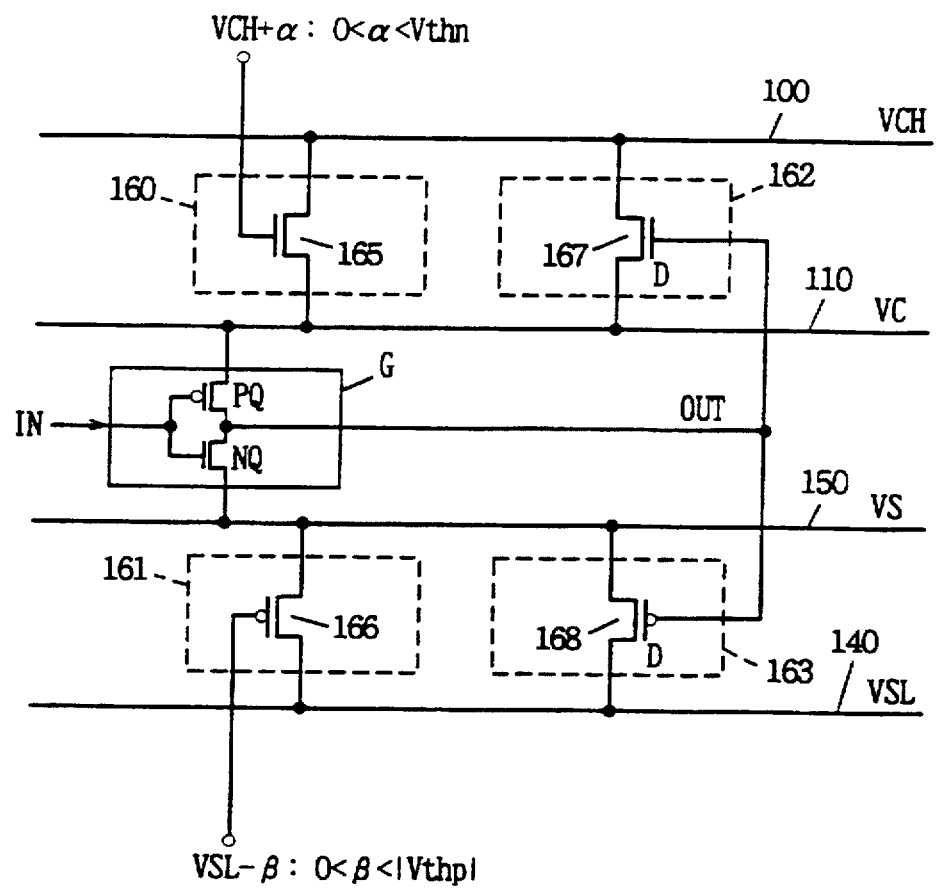
FIG. 22 is a diagram schematically illustrating the structure of a principal part of a semiconductor integrated circuit device according to an eleventh embodiment of the present invention.

FIG. 22 is a diagram showing the structure of a principal part of a semiconductor integrated circuit device according to an eleventh embodiment of the present invention. In FIG. 22, main source line 100, a sub source line 110, main ground line 140 and sub ground line 150 are provided to gate circuit G. An one example, the gate circuit G has a circuit configuration of a CMOS inverter. A clamp element 160 comprised of an n channel MOS transistor 165 whose gate is supplied with a predetermined voltage VCH+α, is provided between the main source line 100 and the sub source line 110. Here, α is smaller than Vthn (i.e., α<Vthn). Vthn represents a threshold voltage of the n channel MOS transistor 165. Further, a current regulating element 162 comprised of a depletion type n channel MOS transistor 167 whose gate is supplied with an output signal OUT of the gate circuit G, is provided between the main source line 100 and the sub source line 110.

A clamp element 161 comprised of a p channel MOS transistor 166 whose gate is supplied with a predetermined reference voltage VSL–β, is provided between the main ground line 140 and the sub ground line 150. A current regulating element 163 comprised of a depletion type p channel MOS transistor 168 whose gate is supplied with the output signal OUT of the gate circuit G, is provided between the main ground line 140 and the sub ground line 150 in parallel with the clamp element 161. The n channel MOS transistor 165 included in the clamp element 160 supplies a voltage of VCH+α–Vthn from the main source line 100 to the sub source line 110. When a voltage VC on the sub source line 110 reaches a voltage VCH+α–Vthn or more, the n channel MOS transistor 165 is turned off. Similarly, the p channel MOS transistor 166 of the clamp element 161 supplies a voltage VSL–β–Vthp onto the sub ground line 150. Here, Vthp represents a threshold voltage of the p channel MOS transistor 166 and has a negative value. Further, constant β falls between 0 and |Vthp| (i.e., 0<β<|Vthp|).

When the voltage VS on the sub ground line 150 reaches the voltage VSL–β–Vthp or less, the p channel MOS transistor 166 is turned off. The difference between the voltage VC on the sub source line 110 and the voltage VCH on the main source line 100 is smaller than the threshold voltage Vthn of the n channel MOS transistor 165. Similarly, the difference in voltage between the main ground line 140 and the sub ground line 150 is also smaller than the absolute value of the threshold voltage Vthp of the p channel MOS transistor 166.

Figure 23:
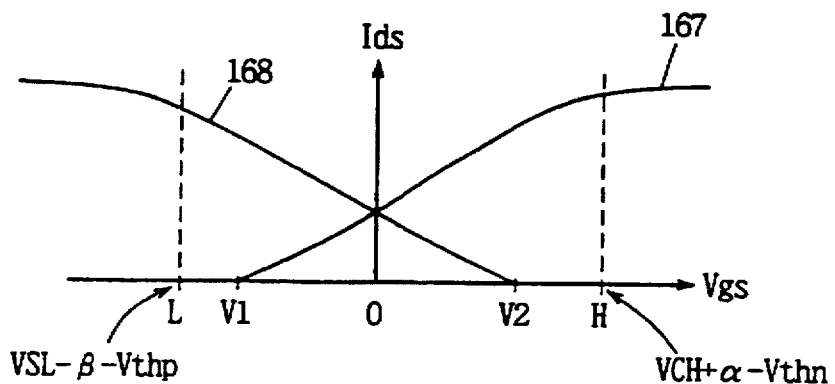
FIG. 23 is a diagram schematically showing operating characteristics of a current adjusting element shown in FIG. 22.

FIG. 23 shows a relationship between gate-to-source voltages Vgs and drain currents Ids of the MOS transistors 167 and 168 shown in FIG. 22. When the gate-to-source voltage Vgs of the n channel MOS transistor 167 reaches VI, the n channel MOS transistor 167 is brought into an off state. On the other hand, when the gate-to-source voltage Vgs of the p channel MOS transistor 168 reaches V2, the p channel MOS transistor 168 is turned off. The operation of the circuit shown in FIG. 22 will now be described.

When an input signal IN is at a high level corresponding to the level of the voltage VCH on the main source line 100, a transistor PQ in the gate circuit G is turned off and a transistor NQ in the gate circuit G is turned on. A voltage applied to the gate of the transistor PQ is higher than the voltage VC on the sub source line 110 and a sub-threshold current that flows through the transistor PQ is sufficiently suppressed. At this time, the output signal OUT is at the level of the voltage VS on the sub ground line 150. The voltage VS on the sub ground line 150 becomes equal to VSL–β–Vthp by the clamp element 161 (i.e., VS=VSL–β–Vthp). The gate of the n channel MOS transistor 167 is supplied with the voltage VSL–β–Vthp and the source thereof is supplied with the voltage VC. A gate-to-source voltage of the n channel MOS transistor 167 is lower than a voltage V1. Therefore, the n channel MOS transistor 167 is brought into a sufficiently deep off state. Thus, a current is supplied to the sub source line 110 through the clamp element 160 alone and the voltage on the sub source line 110 is maintained at the voltage level of VCH+α–Vthn. On the other hand, the output signal OUT supplied to the current regulating element 163 is equivalent in level of the voltage VS on the sub source line 150 and a gate-to-source voltage thereof is brought to 0 V. Thus, a current flows from the sub ground line 150 to the main ground line 140 so that the voltage level on the sub ground line 150 is discharged down to a ground voltage VSL level. As a result, the n channel MOS transistor 167 is brought into a deeper off state.

On the other hand, when the input signal IN is at a low level (voltage VSL level), the transistor PQ is turned on and the transistor NQ is turned off. The output signal OUT of the gate circuit G is at the voltage VC level on the sub source line 110 and a voltage applied to the gate of the transistor 168 becomes sufficiently higher than a voltage applied to the source thereof so that the p channel MOS transistor 168 is brought into a deep off state. Thus, the voltage VS on the sub ground line 150 is maintained at the level of the voltage VSL−β−Vthp by the p channel MOS transistor 166 of the clamp element 161. As a result, the gate-to-source of the transistor NQ in the gate circuit G is reversely biased so that the transistor NQ is brought into a deeper off state, thereby restraining a sub-threshold current from flowing through the transistor NQ. On the other hand, the output signal OUT corresponds to the voltage level on the sub source line 110 and the potentials applied to the gate and source of the n channel MOS transistor 167 become equal to each other to supply a current from the main source line 100 to the sub source line 110 (Vgs=0), whereby the voltage on the sub source line 110 is raised to the voltage VCH level on the main source line 100. A semiconductor integrated circuit device can be realized wherein whatever the level of the input signal IN supplied to the gate circuit G is, the voltage on each of the sub source line and the sub ground line can be recovered to a predetermined voltage level while the sub-threshold current is being sufficiently suppressed.

Twelfth Embodiment

Figure 24:
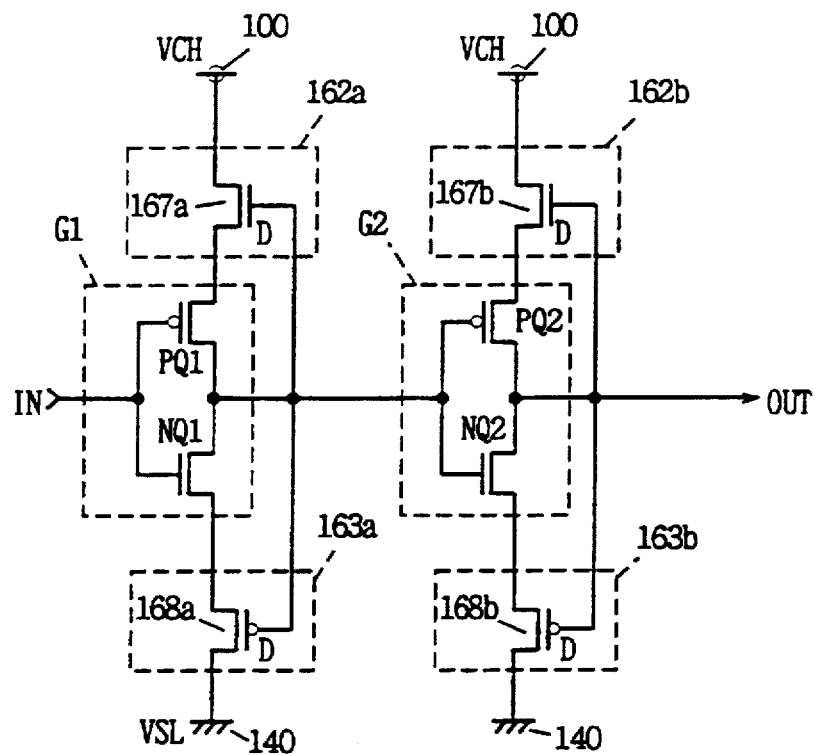
FIG. 24 is a diagram schematically illustrating the structure of a principal part of a semiconductor integrated circuit device according to a twelfth embodiment of the present invention.

FIG. 24 is a diagram illustrating the structure of a principal part of a semiconductor integrated circuit device according to a twelfth embodiment of the present invention. In FIG. 24, current regulating elements 162a and 162b regulating currents on the high-potential side and current regulating elements 163a and 163b for regulating currents on the low-potential side are provided corresponding to two cascade-connected gate circuits G1 and G2. The current regulating element 162a is connected between a source node 100 and one source supply node (a sub source voltage supply node) of the gate circuit G1. Further, the current regulating element 162a is comprised of a depletion type n channel MOS transistor 167a whose gate is supplied with an output signal produced from the gate circuit G1. The current regulating element 162b is connected between the source node 100 and a source supply node of the gate circuit G2 and is comprised of a depletion type n channel MOS transistor 167b whose gate is supplied with an output signal produced from the gate circuit G2.

The current regulating element 163a is connected between a ground node 140 and the other source node (sub ground node) of the gate circuit G1 and is comprised of a depletion type p channel MOS transistor 168a whose gate is supplied with the output signal OUT of the gate circuit G1. The current regulating element 163b is connected between the ground node 140 and a sub ground node of the gate circuit G2 and is comprised of a depletion type p channel MOS transistor 163b whose gate is supplied with the output signal OUT of the gate circuit G2.

The depletion type n channel MOS transistors 167a and 167b and the depletion type p channel MOS transistors 168a and 168b respectively have gate-to-source voltage/drain current characteristics shown in FIG. 23.

The gate circuit G1 has a circuit configuration of a CMOS inverter including an n channel MOS transistor NQ1 and a p channel MOS transistor PQ1. Similarly, the gate circuit G2 also has a circuit configuration of a CMOS inverter including a p channel MOS transistor PQ2 and an n channel MOS transistor NQ2.

When an input signal IN is at a high level, the p channel MOS transistor PQ1 is turned off and the n channel MOS transistor NQ1 is turned on so that the output signal produced from the gate circuit G1 is brought to a low level. At this time, the depletion type p channel MOS transistor 168a is turned on to attain a low resistance state, thereby discharging the output signal of the gate circuit G1 down to a low level. The transistor 168a is of a depletion type transistor and the output signal of the gate circuit G1 is discharged down to ground voltage VSL level.

On the other hand, the source of the n channel MOS transistor 167a is supplied with source voltage VCH and the gate thereof is supplied with a signal of a low level. Further, a gate-to-source voltage of the n channel MOS transistor 167a is a negative voltage and the n channel MOS transistor 167a is brought into an off state (or a high resistance state). Thus, current is little supplied from the source node 100 to the gate circuit G1.

In the gate circuit G2, the transistors PQ2 and NQ2 are respectively brought into an on state and an off state in response to the signal of the low level supplied from the gate circuit G1. Thus, the output signal OUT of the gate circuit G2 is brought to a high level and the transistor 168b is brought into an off state (or a high resistance state). On the other hand, the n channel MOS transistor 167b is brought into a deep on state to supply voltage VCH from the source node 100 to the transistor PQ2 of the gate circuit G2. At this time, a conduction terminal supplied with a high potential corresponds to a drain terminal in the n channel MOS transistor 167b, and the n channel MOS transistor 167b can supply the voltage of the source voltage VCH level to the source supply node (the source of the transistor PQ2) of the gate circuit G2.

According to the twelfth embodiment of the present invention, as described above, since the current regulating elements having variable resistances whose resistance values vary in proportional to the voltage levels of the output signals of the gate circuits, are respectively provided between the source supply nodes of the gate circuits and the source nodes and between the ground nodes and the ground voltage supply nodes of the gate circuits, the sub-threshold current can be restrained from generation irrespective of the logic level of the input signal whatever cycle each of the gate circuits is placed into, thereby making it possible to sufficiently reduce current consumption.

Thirteenth Embodiment

Figure 25:
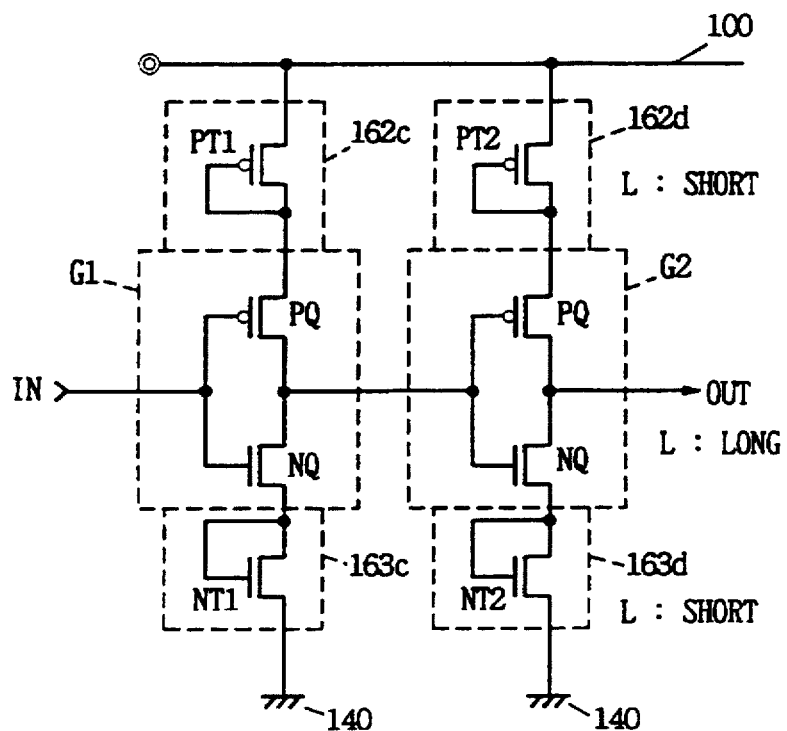
FIG. 25 is a diagram schematically depicting the structure of a principal part of a semiconductor integrated circuit device according to a thirteenth embodiment of the present invention.

FIG. 25 is a diagram showing the structure of a principal part of a semiconductor integrated circuit device according to a thirteenth embodiment of the present invention. In FIG. 25, current regulating elements 162c and 162d are respectively provided between source supply nodes of gate circuits G1 and G2 and source line 100. Similarly, current regulating elements 163c and 163d are respectively provided between ground potential supply nodes of the gate circuits G1 and G2 and ground node 140.

Each of the gate circuits G1 and G2 has a configuration of a CMOS inverter composed of a p channel MOS transistor PQ and an n channel MOS transistor NQ.

One conduction terminal (source) of the current regulating element 162c is connected to the source line 100 and the gate and the other conduction terminal (drain) of the current regulating element 162c are electrically connected to the source supply node of the gate circuit G1. The current regulating element 162c is comprised of a p channel MOS transistor. One conduction terminal (source) of the current regulating element 162d is connected to the source line 100 and the gate and the other conduction terminal (drain) of the current regulating element 162d are connected to the source supply node of the gate circuit G2. Gate lengths (channel lengths) of transistors PT1 and PT2 are adapted to become shorter than those of the transistors PQ included in the gate circuits G1 and G2.

The current regulating element 163c is comprised of an n channel MOS transistor NT1 whose one conduction terminal (source) is connected to the ground node 140 and whose gate and other conduction terminal (drain) are connected to the ground potential supply node of the gate circuit G1. The current regulating element 163d is comprised of an n channel MOS transistor NT2 whose one conduction terminal (source) is connected to the ground node 140 and whose gate and other conduction terminal (drain) are connected to the ground potential supply node of the gate circuit G2. Gate lengths (channel lengths) of the n channel MOS transistors NT1 and NT2 are adapted to become shorter than those of the n channel MOS transistors NQ included in the gate circuits G1 and G2. By shortening the gate lengths (channel lengths) of the transistors PT1, PT2, NT1 and NT2, depletion layer regions in the neighborhood of source and drain regions can be easily interconnected, to facilitate the generation of a punch through phenomenon.

Figure 26:
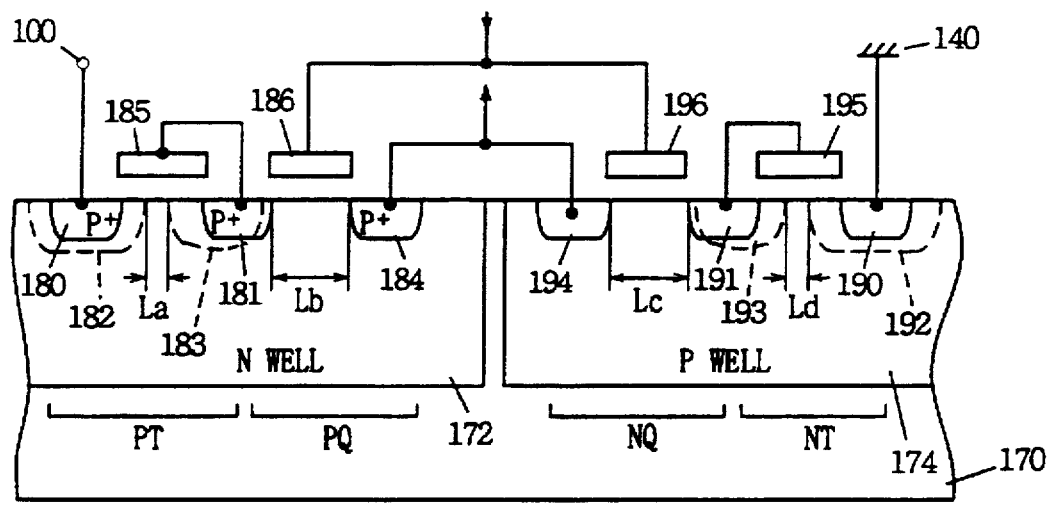
FIG. 26 is a view schematically showing sectional structures of a gate circuit and a voltage adjusting element related to the gate circuit both employed in the semiconductor integrated circuit device shown in FIG. 25.

FIG. 26 is a diagram showing sectional structures of portions related to one gate circuit having the configuration shown in FIG. 25. In FIG. 26, an N well 172 and a P well 174 are formed on a semiconductor substrate (or semiconductor layer) 170. Further, p channel MOS transistors PT and PQ are formed within the N well 172 and n channel MOS transistors NQ and NT are formed within the P well 174. The p channel MOS transistor PT includes impurity regions 180 and 181 and impurity regions 182 and 183 respectively formed covering the impurity regions 180 and 181. The impurity regions 180 and 182 form a source region of the p channel MOS transistor PT and the impurity regions 181 and 183 form a drain region of a transistor PT3. The impurity regions 181 and 183 are connected to a gate electrode layer 185. A channel length of each MOS transistor PT is given by a distance La between the impurity regions 182 and 183. The p channel MOS transistor PQ is composed of the impurity region 181, an impurity region 184 and a gate electrode layer 186. A channel length of the p channel MOS transistor PQ is given by a distance Lb between the impurity regions 181 and 184.

The n channel MOS transistor NT is composed of impurity regions 190 and 191 formed on the surface of the P well 174, impurity regions 192 and 193 formed covering the impurity regions 190 and 191 and a gate electrode layer 195 formed on a channel region provided between the impurity regions 190 and 192 and the impurity regions 191 and 193. The gate electrode layer 195 is connected to the impurity regions 191 and 193 and the impurity regions 192 and 190 are connected to a ground node 140.

The n channel MOS transistor NQ is composed of the impurity region 191, an impurity region 194 and a gate electrode layer 196 formed on the surface of the P well 174 between the impurity regions 191 and 194. A channel length of the n channel MOS transistor NT is given by a distance Ld between the impurity regions 192 and 193. A channel length of the n channel MOS transistor NQ is given by a distance Lc between the impurity regions 191 and 194. As is apparent from FIG. 26, the distances Lb and Ld has the following relationship: Lb<La, and Ld<Lc.

The impurity regions 184 and 194 are connected to each other to form an output node. The gate electrode layers 186 and 196 are coupled to each other to form an input node. Operations of the configurations shown in FIGS. 25 and 26 will now be described.

When an input signal IN is at a high level, the p channel MOS transistor PQ and the n channel MOS transistor NQ in the gate circuit G1 are respectively turned off and turned on, so that an output signal produced from the gate circuit G1 is brought to a low level. When the potential at the ground potential supply node of the gate circuit G1 increases, the n channel MOS transistor NT1 in the current regulating element 163c causes a punch through phenomenon to discharge the potential at the ground potential supply node of the gate circuit G1 to a ground potential level. Thus, the low level of the output signal of the gate circuit G1 is brought to a voltage level substantially near a ground voltage level VSL.

On the other hand, the p channel MOS transistor PQ of the gate circuit G1 is operated in a sub-threshold current region. However, when the potential at the source supply node of the gate circuit G1 is reduced at this time, the transistor PT1 of the current regulating element 162c causes a punch through phenomenon so that a current is supplied through the source line 100, thereby increasing the potential at the source supply node of the gate circuit G1 to bring the transistor PQ into a deeper off state. As a result, a sub-threshold current that flows through the transistor PQ, can be suppressed.

Figure 27:
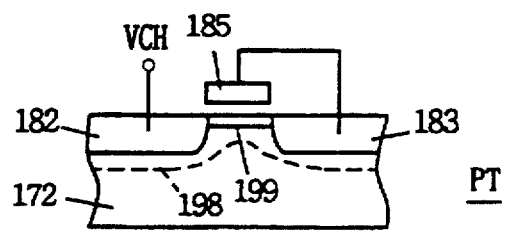
FIG. 27 is a diagram schematically illustrating a state in which the voltage adjusting element shown in FIG. 25 has been brought into conduction.

In each transistor that has caused the punch through phenomenon as shown in FIG. 27, a depletion layer is concatenated between impurity regions and hence an inversion layer is easily formed in a channel region. A pinch off point does not exist in the inversion layer formed in the channel region and a current acceleratedly flows from one impurity region to the other impurity region in accordance with the potential applied to the gate of each transistor.

FIG. 27 shows a state in which a depletion layer 198 is concatenated between the impurity regions 182 and 183 and an inversion layer 199 is formed, whereby the impurity regions 182 and 183 are conductively intercoupled. When the potential at the impurity region 183 is reduced in the transistor PT shown in FIG. 27, a current is supplied from the impurity region 182 to the impurity region 183. Under the punch through phenomenon, at this time, the controllability of a current according to the potential at the gate electrode layer 185 is lost, so that the current flows in accordance with a difference in voltage between the impurity regions 182 and 183. Thus, a reduction in the potential at the source supply node of the gate circuit G1 can be suppressed at high speed, thereby making it possible to bring the transistor PQ into a deeper off state.

When the potential at the source supply node of the gate circuit G1 is raised, the depletion layer 198 between the impurity regions 182 and 183 is disconnected to bring the punch through phenomenon of the transistor PT1 to disappear. As a result, the supply of the current to the impurity regions is stopped. Namely, the voltage level at which the source supply node of the gate circuit G1 can be set to a voltage level at which the sub-threshold current flowing through the transistor PQ is balanced with the voltage that produces the punch through phenomenon by the transistor PT1, into balance.

When the signal inputted to the gate circuit G2 is at a low level, the transistor PQ is turned on and an output signal OUT is brought to a high level. Even in the case of a rise in the potential of the output signal OUT, a current is supplied at high speed from the transistor PT2 and the level of the potential of the output signal OUT is raised at quick speed. Further, a voltage drop across the transistor PT2 is extremely small, and hence the voltage level of the output signal OUT is brought substantially to a voltage level on the source line 100 (when no current flows into the transistor PT2, the level of the output signal OUT is brought to the voltage level on the source line 100).

On the other hand, the voltage applied to the gate of the transistor NQ in the gate circuit G2 is at the ground voltage level and the transistor NQ is operated in the sub-threshold current region. When the sub-threshold current flows through the transistor NQ in this case, the punch through phenomenon is caused in the transistor NT2 upon increase in the potential at the ground potential node thereof so that the potential at the ground potential supply node is discharged down to the ground potential level at high speed. The voltage level at the ground potential supply node of the gate circuit G2 is set to a voltage level at which a sub-threshold current flowing through the transistor NQ is balanced with a voltage producing a punch through phenomenon of the transistor NT2. When the sub-threshold current flowing through the transistor NQ is sufficiently suppressed, the voltage applied to the gate of the transistor NT2 is sufficiently reduced and the gate of the transistor NQ is reversely biased. Therefore, the sub-threshold current that flows through the transistor NQ, can be sufficiently suppressed.

A semiconductor integrated circuit device, which operates at high speed with low current consumption, can be realized owing to a series of these operations.

[First Modification]

Figure 28:
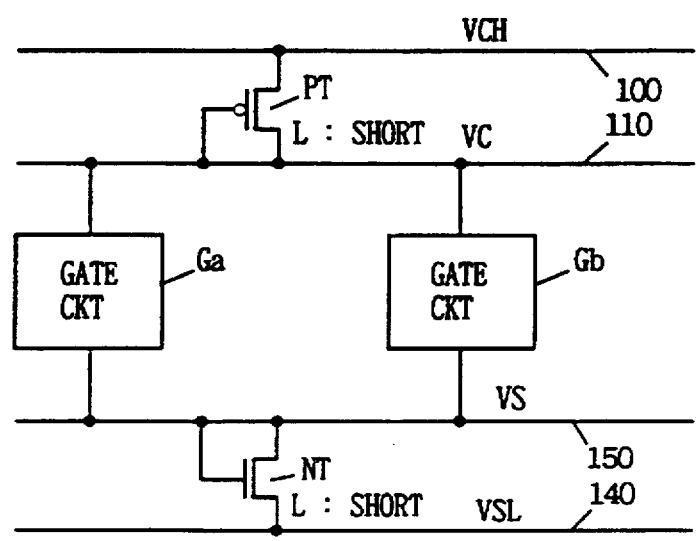
FIG. 28 is a diagram schematically showing the structure of a modification of the thirteenth embodiment of the present invention.

FIG. 28 is a diagram showing the structure of a modification of the thirteenth embodiment of the present invention. In the structure shown in FIG. 28, a plurality of gate circuits Ga and Gb are connected to a sub source line 110 and a sub ground line 150. The gate circuits Ga and Gb are activated in parallel with each other. A p channel MOS transistor PT whose channel length is sufficiently shortened, is connected between main source line 100 and the sub source line 110. One conduction terminal of a transistor PT is connected to the main source line 100 and the other conduction terminal and the gate of the transistor PT are connected to the sub source line 110. An n channel MOS transistor NT whose channel length is sufficiently shortened, is connected between main ground line 140 and the sub ground line 150. One conduction terminal and the gate of the transistor NT are connected to the main ground line 140 and the other conduction terminal of the transistor NT is connected to the sub ground line 150. When the voltage on the sub source line 110 is reduced, the transistor PT causes a punch through phenomenon to supply a current from the main source line 100 to the sub source line 110, thereby preventing the voltage on the sub source line 110 from dropping. On the other hand, when the voltage on the sub ground line 150 increases, the transistor NT causes a punch through phenomenon to produce a current flow from the sub ground line 150 to the main ground line 140. Thus, the level of the voltage VS on the sub ground line 150 is reduced to a level near a voltage level VSL on the main ground line 140.

In the structure shown in FIG. 28, the voltage VC on the sub source line 110 is brought to a voltage at which a sub-threshold current flowing through an output charging transistor (corresponding to the p channel MOS transistor PQ shown in FIG. 25) of each of the gate circuits Ga and Gb is balanced with a punch through voltage (a punchthrough producing voltage) of the transistor PT, more accurately, a voltage level at which a sub-threshold current flowing from the sub source line 110 to each of output nodes of the gate circuits Ga and Gb equals a leakage current flowing from the main source line 100 to the sub source line 110 through the transistor PT. The channel length of the transistor PT is sufficiently shortened and the threshold voltage thereof is also reduced owing to a so-called short channel effect. Thus, the difference between the voltage VCH on the main source line 100 and the voltage VC on the sub source line 110 can be sufficiently reduced.

Similarly, the level of the voltage VS on the sub ground line 150 is brought to a voltage level at which a sub-threshold current flowing through an output discharging transistor (corresponding to the n channel MOS transistor NQ shown in FIG. 25) of each of the gate circuits Ga and Gb equals a leakage current (current flowing before the generation of the punch through).

According to the structure shown in FIG. 28, the sub-threshold currents flowing through the gate circuits Ga and Gb can be sufficiently reduced irrespective of a logic levels of a signal inputted to each of the gate circuits Ga and Gb.

According to the thirteenth embodiment of the present invention, as described above, since each of the transistors whose channel lengths are sufficiently shortened and which easily causes the punch through phenomena, is connected between one source node of each gate circuit and the source line for supplying the current to the one source node, the sub-threshold current can be sufficiently restrained from flowing through each gate circuit. It is also possible to sufficiently reduce the difference in potential between the source node and the source supply node of each gate circuit.

[Method of Manufacturing Current Regulating Transistors]

Figure 29:
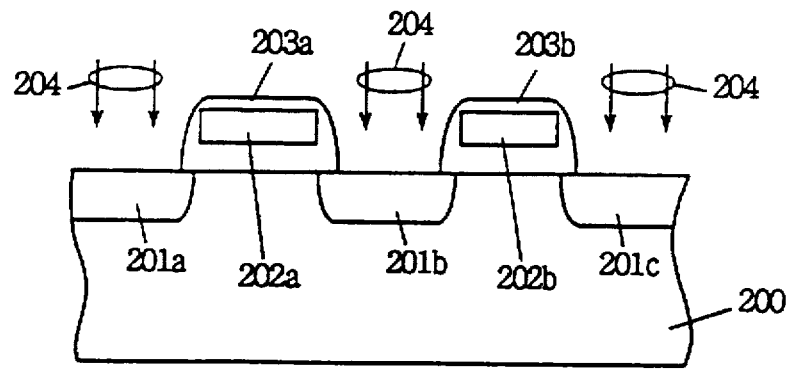
FIG. 29 is a view illustrating a step of manufacturing the voltage adjusting element shown in FIG. 25.
Figure 30:
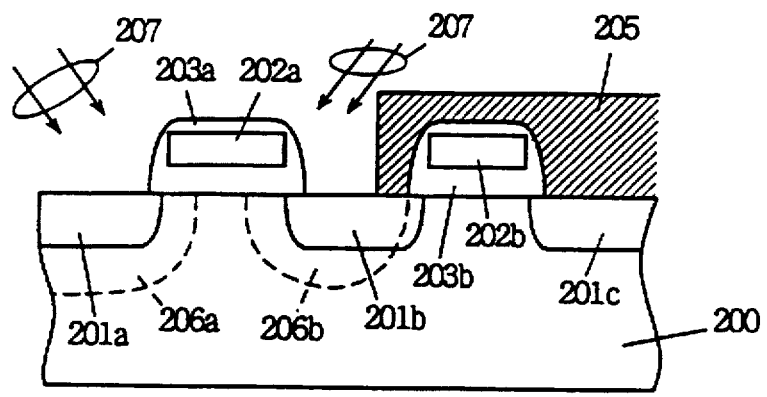
FIG. 30 is a view depicting another step of manufacturing the voltage adjusting element shown in FIG. 25.
Figure 31:
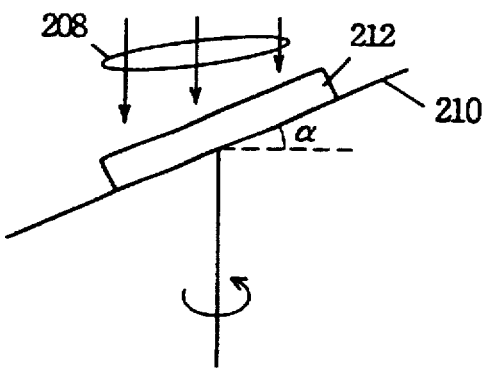
FIG. 31 is a view showing a further step of manufacturing the voltage adjusting element shown in FIG. 25.

FIGS. 29 through 31 are respectively views schematically showing steps of manufacturing the current regulating transistors PT and NT shown in FIGS. 25 through 28. Only either one of the transistors PT and NT will be shown in FIGS. 29 and 30. A method of fabricating a transistor that causes a punch through phenomenon upon its conduction, will hereinafter be described with reference to FIGS. 29 through 31.

First, gate electrode layers 202a and 202b are formed with a spacial interval on the surface of a semiconductor substrate region (well region) 200. The gate electrode layers 202a and 202b are covered with spacer layers 203a and 203b respectively. The spacer layers 203a and 203b are provided to prevent impurity regions formed in a subsequent step from unnecessarily diffusing into portions below the gate electrode layers. Next, ions 204 are implanted into the semiconductor substrate region with the spacer layers 203a and 203b as masks to form high concentration impurity regions 201a, 201b and 201c. Thus, a transistor (PQ or NQ), which constitutes a gate circuit, is formed (see FIG. 29).

Next, a resist film 205 is formed covering a transistor (a part of the impurity region 201b, the impurity region 201c and the spacer layer 203b) which is a component of the gage circuit (see FIG. 30). In this state, ions 207 are obliquely injected into the semiconductor substrate region. The ions 207 injected in the oblique direction are diffused into lower portions below the spacer layer 203a and the gate electrode layer 202a, so that high concentration impurity regions 206a and 206b are formed covering the impurity regions 201a and 201b. The distance between the impurity regions 206a and 206b is sufficiently small as compared with that between the impurity regions 201a and 201b. Namely, a short channel transistor in which the impurity regions 206a and 206b have been formed in a part below the gate electrode layer 202a, is formed.

A method shown in FIG. 31 is used when the ions 207 are obliquely injected into the semiconductor substrate region as shown in FIG. 30. Namely, a wafer 212 with a semiconductor integrated circuit device formed thereon is placed on a mount table 210 as shown in FIG. 31. The mount table 210 has an inclination of an angle a with respect to the horizontal direction. The oblique ion implantation is performed by bombering the wafer 212 with ions 208 from the vertical direction while the mount table 210 is being rotated, whereby the impurity regions 206a and 206b shown in FIG. 30 are formed.

According to the structures shown in FIGS. 29 through 31, the current regulating transistors are formed in the same steps as those for the MOS transistors that are components of the gate circuits. Thereafter, only the oblique ion implantation is performed after the transistor of each gate circuit has been covered with the resist film. Thus, short channel MOS transistors capable of easily causing punch through phenomenon can be fabricated.

At this time, as impurities for forming the impurity regions 201a, 201b and 201c and impurities for forming the impurity regions 206a and 206b, may be used those such as phosphorous (P) and arsenic (As), which are different in diffusivity or diffusion coefficient from each other. Oblique ion implantation may be performed using impurities of large diffusivity so as to form the impurity regions 206a and 206b.

According to the thirteenth embodiment of the present invention, as described above, the voltage on the sub source line/sub ground line can be set to as close as possible to the voltage level on the main source line/main ground line. Further, the sub-threshold current can be effectively controlled. By using a short channel MOS transistor as a current regulating element and providing short channel transistors identical in conduction type to the MOS transistors included in the gate circuits adjacently to each other, the current regulating transistor elements can be easily formed.

In the following description, a structure of a semiconductor memory device will be described as one specific example of the semiconductor integrated circuit device. A dynamic semiconductor memory device is illustrated as the semiconductor memory device. However, structures of boosting word lines and of equalizing bit lines, which will be described later, can be applied even to a static semiconductor memory device (SRAM).

[Overall Structure of Semiconductor Memory Device]

Figure 32:
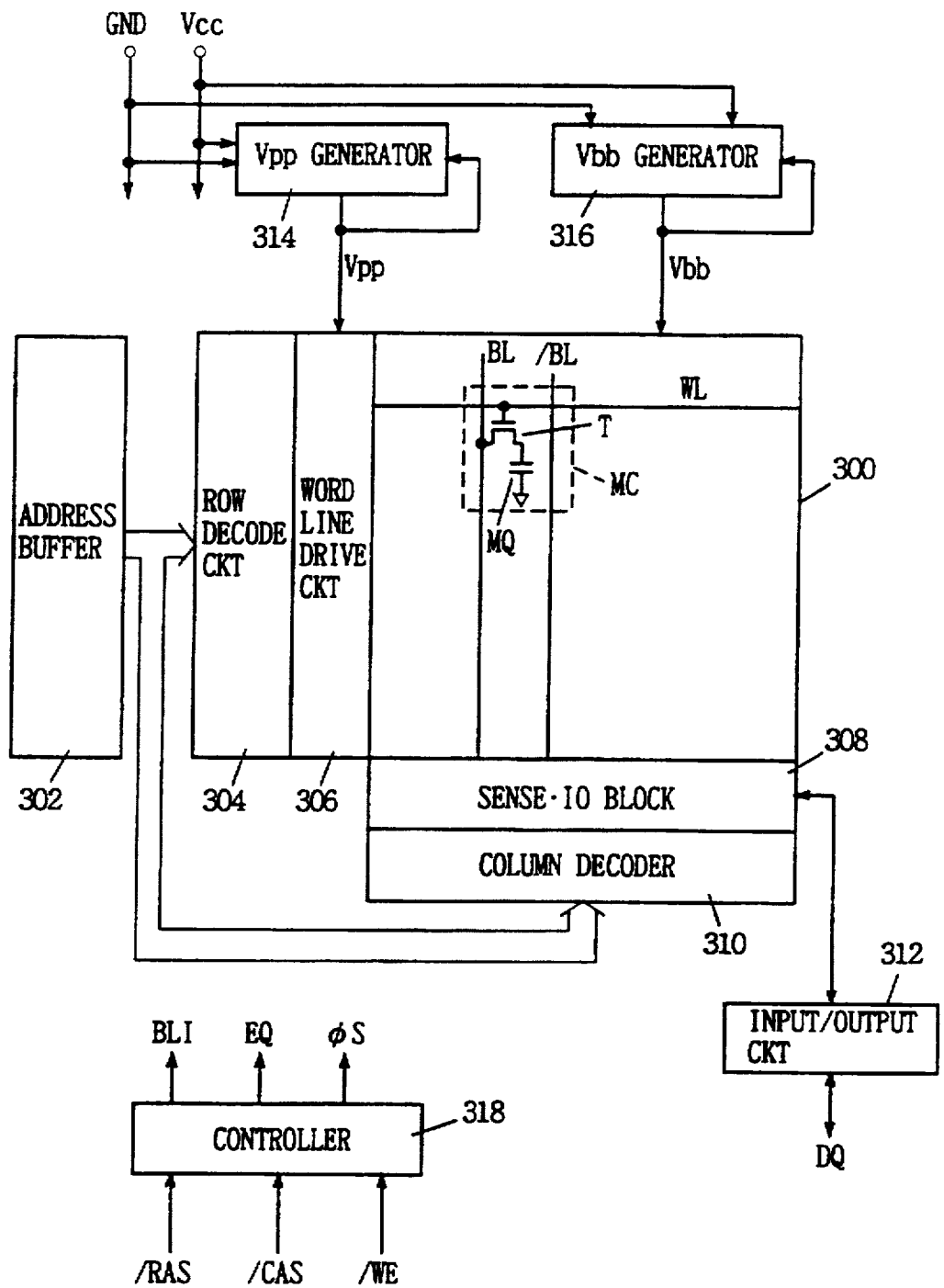
FIG. 32 is a diagram schematically illustrating the overall structure of a semiconductor memory device to which the present invention is applied.

FIG. 32 is a diagram schematically showing the overall structure of a semiconductor memory device which is illustrative of one embodiment of the present invention. In FIG. 32, the semiconductor memory device includes a memory cell array 300 in which memory cells MCs are arranged in a matrix of rows and columns, and an address buffer 302 for receiving an address signal specifying a memory cell in the memory cell array 300 to generate an internal address signal. Word lines WL to which memory cells MCs on respective rows are connected respectively, and a plurality of bit line pairs BL and /BL to which memory cells MCs on respective columns are connected respectively, are arranged in the memory cell array 300. FIG. 32 shows a single word line WL and a pair of bit lines BL and /BL as a representative example. A memory cell MC is provided corresponding to a crossing of a word line and a pair of bit lines BL and /BL. However, a memory cell MC provided at a crossing of a bit line BL and a word line WL, is representatively shown in FIG. 32. The memory cell MC includes a memory capacitor MQ that stores therein information in the form of charges and an access transistor T which is rendered conductive in response to a potential on the word line WL to electrically connect the memory capacitor MQ to the corresponding bit line BL.

The address buffer 302 generates an internal row address signal and an internal column address signal in response to a row address signal specifying a row (word line) in the memory cell array 300 and a column address signal specifying a column (bit line pair) in the memory cell array 300. In the dynamic semiconductor memory device, the row address signal and the column address signal are normally supplied to the address buffer 302 time division multiplexedly.

Further, the semiconductor memory device includes a row decode circuit 304 for decoding the internal row address signal generated from the address buffer 302 to generate a signal specifying a corresponding row in the memory cell array 300, a word line drive circuit 306 for supplying a high voltage Vpp to a word line specified by the word line specifying signal outputted from the row decode circuit 304 to drive the specified word line into a selected state, a column decoder 310 for decoding the internal column address signal supplied from the address buffer 302 to generate a column selection signal specifying a corresponding column (bit line pair) in the memory cell array 300, a sense amplifier for amplifying and latching potentials on respective columns (bit line pairs) in the memory cell array 300, and IO gate which electrically connects a column selected in response to a signal outputted from the column decoder 310, to an input/output circuit 312. In FIG. 32, the sense amplifier and the IO gate are represented as a sense-IO block 308. The sense amplifier is provided corresponding to each of the bit line pairs. Further, the IO gates are respectively provided to the bit line pairs. These configurations will be described in detail later.

Furthermore, the semiconductor memory device includes a Vpp generating circuit 314 for generating an internal high voltage Vpp in response to a power source voltage Vcc and a ground voltage GND and a Vbb generating circuit 316 for generating a negative voltage Vbb in response to the power source voltage Vcc and the ground voltage GND. The power source voltage Vcc and the ground voltage GND may be voltages on the main source line and the main ground line. Alternatively, the source voltage Vcc and the ground voltage GND may be voltages on the sub source line and the sub ground line. Therefore, they will be represented by symbols Vcc and GND.

Detailed configurations of the Vpp generating circuit 314 and the Vbb generating circuit 316 will be described later. Vpp generating circuit 314 and the Vbb generating circuit 316 are adapted to receive the high voltage Vpp and the negative voltage Vbb generated therefrom as operating source voltages to efficiently generate internal high voltage Vpp and negative voltage Vbb. In FIG. 32, the internal high voltage Vpp outputted from the Vpp generating circuit 314 is shown being supplied to the word line drive circuit 306 and the negative voltage Vbb outputted from the Vbb generating circuit 316 is shown being supplied to the memory cell array 300. The word line drive circuit 306 supplies the high voltage Vpp to the selected word line WL to enable compensation for a loss due to a threshold voltage of access transistor T of each memory cell MC, to make it possible to write information of about a power source voltage level into a corresponding memory capacitor MQ.

Still further, the semiconductor memory device includes a control circuit 318 for generating various internal control signals BLI, EQ and φS in response to external control signals /RAS, /CAS and /WE and an input/output circuit 312 for inputting and outputting data DQ from and to the outside of the semiconductor memory device. The signal /RAS is a row address strobe signal and defines a memory cycle of the semiconductor memory device. The signal /CAS is a column address strobe signal and determines timing for starting a column selection operation and reading data. The signal /WE is a write enable signal and designates whether the semiconductor memory device is in a data write mode or a data read mode. The signal BLI is a control signal for electrically connecting a sense amplifier and a bit line pair to each other, where the sense amplifiers included in the memory cell array 300 are arranged in shared sense-amplifier arrangements (which will be described later). The signal EQ is an equalize signal for equalizing and precharging the potential on each bit line pair to a predetermined potential (Vcc/2) during a standby cycle. The signal φS is a signal for activating a sense amplifier, for example.

In the semiconductor memory device in general, the high voltage Vpp is not only supplied to a selected word line, but is used in generation of control signals BLI, EQ and φS2. In the following description, a configuration of laying out the power source with respect to the word line drive circuit will first be described. The layouts of the power sources, which have been employed in the aforementioned first through thirteenth embodiments, can be available. However, power source layout and configuration, which are not included in the first through thirteenth embodiments, will be principally described.

Fourteenth Embodiment

Figure 33:
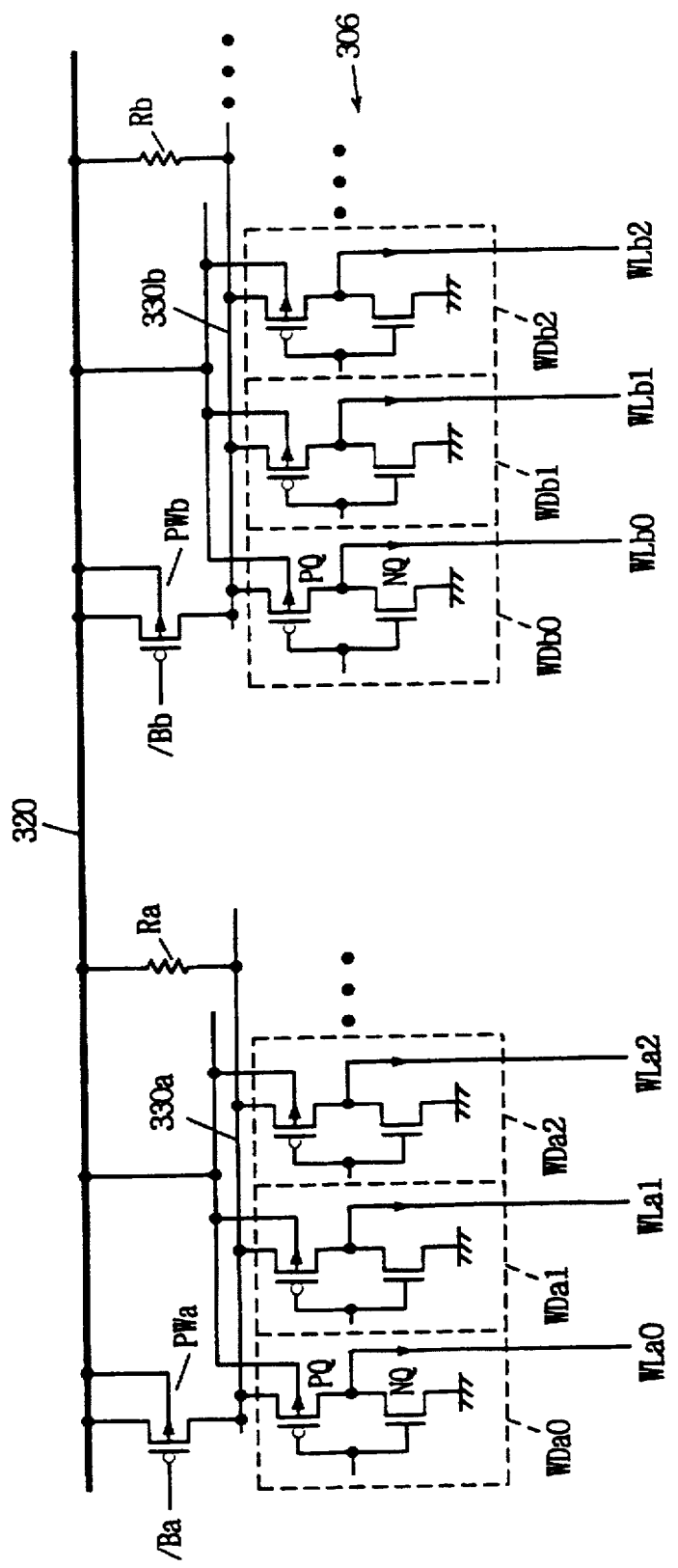
FIG. 33 is a diagram schematically depicting the structure of a principal part of a semiconductor memory device according to a fourteenth embodiment of the present invention.

FIG. 33 is a diagram schematically showing the structure of a fourteenth embodiment of the present invention. In FIG. 33, a power source configuration of the word line drive circuit 306 shown in FIG. 32 is shown. The word line drive circuit 306 includes word drivers respectively provided for word lines WL included in a memory cell array 300. The word line drivers are divided into a plurality of groups. FIG. 33 representatively illustrates two word line driver groups. One of the word line driver groups includes word drivers WDa0, WDa1, WDa2, ... respectively provided for word lines WLa0, WLa1, WLa2, ... The other word line driver group includes word drivers WDb0, WDb1, WDb2, ... respectively provided for word lines WLb0, WLb1, WLb2, ... The word drivers WDa0 through WDb2 are supplied with respective output signals of row decoders included in the row decode circuit 304 shown in FIG. 32. A relationship between the row decoders and the word drivers will be described later in detail. In the present embodiment, a word driver provided to a selected word line is simply supplied with a signal low in level.

A sub Vpp line 330a is provided for the word drivers WDa0 through WDa2, whereas a sub Vpp line 330b is provided for the word drivers WDb0 through WDb2. A main Vpp line 320 is commonly provided for to the sub Vpp lines 330a, 330b, ... The Vpp generating circuit 314 shown in FIG. 32 supplies the high voltage Vpp to the main Vpp line 320. A resistive element Ra having a high resistance and a switching transistor PWa rendered conductive in response to a word line group selection signal /Ba are provided between the sub Vpp line 330a and the main Vpp line 320.

A resistive element Rb having a high resistance and a switching transistor PWb made conductive in response to a word line group selection signal /Bb are provided between the sub Vpp line 320b and the main Vpp line 320. Each of the word drivers WDa0 through WDb2 has a configuration of a CMOS inverter composed of a p channel MOS transistor and an n channel MOS transistor. A substrate region (well region or semiconductor layer) of the p channel MOS transistor PQ included in each of the word drivers WDa0 through WDb2 is connected to the main Vpp line 320. Substrate regions of the switching transistors PWa and PWb are also connected to the main Vpp line 320. The following advantages can be obtained by connecting the substrate region of each p channel MOS transistor PQ to the main Vpp line 320.

A voltage on the main Vpp line 320 is greater than or equal to a voltage on each of the sub Vpp lines 330a, 330b, ... Namely, a bias voltage supplied to the substrate region of the p channel MOS transistor PQ included in each of the word drivers WDa0 through WDb2 is higher than its source potential (when the switching transistors PWa and PWb are turned off). In this condition, the absolute values of threshold voltages of the p channel MOS transistors become greater due to the substrate effect of the p channel MOS transistors PQ. When a high level signal is supplied to each of the word drivers WDa0 through WDb2, the level of the voltage supplied to the gate of each p channel MOS transistor PQ is effectively raised owing to the substrate effect of each p channel MOS transistor PQ, so that a sub-threshold current that flows through each p channel MOS transistor PQ in a sub-threshold current region, is reduced. The operation of the present embodiment will now be described.

The circuit shown in FIG. 33 is substantially identical in operation to the circuits having the configurations shown in FIGS. 5 and 6. In the semiconductor memory device, an operating cycle includes a standby cycle and an active cycle. The operating cycle is determined based on the signal /RAS. During the standby cycle, the group selection signals /Ba and /Bb are both at a high level of high voltage Vpp level, and the switching transistors PWa and PWb are respectively in an off state. In this condition, current is supplied to each of the sub Vpp lines 330a and 330b through each of the resistive elements Ra and Rb. During the standby cycle, a signal outputted from a corresponding row decoder is at a high level and a high level signal is supplied to each of the word drivers WDa0 through WDb2. The n channel MOS transistors NQ of the word drivers WDa0 through WDb2 are turned off after discharging the potentials on their corresponding word lines WLa0 through WLb2 to ground potential levels.

On the other hand, each p channel MOS transistor PQ is in the sub-threshold current region and supplies the sub-threshold current from the sub Vpp lines 330a and 330b to the respective output nodes. When the sub-threshold current that flows through the p channel MOS transistors PQ, increases, voltage drops developed across the corresponding resistive elements Ra and Rb become greater. As a result, the gate-to-source of each p channel MOS transistor PQ included in each of the word drivers WDa0 through WDb2 is reversely biased so that the sub-threshold current is reduced. Namely, each of the voltages on the sub vpp line 330a and 330b reaches a voltage level at which the current flowing through each of the resistive elements Rb and Rb is balanced with the sub-threshold current flowing through the word drivers of the corresponding group. Thus, the sub-threshold current flowing through each word driver can be reduced, and voltage drops on the sub Vpp lines 330a and 330b can be reduced.

When the active cycle is started, the control signal /Ba and/or /Bb is brought to a low level indicative of an active state to turn on the switching transistor PWa and/or PWb. As a result, the sub Vpp line 330a and/or 330b is electrically connected to the main Vpp line 320 and the voltage on the sub Vpp line 330a and/or 330b becomes equal to the voltage level on the main Vpp line 320. Thus, the high voltage Vpp can be supplied to the selected word line.

All the switching control signals /Ba and /Bb may be simultaneously brought into the active state upon word line selection operation. Alternatively, a configuration of turning on only the switching transistor provided corresponding to the group including the selected word line may be used. When the switching transistor PWa and/or PWb is turned on, the difference between the voltage on the sub Vpp line 330a and/or 330b and the voltage on the main Vpp line 320 is small, and each of the voltages on the sub Vpp lines 330a and/or 330b is restored to the voltage level on the main Vpp line 320 at high speed.

Since the number of the word drivers connected to the sub Vpp lines 330a and 330b is reduced in particular, load capacitances of the sub Vpp lines 330a and 330b are small, and the potentials on the sub Vpp lines 330a and 330b can be recovered at quick speed. Thus, a semiconductor memory device can be obtained which is capable of raising the output signal of the word driver provided corresponding to a selected word line to a high level in quickly after the switching transistor PWa and/or PWb has been turned on and of operating at high speed.

Since the sub Vpp lines are disposed corresponding to the word driver groups respectively, the load capacitances of the sub Vpp lines can be reduced and the voltage recovery on each sub Vpp line upon transition to the active cycle can be effected at high speed, thereby making it possible to provide a first access. Further, since the main Vpp line and the sub Vpp lines are respectively electrically connected to one another by the resistive elements having the high resistances, a dropped voltage on each vpp line can be set to a voltage level at which a sub-threshold current flowing through the corresponding word drive group is balanced with a leakage current flowing through each resistive element during turning off of each switching transistor. Further, the difference in potential between the main Vpp line and each sub Vpp line can be reduced so that the voltage on each sub Vpp line can be recovered at high speed upon transition from the standby cycle to the access cycle.

Fifteenth Embodiment

Figure 34:
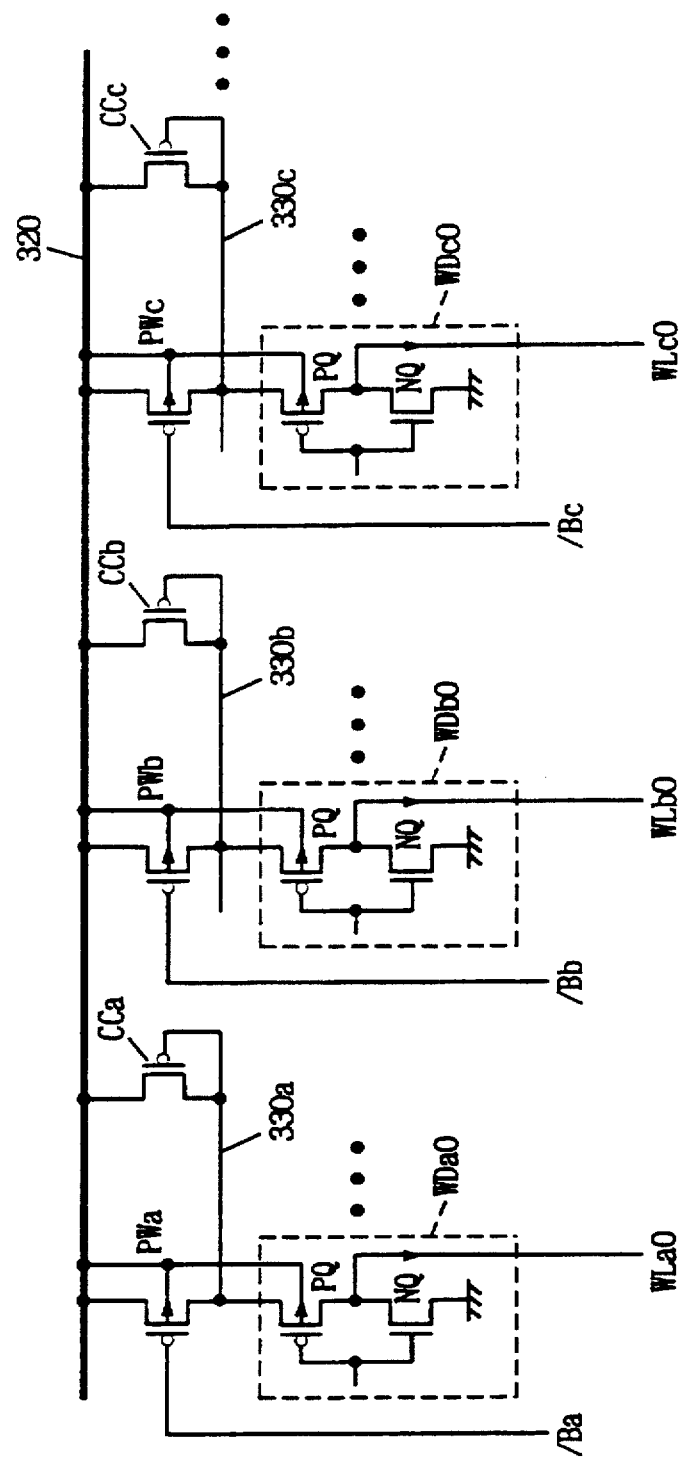
FIG. 34 is a diagram schematically showing the structure of a principal part of a semiconductor memory device according to a fifteenth embodiment of the present invention.

FIG. 34 is a diagram showing the structure of a fifteenth embodiment of the present invention. In FIG. 34, word drivers are divided into a plurality of groups, but word drivers WDa0, WDb0 and WDc0 included in the three groups respectively are representatively illustrated. Sub Vpp lines 330a, 330b and 330c are disposed for word driver groups respectively. A switching transistor PWa rendered conductive in response to a group selection signal /Ba, and a p channel MOS transistor CCa whose one conduction terminal is connected to main Vpp line 320 and whose gate and other conduction terminal are connected to the sub Vpp line 330a are provided between the main Vpp line 320 and the sub Vpp line 330a.

A switching transistor PWb rendered conductive in response to a group selection signal /Bb and a p channel MOS transistor CCb whose one conduction terminal is connected to the main Vpp line 320 and whose gate and other conduction terminal are connected to the sub Vpp line 330b are provided between the main Vpp line 320 and the sub Vpp line 330b. A switching transistor PWc rendered conductive in response to a group selection signal /Bc and a p channel MOS transistor CCc whose one conduction terminal is connected to the main Vpp line 320 and whose gate and other conduction terminal are connected to the sub Vpp line 330c are provided between the main Vpp line 320 and the sub Vpp line 330c.

The transistors CCa, CCb and CCc may be depletion type transistors having sufficient large resistance values. Alternatively, these transistors CCa–CCc may be short channel MOS transistors that causes the punch through phenomenon when voltages on their corresponding sub Vpp lines are reduced. In either case, each of the sub Vpp lines 330a, 330b and 330c can maintain the difference in potential relative to the main Vpp line 320 at a sufficient small value while suppressing a sub-threshold current through the corresponding word drivers when each of their corresponding switching transistors PWa through PWc is in an off state.

The group selection signals /Ba through /Bc may be controlled in the same timing to reach an active/inactive state. Alternatively, only a selection signal with respect to a group including a word driver provided for the selected word line may be adapted to be brought into an active state. During the standby cycle, each of the group selection signals /Ba through /Bc is set to a high level indicative of an inactive state.

Even in the case of the structure of the fifteenth embodiment shown in FIG. 34, the sub Vpp line is divided into a plurality of sub Vpp lines, and load capacitances of the divided sub Vpp lines are sufficiently small in value. The voltage on each sun Vpp line can be recovered at high speed upon transition from the standby cycle to the active cycle. Owing to the provision of the transistors CCa through CCc, the difference in potential between the main Vpp line 320 and each of the sub vpp line 330a, 330b and 330c can be set to the sufficient small value (when each of the switching transistors PWa through PWc is in the off state). Similarly, the voltages on the sub Vpp lines 330a through 330c can be recovered at high speed when the switching transistors are switched on.

Sixteenth Embodiment

Figure 35:
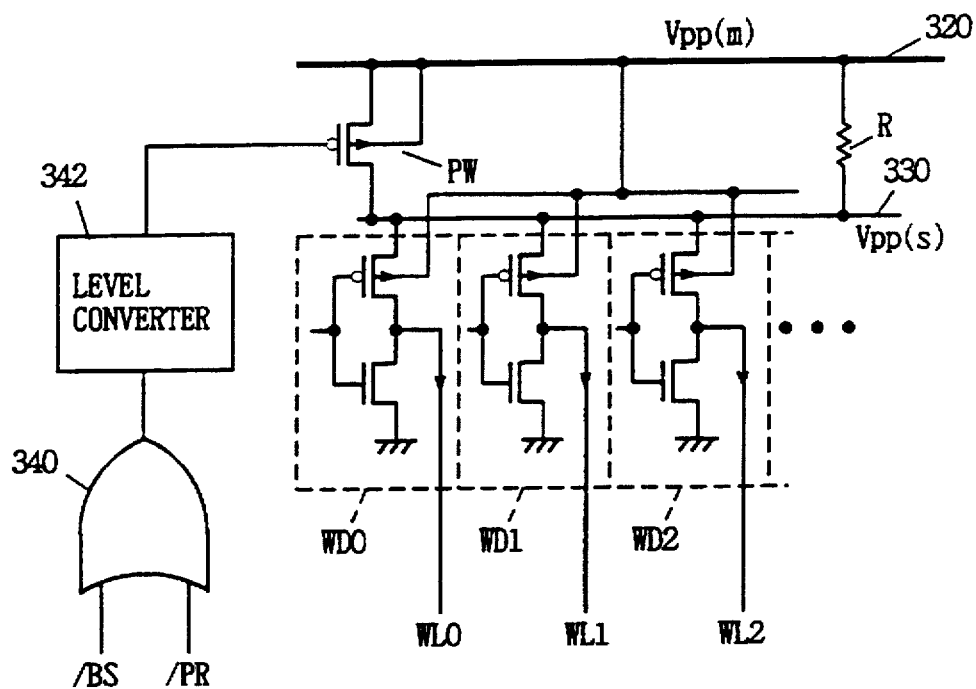
FIG. 35 is a diagram schematically illustrating the structure of a principal part of a semiconductor memory device according to a sixteenth embodiment of the present invention.
Figure 36:
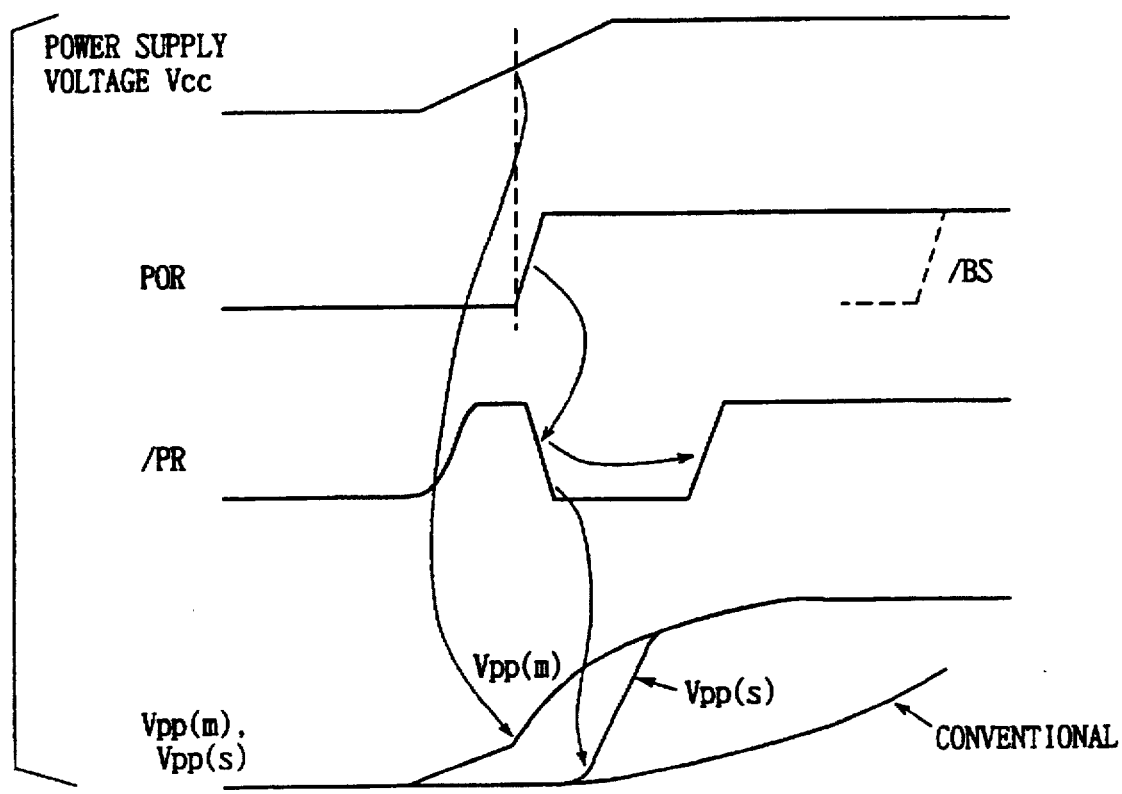
FIG. 36 is a signal waveform chart for describing the operation of the semiconductor memory device shown in FIG. 35.

FIG. 35 is a diagram illustrating the structure of a sixteenth embodiment of the present invention. In FIG. 35, one word driver group among a plurality of word driver groups is representatively illustrated. In FIG. 35, word drivers WD0 through WD2, . . . are operated with a voltage on sub Vpp line 330 as one operating source voltage. A resistive element R having a high resistance is connected between main Vpp line 320 and the sub Vpp line 330. Further, a switching transistor PW is provided in parallel with the resistive element R. In order to control the on and off of the switching transistor PW, there are provided an OR gate 340 for receiving a word driver group selection signal /BS and a reset signal /PR brought to a low level indicative of an active state for a predetermined period on power-up, and a level converting circuit 342 for converting a high level of an output signal of the OR gate 340 into high voltage Vpp level. A signal outputted from the level converting circuit 342 is supplied to the gate of the switching transistor PW. The OR gate 340 operates with power source voltage Vcc as one operating source voltage and ground voltage VSS as the other operating source voltage. The operation of the sixteenth embodiment will now be described with reference to FIG. 36 which is a operation waveform chart.

The power source voltage Vcc gradually increases when the power is turned on. At this time, the switching transistor PW is in an off state (because a gate-to-source voltage difference is small) and the sub Vpp line 330 is charged from the main Vpp line 320 through the resistive element R. A voltage on the main Vpp line 320 is first raised at speed substantially identical to that of the increasing of the source voltage Vcc. When the voltage on the main Vpp line 320 reaches a predetermined voltage level or greater, a Vpp generating circuit operates to increase the high voltage Vpp level at high speed. When the source voltage Vcc reaches a predetermined voltage level at this time, a power-on detection signal POR is raised to a high level (source voltage Vcc level) to enable the operation of each circuit. The power-on detection signal POR is normally used to prevent circuits in a semiconductor integrated circuit device from malfunctioning before the power source voltage reaches a predetermined voltage level.

When the power-on detection signal POR is raised to the high level, the reset signal /PR is brought to the low level for a predetermined period. During this period, the group selection signal /BS is low in level (the group selection signal /BS is brought to a high level during a standby cycle after a predetermined time has elapsed since the power-on detection signal POR was raised to the high level (indicated by the broken line in FIG. 36)). Thus, the output signal of the gate circuit 340 is maintained at a low level for a predetermined period when the power-on detection signal POR rises, and the output signal of the level converting circuit 342 is also similarly brought to a low level, thereby bringing the switching transistor PW into an on state. As a result, the main Vpp line 320 and the sub Vpp line 330 are electrically connected to each other and the sub Vpp line 330 is supplied with a current from the main Vpp line 320 through the switching transistor PW so that the potential on the sub Vpp line 330 is raised at quick speed.

When a predetermined period has elapsed, the reset signal /PR is brought to a high level so that the output signal of the level converting circuit 342 is set to the high voltage Vpp level. As a result, the switching transistor PW is brought into the off state. Since the sub Vpp line 330 is supplied with the current from the main Vpp line 320 through the resistive element R after the output signal of the level converting circuit 342 has been brought to a sufficient voltage level, the voltage level on the sub Vpp line can be raised to the high voltage Vpp level more quickly as compared with a structure in which the reset signal /PR is not used as in the conventional example shown in FIG. 36. Correspondingly, the word driver group selection signal /BS can be set to the low level indicative of the active state at an earlier timing after the power has been turned on. In other words, a word line selecting operation can be performed in an advanced timing, and that an operating margin on memory operation immediately after the power-on is impaired owing to the provision of the resistive element R can be avoided.

Figure 37:
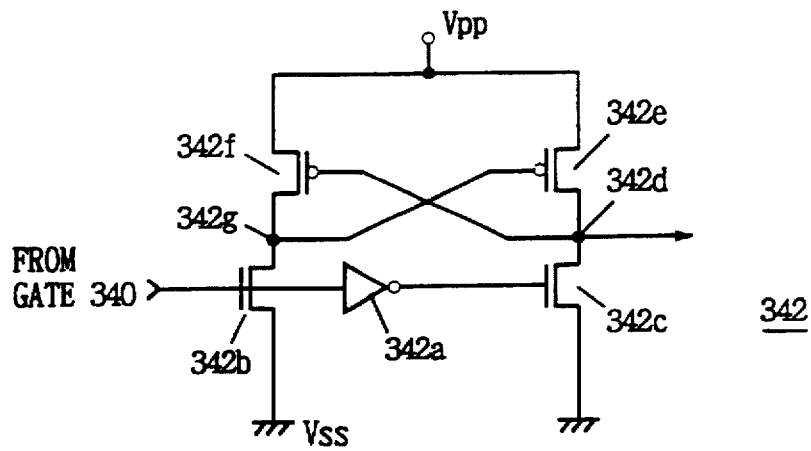
FIG. 37 is a diagram showing one example of a configuration of a level converting circuit shown in FIG. 35.

FIG. 37 is a diagram showing one example of a configuration of the level converting circuit shown in FIG. 35. In FIG. 37, level converting circuit 342 includes an inverter 342a for inverting a signal outputted from a gate 340, an n channel MOS transistor 342b for discharging a potential at an internal node 342g to ground potential Vss level in response to the output signal of the gate 340, an n channel MOS transistor 342c for discharging a potential at an output node 342d to the ground potential Vss level in response to an output signal from the inverter 342a, a p channel MOS transistor 342e connected between a high voltage Vpp supply node and the output node 342d and having a gate supplied with a voltage on the internal node 342g, and a p channel MOS transistor 342f connected between the high voltage Vpp supply node and the internal node 342g and having a gate supplied with a voltage at the output node 342d. The inverter 342a operates with source voltage Vcc and ground voltage Vss as one operating source voltage and the other operating source voltage respectively. The operation of the level converting circuit will now be described in brief.

When the output signal of the gate 340 is at a low level, the output signal of the inverter 342a is brought to a high level so that the n channel MOS transistor 342c is turned on. As a result, the potential at the output node 342d is discharged toward the ground potential level. As the potential at the output node 342d decreases, an on-resistance of the p channel MOS transistor 342f is reduced, so that the internal node 342g is supplied with a current from the high voltage Vpp supply node to have the potential increased. With an increase in the potential at the internal node 342g, an on-resistance of the p channel MOS transistor 342e is made high, so that the amount of supply of a current from the high voltage Vpp supply node to the output node 342d is reduced.

Finally, the potential at the output node 342d is discharged down the ground potential level by the n channel MOS transistor 342c. In this condition, the p channel MOS transistor 342f is brought into an on state to supply the high voltage Vpp to the internal node 342g, so that the p channel MOS transistor 342e is turned off. Thus, when the output signal of the gate 340 is at the low level, a low signal level is outputted to the output node 342d.

On the other hand, when the output signal of the gate 340 is at a high level, the output signal of the inverter 342a is brought to a low level, so that the n channel MOS transistor 342b is turned on and the n channel MOS transistor 342c is turned off. The potential at the internal node 342g is discharged and reduced by the n channel MOS transistor 342b, and the on-resistance of the p channel MOS transistor 342e is reduced correspondingly. Thus, the level of the voltage at the output node 342d is raised. With a rise in the voltage at the output node 342d, the on-resistance of the p channel MOS transistor 342f is raised to reduce the current supplied from the high voltage Vpp supply node to the internal node 342g. Finally, the potential at the internal node 342g is discharged up to the ground voltage Vss level by the n channel MOS transistor 342b. Since the p channel MOS transistor 342e and the n channel MOS transistor 342c are respectively turned on and off in this condition, the output node 342d is supplied with the high voltage Vpp through the p channel MOS transistor 342e. Namely, when the output signal of the gate 340 is at the high level indicative of the source voltage Vcc level, a high level signal having the high voltage Vpp level is outputted from the output node 342d.

Figure 38:
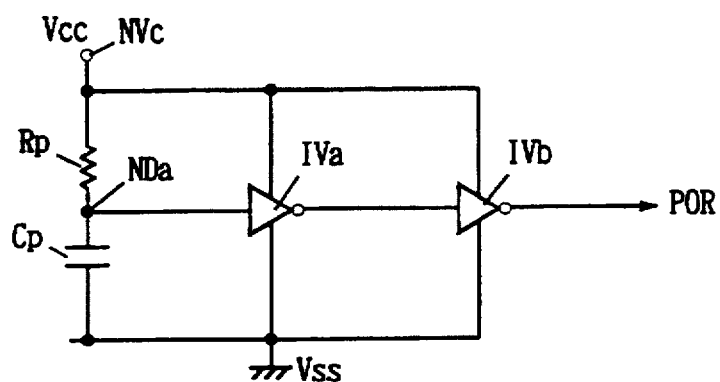
FIG. 38 is a diagram illustrating one example of a circuit configuration for generating a power-on detection signal employed in the structure shown in FIG. 35.

FIG. 38 is a diagram showing a configuration of a circuit for generating the power-on detection signal POR. In FIG. 38, the power-on detecting circuit includes a resistive element Rp connected between a power source node NVc and an internal node NDa, a capacitor Cp connected between the internal node NDa and a ground node Vss, an inverter IVa operating with source voltage Vcc and ground voltage Vss both as operating source voltages to invert and output the logic of a voltage on the internal node NDa, and an inverter Ivb operating with the voltage Vcc on the source node NVC and the ground voltage Vss both as the operating source voltages to invert an output signal of the inverter IVa. The operation of the power-on detecting circuit will now be described in brief with reference to FIG. 38 together with the operation waveform chart shown in FIG. 36.

Upon power-on, the voltage level on the source node NVc gradually increases. With an increase in voltage on the source node NVc, the voltage level at the internal node NDa is gradually raised in accordance with a time constant determined based on the resistance value of the resistive element Rp and the capacitance of the capacitor Cp. The inverter IVa determines that a signal inputted thereto is at a low level until the voltage level on the internal node NDa reaches a predetermined voltage level, and outputs a high level signal therefrom. Correspondingly, a signal POR outputted from the inverter IVb is rendered low in level. When the voltage level at the internal node NDa reaches the predetermined voltage level or higher, the inverter IVa determines that the signal inputted thereto is at a high level and outputs a low level signal therefrom. Correspondingly, signal POR outputted from the inverter IVb is raised to a high level. Namely, when a predetermined period has elapsed after the source voltage Vcc has been applied to the source node NVc, the power-on detection signal POR is raised to a high level.

Figure 39:
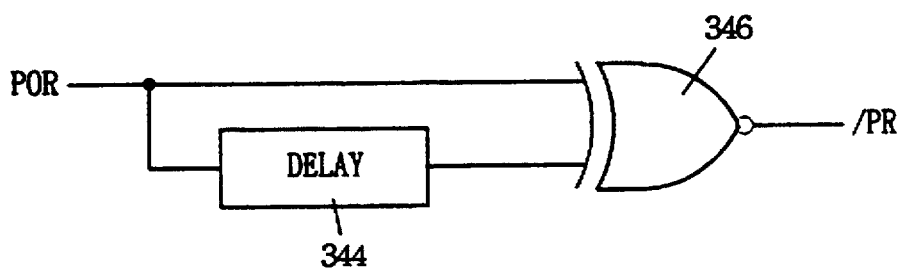
FIG. 39 is a diagram depicting a circuit configuration for generating a reset signal shown in FIG. 35.

FIG. 39 is a diagram showing a configuration of a reset signal generating circuit. In FIG. 39, the reset signal generating circuit includes a delay circuit 344 for delaying a power-on detection signal POR by a predetermined time, and a two-input EXNOR gate 346 for receiving the power-on detection signal POR and a signal outputted from the delay circuit 344. When the signals supplied to both inputs of the two-input EXNOR gate 346 do not coincide in logic with each other, the two-input EXNOR gate 346 outputs a low level signal therefrom. On the other hand, when both the received signals coincide in logic with each other, the two-input EXNOR gate 346 outputs a high level signal therefrom. Thus, as is apparent from the signal waveform chart shown in FIG. 36, reset signal /PR outputted from the two-input EXNOR gate 346 is low in level during a period from the time when the power-on detection signal POR is raised to a high level to the time when the output signal of the delay circuit 344 is raised to a high level. Since the two-input EXNOR gate 346 receives the high level signals at both inputs thereof when the output signal of the delay circuit 344 goes to the high level, the reset signal /PR is brought to a high level.

According to the sixteenth embodiment of the present invention, as described above, since the main Vpp line and the sub Vpp line are forcibly electrically connected to each other for the predetermined period after the power-on, the voltage on the sub Vpp line can be raised at high speed after the power-on and the operating margin subsequent to the power-on can be prevented from reduction.

Seventeenth Embodiment

Figure 40:
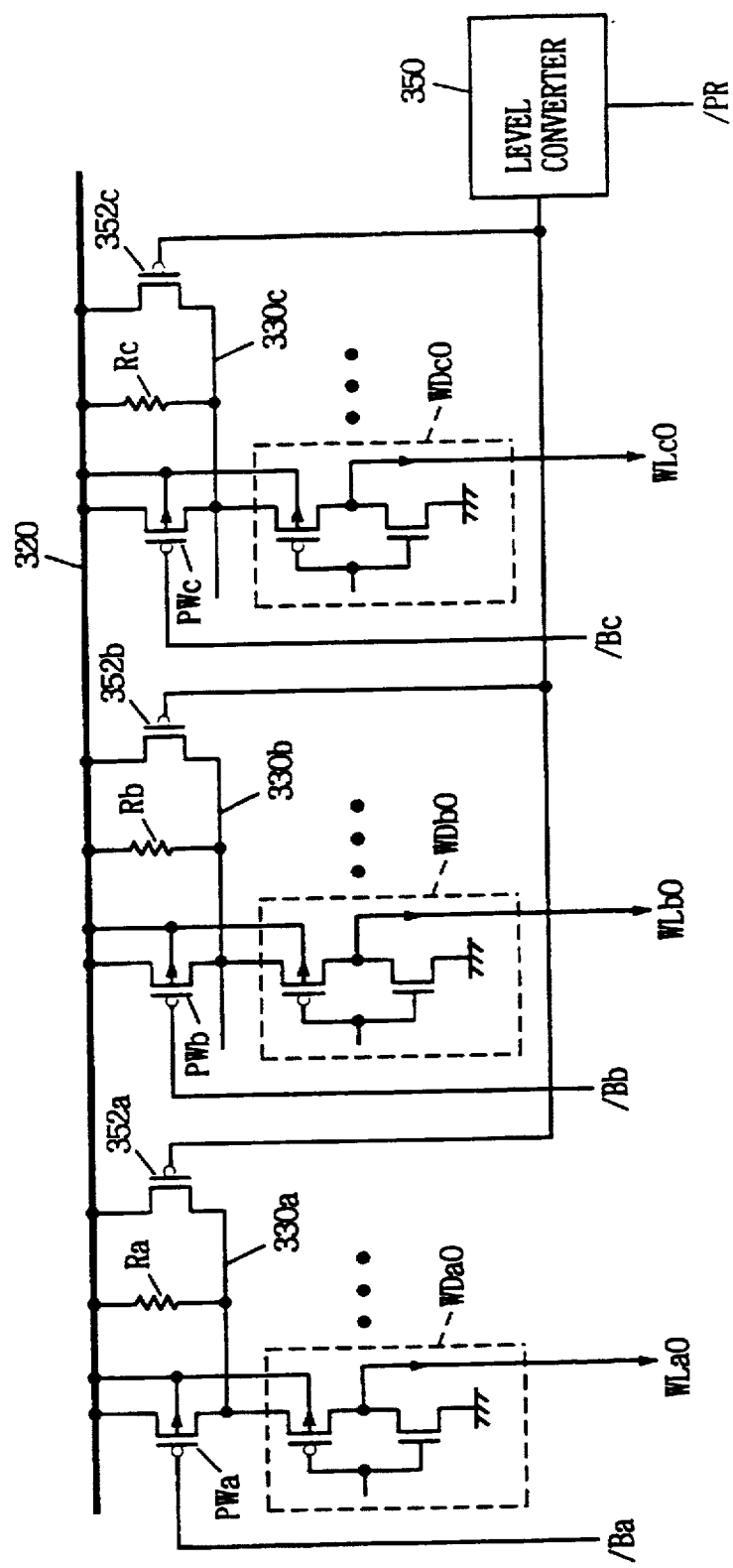
FIG. 40 is a diagram schematically showing the structure of a principal part of a semiconductor memory device according to a seventeenth embodiment of the present invention.

FIG. 40 is a diagram showing the structure of a seventeenth embodiment of the present invention. In FIG. 40, a plurality of sub Vpp lines 330a, 330b and 330c (three in FIG. 40) are provided to main Vpp line 320. Groups of word drivers are respectively connected to the sub Vpp lines 330a through 330c. Word drivers WDa, WDb and WDc respectively supplied with one operating source voltages from the sub Vpp lines 330a, 330b and 330c are shown in FIG. 40 as representatives.

Resistive elements Ra, Rb and Rc and switching transistors PWa, PWb and PWc are respectively provided in pair between the sub Vpp lines 330a through 330c and the main Vpp line 320 in a manner similar to the structure of the fourteenth embodiment shown in FIG. 33. The switching transistors PWa, PWb and PWc are made conductive in response to word driver group selection signals /Ba, /Bb and /Bc respectively.

Further, in the structure shown in FIG. 40, p channel MOS transistors 352a, 352b and 352c rendered conductive in response to reset signal /PR are respectively provided between the sub Vpp lines 330a through 330c and the main Vpp line 320. A level converting circuit 350 converts and supplies high level of the reset signal /PR to high voltage Vpp level and to each of the transistors 352a through 352c.

The reset signal /PR is outputted from a reset signal generating circuit similar to that having the configuration shown in FIG. 39. Upon power-on, the reset signal /PR is brought to a low level indicative of an active state for a predetermined period since power-on detection signal POR has been raised to a high level. When power source voltage Vcc reaches a predetermined voltage level or higher and is brought into a stable state after the power-on, the signal outputted from the level converting circuit 350 is rendered low in level, so that the transistors 352a through 352c are turned on. Thus, the sub Vpp lines 330a through 330c are electrically connected to the main Vpp line 320, so that voltages on the sub Vpp lines 330a through 330c are raised at the same speed as that of increasing of a voltage on the main Vpp line 320. As a result, the time required to stabilize the potentials on the sub Vpp lines 330a through 330c subsequent to the power-on can be shortened and an operating margin subsequent to the power-on can be prevented from reduction.

In the structure shown in FIG. 40, the level converting circuit 350 simply level-converts the reset signal /PR and supplies the result of conversion to each of the gates of the p channel MOS transistors 352a through 352c. It is thus unnecessary to provide gate circuits each supplied with the word driver group selection signal and the reset signal corresponding to the respective sub Vpp lines. It is also unnecessary to provide the level converting circuit for the respective word driver groups. As a result, the semiconductor memory device can be reduced in size.

According to the seventeenth embodiment of the present invention, as described above, since the transistors for electrically connecting the main Vpp line and the sub Vpp lines for the predetermined period after the power-on are provided corresponding to the sub Vpp lines, it is possible to allow the voltages on the sub Vpp lines to reach the predetermined voltage level at high speed after the power-on even when the sub Vpp lines and the main Vpp line are electrically connected to each other through the resistive elements having the high resistances. Further, since the output signal of the level converting circuit 350 is commonly supplied to the gates of the switching transistors respectively provided to the sub Vpp lines, the scale of a control system can be reduced.

Eighteenth Embodiment

Figure 41:
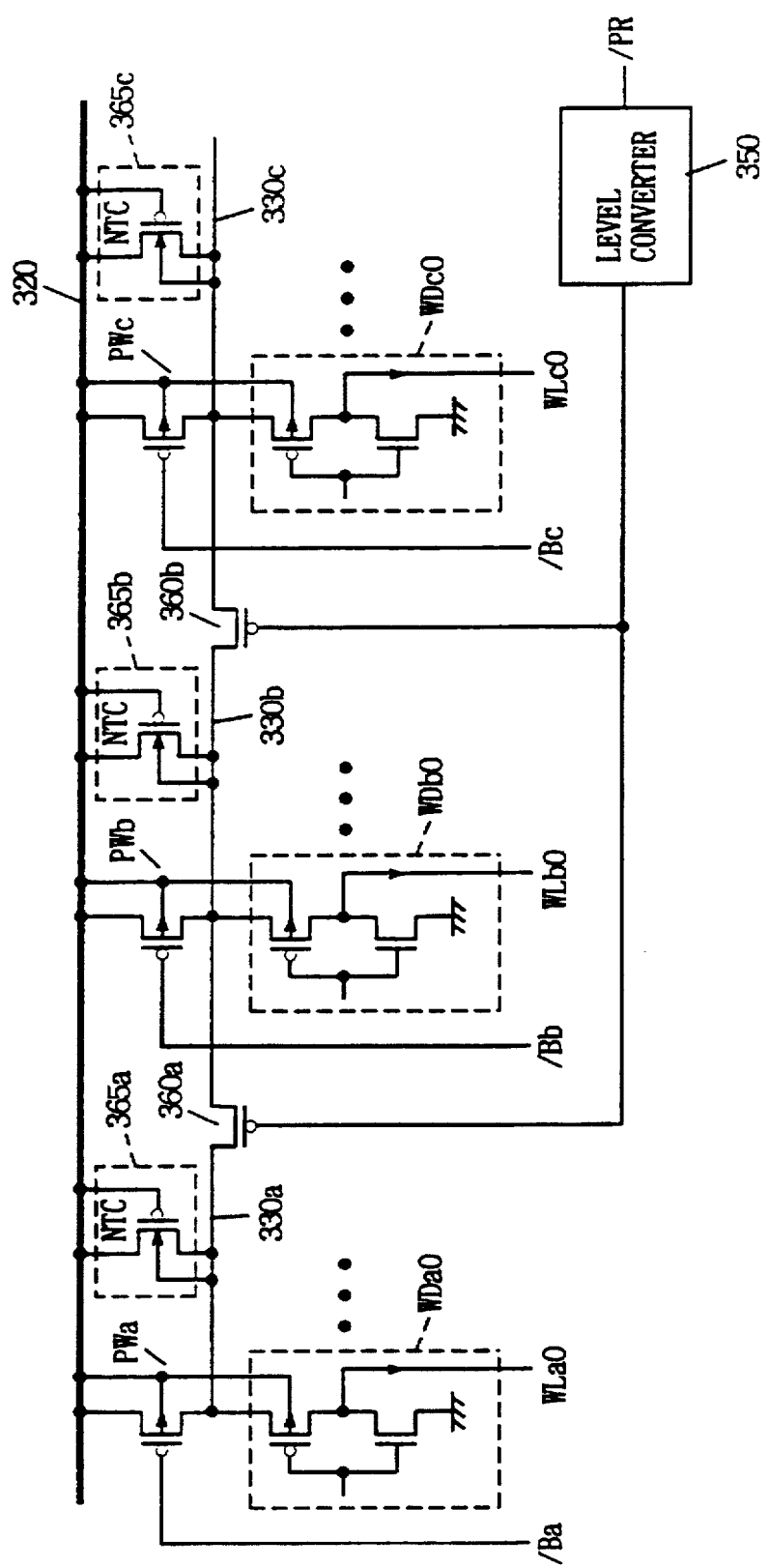
FIG. 41 is a diagram schematically illustrating the structure of a principal part of a semiconductor memory device according to an eighteenth embodiment of the present invention.
Figure 42:
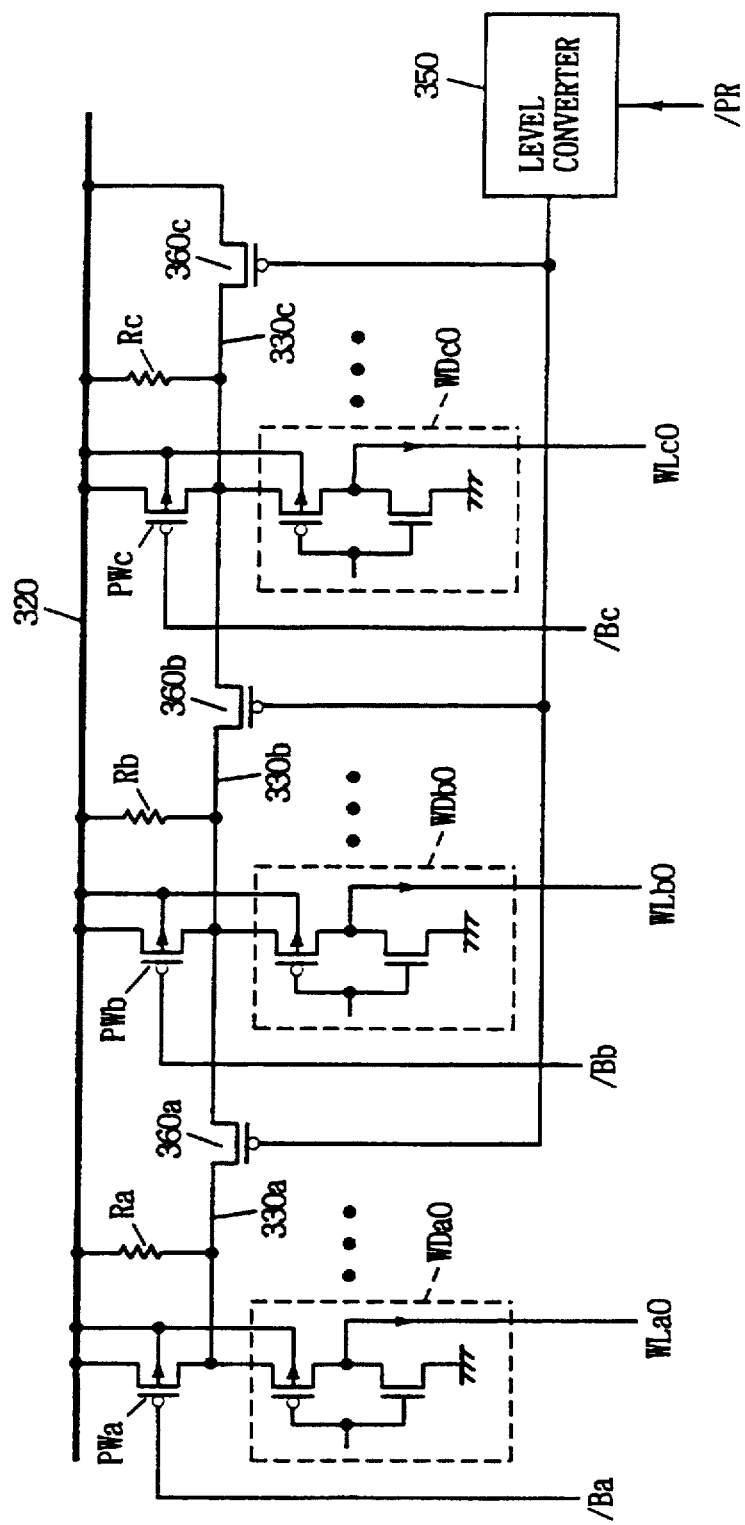
FIG. 42 is a diagram schematically depicting the structure of a principal part of a semiconductor memory device according to a nineteenth embodiment of the present invention.

FIG. 41 is a diagram showing the structure of an eighteenth embodiment of the present invention. In FIG. 42, a plurality of sub Vpp lines 330a, 330b and 330c are provided to a main Vpp line 320. Switching transistors PWa, PWb and PWc made conductive in response to group selection signals /Ba, /Bb and /Bc respectively, are respectively provided between the sub Vpp lines 330a, 330b, 330c and the main Vpp line 320.

Further, current regulating elements 365a, 365b and 365c are respectively provided between the main Vpp line 320 and the sub Vpp lines 330a, 330b and 330c. Each of the current regulating elements 365a through 365c includes an n channel MOS transistor NTC whose one conduction terminal and gate are connected to the main Vpp line 320 and whose other conduction terminal and substrate region are connected to their corresponding sub Vpp line 330 (each of the sub Vpp lines 330a through 330c). The current regulating elements 365a through 365c may be of depletion type MOS transistors or of the short channel MOS transistors as shown in FIG. 25. Alternatively, the current regulating elements 365a through 365c may be simply of resistance-coupled enhancement MOS transistors.

In the structure shown in FIG. 41, a switching transistor 360a comprised of a p channel MOS transistor is provided between the sub Vpp lines 330a and 330b. Further, a p channel MOS transistor 360b is provided between the sub Vpp lines 330b and 330c. A signal outputted from level converting circuit 350 for converting a voltage level corresponding to a high level of a reset signal /PR to high voltage Vpp level, is supplied to the gates of the transistors 360a and 360b. The level converting circuit 350 is identical in structure to that shown in FIG. 37. The reset signal /PR is generated from the reset signal generating circuit shown in FIG. 39.

In the structure shown in FIG. 41, the output signal of the level converting circuit 350 is brought to a low level for a predetermined period after the power-on, so that the transistors 360a and 360b are turned on, thereby electrically connecting the sub Vpp lines 330a, 330b and 330c to one another. Thus, speeds for increasing voltage levels on the sub Vpp lines 330a through 330c are made identical to one another after the power-on. Even when the sub Vpp lines 330a through 330c are different in load capacitance from each other, the voltages on the sub Vpp lines 330a through 330c can be raised substantially at the same speed after the power-on. Thus, the times in which the sub Vpp lines 330a through 330c reach a predetermined voltage level, can be made substantially identical to each other. It is thus unnecessary to take into consideration a margin of the time for settlement of the voltage on each sub Vpp line. Hence, a word line selecting operation can be performed at an earlier timing after the power-on.

According to the eighteenth embodiment of the present invention, as described above, since each of the current regulating transistor elements is provided between the main Vpp line and each sub Vpp line and the sub Vpp lines are mutually connected to one another for the predetermined period after the power-on, each of the voltages on the sub Vpp lines can be raised at the same speed and at quick speed after the power-on, thereby making it possible to prevent the operating margin subsequent to the power-on from deterioration.

In the structure shown in FIG. 41, the n channel MOS transistors are used as the current regulating transistor elements. However, even if p channel MOS transistors are used, the same effect can be obtained. Further, n channel MOS transistors may be used as the transistors for providing electrical interconnection of the sub Vpp lines.

Nineteenth Embodiment

FIG. 42 is a diagram illustrating the structure of a nineteenth embodiment of the present invention. In the case of FIG. 42, a plurality of sub Vpp lines 330a, 330b and 330c are provided (In FIG. 42, there are provided three sub Vpp lines). Word drivers are divided into groups, corresponding to the sub Vpp lines 330a through 330c. A single word driver in each group, i.e., respective word drivers WDa0, WDb0 and WDc0 are representatively shown in FIG. 42 in a manner similar to the aforementioned embodiments. A resistive element Ra having a high resistance and a switching transistor PWa rendered conductive in response to a word driver group selection signal /Ba are provided between the sub Vpp line 330a and the main Vpp line 320.

A resistive element Rb having a high resistance and a switching transistor PWb rendered conductive in response to a group selection signal /Bb are provided between the sub Vpp line 330b and the main Vpp line 320. A resistive element Rc having a high resistance and a switching transistor PWc rendered conductive in response to a group selection signal /Bc are provided between the sub Vpp line 330c and the main Vpp line 320. The nineteenth embodiment described heretofore is identical in structure to the fourteenth embodiment described above with reference to FIG. 33.

Further, in the structure of the nineteenth embodiment of the present invention, a switching transistor 360a comprised of a p channel MOS transistor is connected between the sub Vpp lines 330a and 330b. A switching transistor 360b comprised of a p channel MOS transistor is connected between the sub Vpp lines 330b and 330c. Furthermore, a switching transistor 360c comprised of a p channel MOS transistor is provided between the sub Vpp line 330c and the main Vpp line 320. A signal outputted from a level converting circuit 350 for converting a voltage level corresponding to a high level of reset signal /PR into high voltage Vpp level is supplied to the gates of the switching transistors 360a through 360c.

In the structure of the nineteenth embodiment, the switching transistors Pwa through PWc are turned off after the power is turned on. In this condition, the output signal of the level converting circuit 350 is brought to a low level in response to the reset signal /PR for a predetermined period, so that the switching transistors 360a through 360c are turned on. As a result, the sub Vpp lines 330a through 330c are mutually connected to each other and the sub Vpp lines 330a through 330c are supplied with a current from the main Vpp line 320. Therefore, even if the resistive elements Ra, Rb and Rb are provided, potentials on the sub Vpp lines 330a through 330c are raised at the same speed and at quick speed. Thus, even in the case of the structure in which the resistive elements Ra through Rc are respectively provided between the sub Vpp lines 330a through 330c and the main Vpp line 320, each of the voltage levels on the sub Vpp lines 330a through 330c can be raised to a predetermined voltage level at high speed after the power-on and an operating margin after the power-on can be prevented from deterioration.

In the structure shown in FIG. 42, the switching transistor 360c for electrically connecting the sub Vpp line and the main Vpp line to each other after the power-on is provided at a right end portion shown in FIG. 42. However, the switching transistor 360c may be located correspondingly to the sub Vpp line 330b provided at the central portion shown in FIG. 42. By centrally providing the switching transistor for electrically connecting the main Vpp line and its corresponding sub Vpp line to each other after the power-on, a propagation delay time of a current that flows from the main Vpp line to each sub Vpp line after the power-on can be reduced, thereby making it possible to raise the potential on each sub Vpp line at higher speed.

The level converting circuit 350 and the reset signal /PR are identical to those employed in the sixteenth embodiment referred to above.

According to the structure of the nineteenth embodiment of the present invention, as described above, since the sub Vpp lines are interconnected for the predetermined period after power-on and the sub Vpp lines are electrically connected to the main Vpp line for the predetermined period after the power-on in the structure in which the main Vpp line and the plurality of sub Vpp lines are electrically connected to one another through the resistive elements having the high resistances, the potentials on the sub Vpp lines can be raised at the same speed. Further, the potentials on the sub Vpp lines can be increased at high speed and hence a word line selecting operation can be performed at an advanced timing after the power-on.

Twentieth Embodiment

Figure 43:
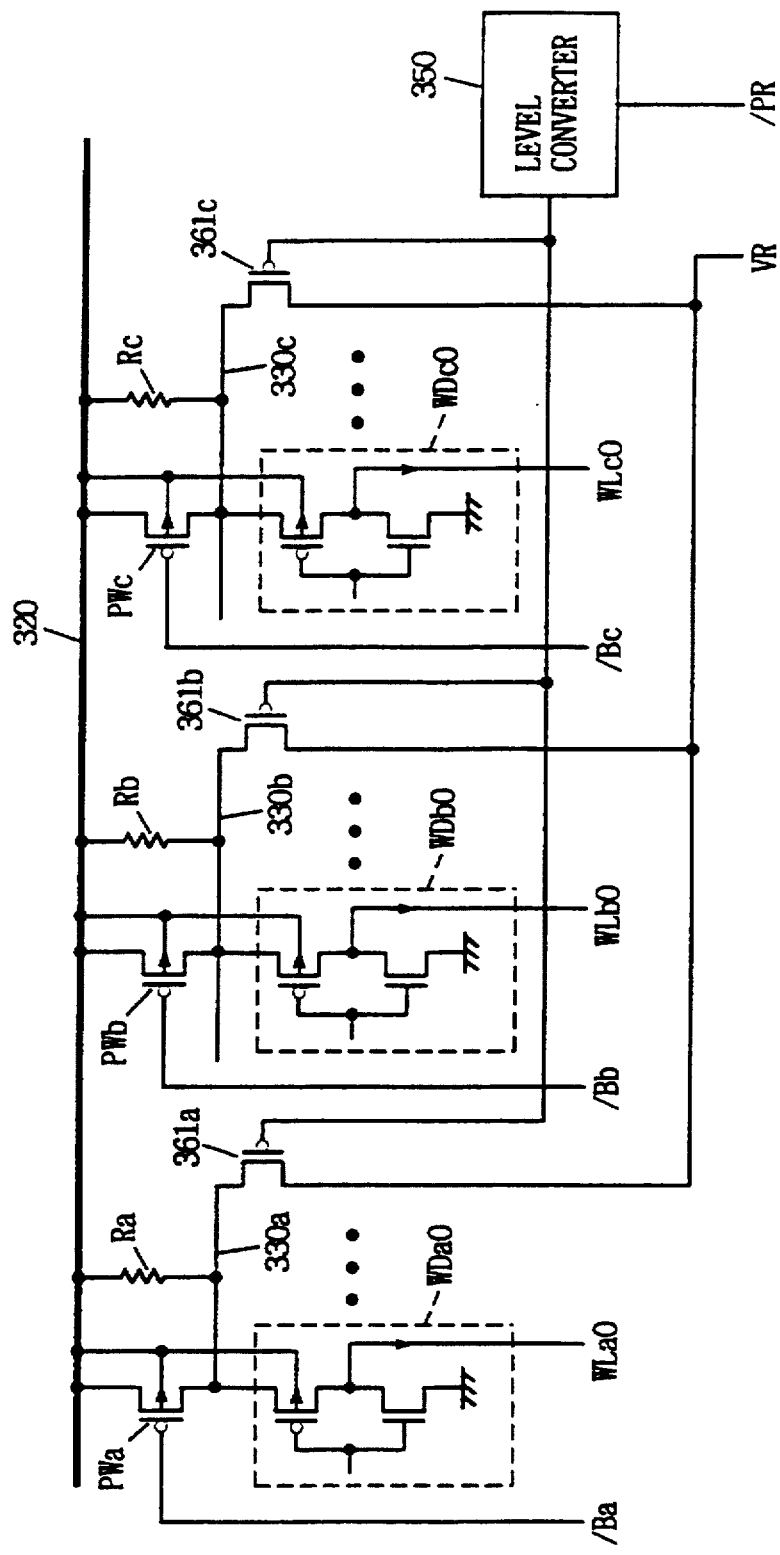
FIG. 43 is a diagram schematically showing the structure of a principal part of a semiconductor memory device according to a twentieth embodiment of the present invention.

FIG. 43 is a diagram showing the structure of a twentieth embodiment of the present invention. In the structure shown in FIG. 43, p channel MOS transistors 361a, 361b and 361c made conductive in response to an output from level converting circuit 350 converting a high level of reset signal /PR to high voltage Vpp level are provided corresponding to sub Vpp lines 330a, 330b and 330c. When the p channel MOS transistors 361a, 361b and 361c are turned on, they supply a predetermined voltage VR to the respective sub Vpp lines 330a, 330b and 330c. The voltage VR may be a voltage which changes in the same direction as voltage Vpp on main source line 320 upon power-on. For example, source voltage Vcc can be used as the voltage VR. Alternatively, an intermediate voltage (Vcc/2) normally employed in a semiconductor memory device may be used as the voltage VR.

Configurations provided to the sub Vpp lines 330a, 330b and 330c respectively are identical to those shown in FIG. 42. There are provided resistive elements R (Ra through Rc) having high resistances and switching transistors PW (PWa through PWc) respectively made conductive in response to group selection signals /B (/Ba through /Bc). Similarly, the sub Vpp lines 330 (330a through 330c) connect the word drivers in the corresponding groups.

Upon power-on, the switching transistors PWa through PWc are in an off state. When the source voltage Vcc reaches a predetermined voltage level after the power-on, the reset signal /PR is low in level for a predetermined period and correspondingly the output signal of the level converting circuit 350 is brought to a low level. As a result, the p channel MOS transistors 361a through 361c are brought into an on state. In this way, each of the sup Vpp lines 330a through 330c is supplied with the predetermined voltage VR to accelerate a rise in potential on each of the sub Vpp lines 330a through 330c. Since the predetermined voltage VR is supplied to the sub Vpp lines 330a through 330c through the p channel MOS transistors 361a through 361c even in the case of the structure in which the sub Vpp lines 330a through 330c are respectively electrically connected to the main Vpp line 320 through the resistive elements Ra upon power-on, the potentials on the sub Vpp lines 330a through 330c can be raised quickly. Correspondingly, the timing of the reach of the potentials on the sub Vpp lines to a predetermined voltage level at the time of the power-on can be made faster, thereby making it possible to prevent an operating margin at the time of the power-on from deterioration.

According to the twentieth embodiment of the present invention, as described above, since the predetermined voltage is supplied to the sub Vpp lines electrically connected to the main Vpp line through the resistive elements for the predetermined period after the power-on, the potentials on the sub Vpp lines at the time of the power-on can be quickly raised and hence the timing of determination of the potential on each sub Vpp line can be made faster.

Although the switching transistors 361a through 361c are provided at one ends of their corresponding sub Vpp lines 330a through 330c, they may be placed in the central positions of the corresponding sub source lines.

Twenty-First Embodiment

Figure 44:
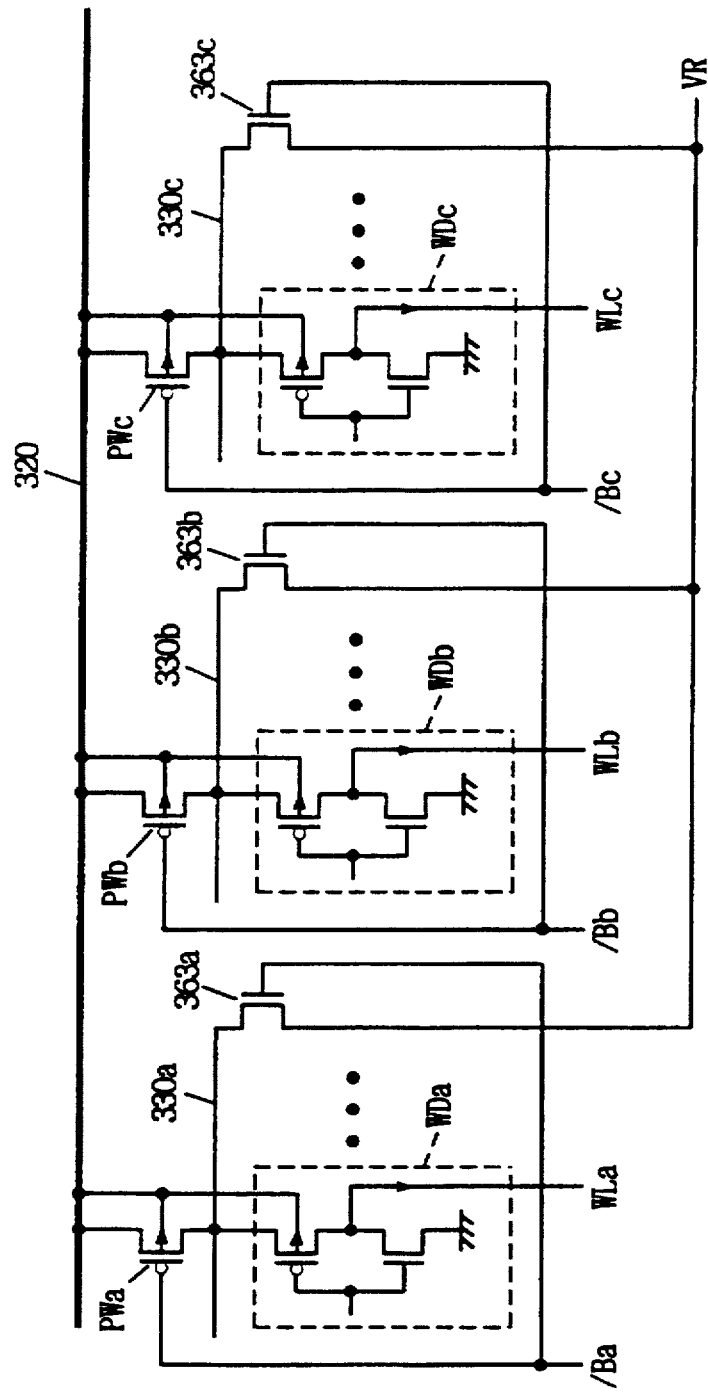
FIG. 44 is a diagram schematically illustrating the structure of a principal part of a semiconductor memory device according to a twenty-first embodiment of the present invention.

FIG. 44 is a diagram showing the structure of a twenty-first embodiment of the present invention. In the structure shown in FIG. 44, switching transistors PWa, PWb and PWc made conductive upon activation of group selection signals /Ba, /Bb and /Bc are respectively provided for a plurality of sub Vpp lines 330a through 330c. Resistive elements and current regulating elements are not provided between main Vpp line 320 and the sub Vpp lines 330a through 330c.

Switching transistors 363a, 363b and 363c comprised of n channel MOS transistors, which are rendered conductive when the group selection signals /Ba, /Bb and /Bc are non-activated (high in level) to supply a predetermined voltage VR to the corresponding sub Vpp lines 330a, 330b and 330c, are provided respectively correspond to the sub Vpp lines 330a, 330b and 330c.

A plurality of word drivers are connected to the sub Vpp lines 330a, 330b and 330c. Word drivers WDa, WDb and WDc are representatively illustrated in FIG. 44 for the sub Vpp lines 330a, 330b and 330c. The word drivers WDa, WDb and WDc drive respective word lines WLa, WLb and WLc included in a memory cell array into high voltage Vpp level upon selection. Since the switching transistors PWa, PWb and PWc are disposed in the centers of their corresponding sub Vpp lines 330a, 330b and 330c reference, symbols appended to the word drivers have been changed in the present embodiment. The operation of the present embodiment will now be described in brief.

During a standby cycle, the group selection signals /Ba, /Bb and /Bc are at the high level indicative of the non-active state. In this condition, the switching transistors 363a, 363b and 363c are turned on so that the predetermined voltage VR is supplied to the sub Vpp lines 330a, 330b and 330c. On the other hand, the switching transistors PWa, PWb and PWc are in an off state. Thus, in this condition, the sub Vpp lines 330a, 330b and 330c are maintained at the voltage VR level even if a leakage current is produced. A voltage of source voltage Vcc level a voltage slightly higher than the source voltage may be used as the voltage VR. The group selection signals /Ba, /Bb and /Bc are maintained at high voltage Vpp level in the non-active state. Thus, the switching transistors 363a through 363c can supply a voltage of Vpp–Vth level to the corresponding sub Vpp lines. Here, Vth represents threshold voltages of the switching transistors 363a, 363b and 363c.

During an active cycle, any of the group selection signals /Ba through /Bc, which corresponds to a group including a selected word line, is brought to a low level indicative of an active state, so that the corresponding switching transistor PW (any of the switching transistors PWa through PWc) is turned on. Now assume that the group selection signal /Ba is at the low level indicative of the active state. In this condition, the switching transistor PWa is brought into the on state so that a current is supplied to the sub Vpp line 330a through the main Vpp line 320, raising the level of a voltage on the sub Vpp line 330a to the high voltage Vpp level. If, at this time, the predetermined voltage VR is of a sufficient high voltage level, then the voltage on the sub Vpp line 330a reaches the high voltage Vpp level at high speed. In the case of non-selected groups, the switching transistors PWb and PWc are in an off state and the sub Vpp lines 330b and 330c are maintained at the predetermined voltage VR level.

In the structure shown in FIG. 44, resistive elements having high resistances may be connected between the sub Vpp lines 330a through 330c and the main Vpp line respectively.

According to the twenty-first embodiment of the present invention, as described above, since the transistors for supplying the predetermined voltage to the corresponding sub Vpp liens upon non-activation of the corresponding group selection signals are respectively provided to the sub Vpp lines, the voltage on each sub Vpp line in non-selection thereof can be suppressed. Further, the voltage on each sub Vpp line at the time of the transition from the standby cycle to the active cycle can be recovered to the high voltage Vpp level at quick speed.

Twenty-Second Embodiment

Figure 45:
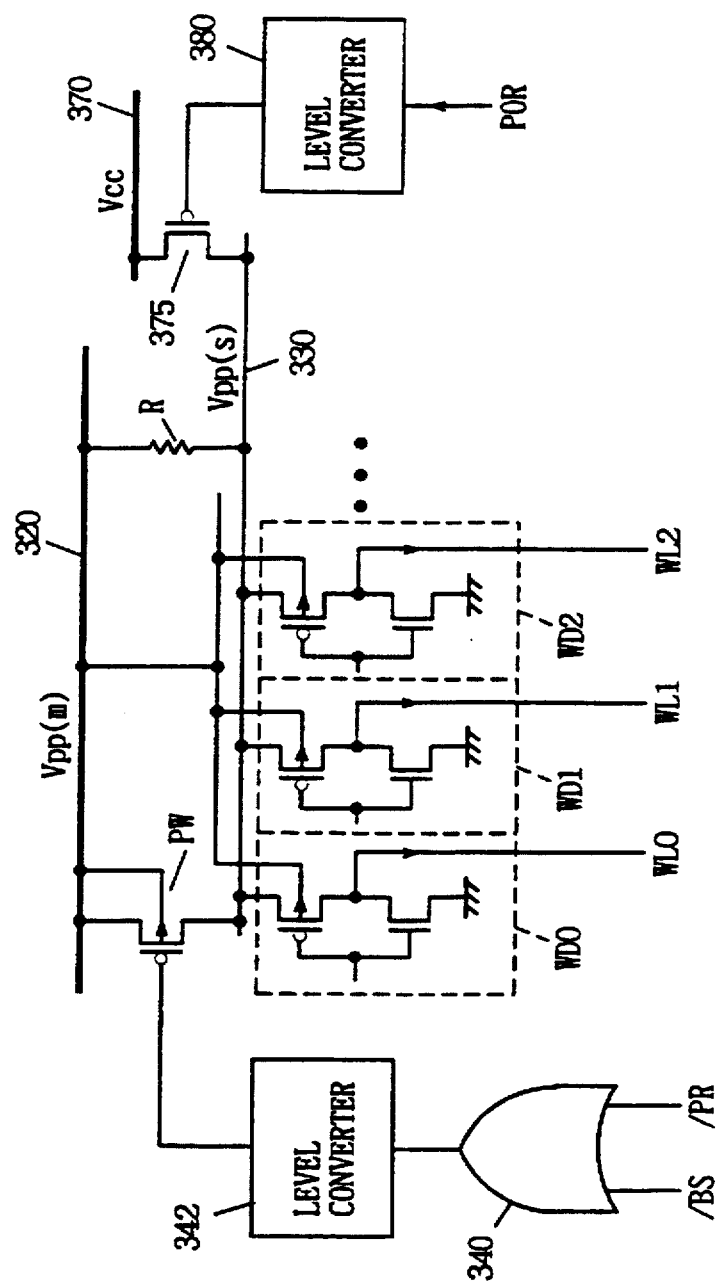
FIG. 45 is a diagram schematically showing the structure of a principal part of a semiconductor memory device according to a twenty-second embodiment of the present invention.
Figure 46:
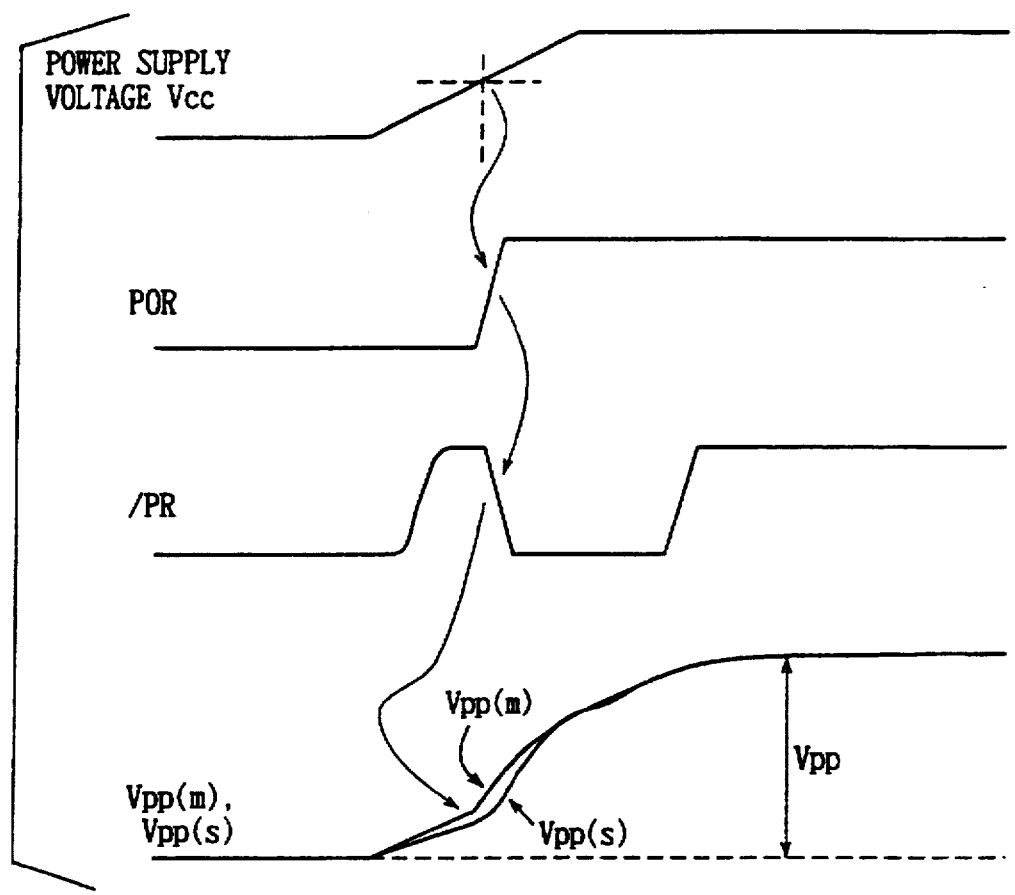
FIG. 46 is a signal waveform chart for describing the operation of the semiconductor memory device shown in FIG. 45.

FIG. 45 is a diagram showing the structure of a twenty-second embodiment of the present invention. In the structure shown in FIG. 45, a p channel MOS transistor 375 for electrically connecting a power source line 370 to a sub Vpp line 330 when made conductive is provided to the sub Vpp line 330, in addition to the structure of the sixteenth embodiment shown in FIG. 35. A signal outputted from level converting circuit 380 for converting a high level of power-on detection signal POR to high voltage Vpp level is supplied to the gate of the p channel MOS transistor 375. The present embodiment is identical in the other configurations to the sixteenth embodiment shown in FIG. 35. The configuration of the level converting circuit described above with reference to FIG. 37 can be used as the configuration of the level converting circuit 380. The operation of the twenty-second embodiment will now be described with reference to FIG. 46 which is a operation waveform chart.

When source voltage Vcc is applied, the level of a voltage on the source line 370 is raised. The power-on detection signal POR is low in level until the source voltage Vcc on the source line 370 reaches a predetermined voltage level. Thus, a signal outputted from the level converting circuit 380 is brought to a low level, so that the p channel MOS transistor 375 is turned on to electrically connect the source line 370 to the sub Vpp line 330. As a result, the potential on the sub Vpp line 330 is raised in accordance with a rise in the potential on the source line 370. With the rise in the level of the source voltage Vcc, rest signal /PR is brought to a high level. During this period, a signal outputted from level converting circuit 342 is at a high voltage Vpp level (Vpp(m) level), and a switching transistor PW is in an off state.

When the source voltage Vcc reaches the predetermined voltage level, the power-on detection signal POR is raised to a high level and the output signal of the level converting circuit 380 is also raised to the high voltage Vpp (m) level, so that the p channel MOS transistor 375 is turned off. At this time, the reset signal /PR is low in level for a predetermined period and hence the output signal of the level converting circuit 342 is brought to a low level.

As a result, the switching transistor PW is turned on to supply a current from a main Vpp line 320 to the sub Vpp line 330. Thus, a voltage Vpp(s) on the sub Vpp line 330 is raised in accordance with voltage Vpp(m) on the main Vpp line 320. When a predetermined period has elapsed, the switching transistor PW is turned off, and a current is supplied from the main Vpp line 320 to the sub Vpp line 330 through resistive element R. As a result, the potential on the sub Vpp line 330 is raised. Since the voltage on the sub Vpp line 330 is sufficiently high at this time, the voltage Vpp(s) on the sub Vpp line 330 can finally attain the potential Vpp level corresponding to the voltage Vpp(m) on the main Vpp line 320.

Namely, since a high voltage Vpp generating circuit is in an unstable operating state and the high voltage Vpp(m) varies in accordance with the source voltage Vcc until the source voltage Vcc reaches the predetermined voltage level, the current is supplied from the source line 370 to the sub Vpp line 330 through the p channel MOS transistor 375. When the source voltage Vcc reaches the predetermined voltage level or higher and the high voltage Vpp generating circuit stably operates to generate the high voltage Vpp(m) greater than the source voltage Vcc, the switching transistor PW is turned on to supply the current from the main Vpp line 320 to the sub Vpp line 330. As a result, the voltage on the sub Vpp line 330 can be raised to the predetermined high voltage Vpp level at high speed, thereby making it possible to reliably prevent the deterioration of an operating margin (margin with respect to operation start timing) at the time of the power-on, which deterioration is based on a high-resistance type resistive element provided between the sub Vpp line and the main Vpp line.

Twenty-Third Embodiment

Figure 47:
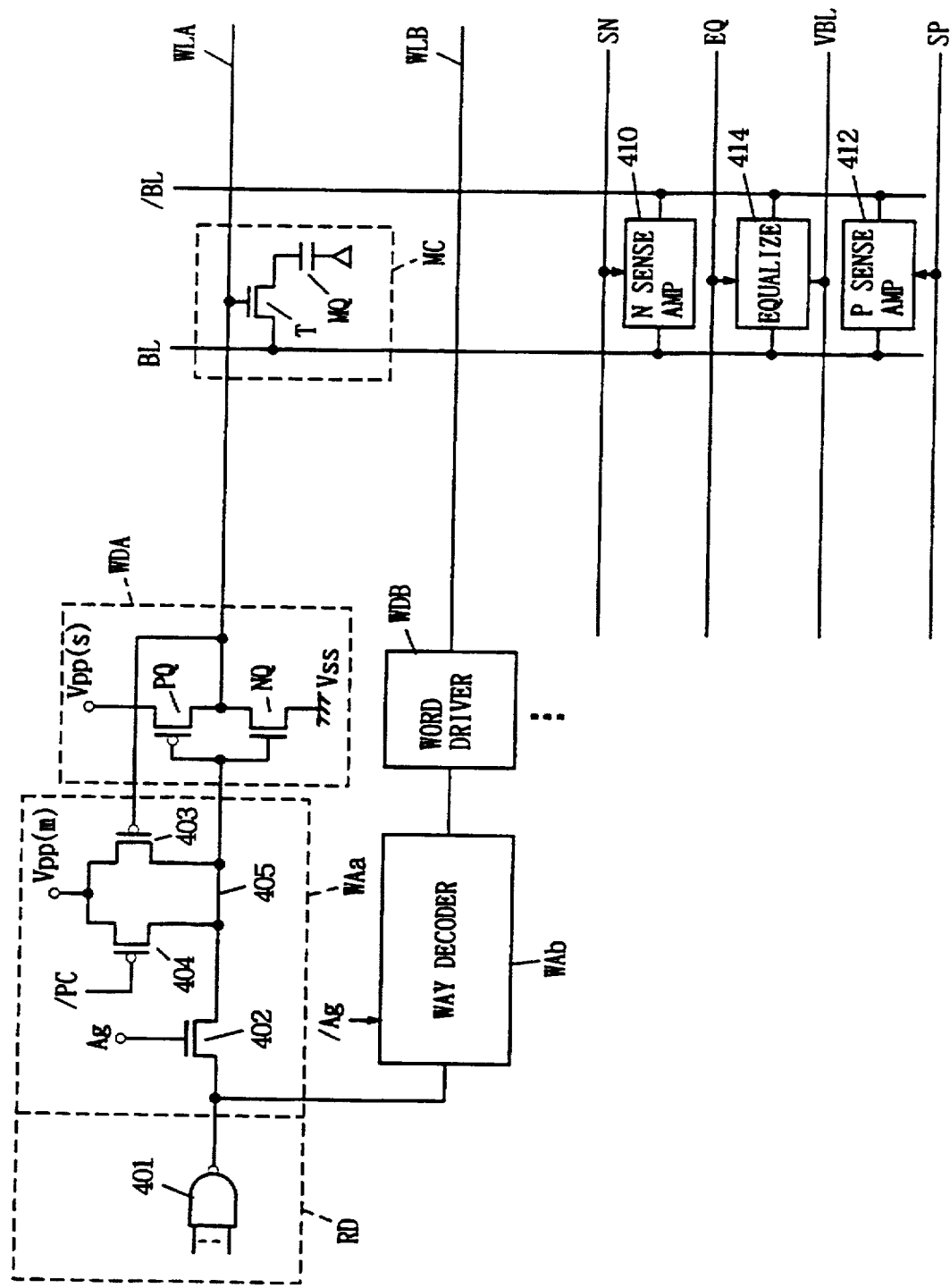
FIG. 47 is a diagram schematically showing the structure of a principal part of a semiconductor memory device according to a twenty-third embodiment of the present invention.

FIG. 47 is a diagram schematically showing the structure of a twenty-third embodiment of the present invention. Configurations of a row decode circuit and a word line driver circuit, which are provided corresponding to two word lines WLA and WLB, are shown in FIG. 47. In FIG. 47, a row decoder RD is provided commonly to the word lines WLA and WLB. The row decoder RD is comprised of a NAND gate. When received decode signals (row predecode signals) are all high in level, the row decoder RD outputs a low level signal indicative of a selected state. A single row decoder RD simultaneously selects two word lines.

In order to select one of the two word lines designated by the row decoder RD, a way decoder is provided to each word line. A way decoder WAa is provided for the word line WLA, whereas a way decoder WAb is provided corresponding to the word line WLB. The way decoder WAa includes an n channel MOS transistor 402 for allowing an output signal of the row decoder RD to pass through to internal node 405 in response to a way address signal Ag, a p channel MOS transistor 404 for supplying a high voltage Vpp(m) on a main Vpp line to the internal node 405 when a precharge signal /PC is activated (low in level), and a p channel MOS transistor 403 made conductive when a signal potential on the corresponding word line WLA is low in level to supply the high voltage Vpp(m) to the internal node 405. The precharge signal /PC is brought to the low level when the semiconductor memory device is in a standby state. The precharge signal /PC is brought into an active/inactive state in accordance with a row address strobe signal /RAS.

In a manner similar to the word drivers described in the aforementioned embodiments, the word driver WDA is operated with a voltage Vpp(s) on a sub Vpp line as one operating source voltage and a ground potential Vss as the other operating source voltage. In this condition, the word driver WDA supplies the ground voltage Vss or the high voltage Vpp(s) to the corresponding word line WLA in accordance with the voltage on the internal node 405. The word driver WDA includes a p channel MOS transistor PQ and an n channel MOS transistor NQ.

The way decoder WAb is identical in structure to the way decoder WAa. The way decoder WAb differs from the way decoder WAa in that a signal /Ag complementary to the way address signal Ag supplied to the way decoder WAa is supplied to the transistor 402 in the way decoder WAb as the way address signal. The word driver WDB is identical in structure to the word driver WDA. Thus, either one of the way decoders WAa and WAb is selected to turn on the transistor 402 therein.

A memory cell MC disposed corresponding to a crossing of a bit line BL and a word line WLA, is representatively illustrated in a memory cell array. Although its configuration will be described later in detail, an N sense amplifier 410 activated in response to a sense amplifier activation signal SN to discharge a low-potential bit line of bit lines BL and /BL to ground potential level, a P sense amplifier 412 activated in response to a sense amplifier activation signal SP to drive a high-potential bit line of the bit lines BL and /BL to source voltage Vcc level, and an equalize circuit 414 for equalizing and precharging the bit lines BL and /BL to a precharge voltage VBL (e.g., an intermediate potential Vcc/2) in response to an equalize signal EQ are provided between the bit lines BL and /BL. Operation of a row selection system circuit will now be described in brief.

During a standby cycle, the precharge signal /PC is at the low level indicative of the active state, and the p channel MOS transistor 404 is in an on state. Further, the internal node 405 is precharged to the high voltage Vpp(m) level. In this condition, the p channel MOS transistor PQ and the n channel MOS transistor NQ in each of the word drivers WDA and WDB are respectively brought into an off state and an on state. Thus, the word lines WLA and WLB are discharged to the ground potential level. At this time, the p channel MOS transistor PQ is operated in a sub-threshold current region. Since the high voltage Vpp(s) is applied from the sub Vpp line described above, a sub-threshold current that flows through the p channel MOS transistor PQ is sufficiently suppressed.

Further, the potential on the word line WLA is at the ground potential level and the p channel MOS transistor 403 is turned on to supply the high voltage Vpp(m) to the internal node 405 in the same manner as described above. During the standby cycle, the way address signals Ag and /Ag are both low in level, and a signal outputted from the NAND gate 401 is high in level. Since the n channel MOS transistor 402 is in an off state, the internal node 405 in each of the way decoders WAa and WAb is supplied with a current from the main Vpp line to be charged to the high voltage Vpp(m) level. Thus, a path along which the current flows into the ground potential level side, does not exit in the internal node 405. Even if a configuration of charging the internal node 405 directly from the main Vpp line is used, no current consumption is produced in that portion (because the source and drain of each of the p channel MOS transistors 404 and 403 become identical in voltage level to one another, and both transistors 404 and 403 are turned off). Thus, a drop in the voltage on the main Vpp line is not developed.

When the active cycle is started, the precharge /PC is first brought to a high level indicative of an inactive state so that the p channel MOS transistor 404 is turned off. When the row decoder RD is selected in accordance with an applied address signal, a signal outputted from the NAND gate 401 is brought to a low level. Thus, either one of the way decoders WAa and WAb is selected in response to the way address signals Ag and /Ag.

Now, assume that the way address signal Ag is at a high level (source voltage Vcc level). In this condition, the n channel MOS transistor 402 in the way decoder WAa is turned on so that the internal node 405 is discharged to the ground potential level. Thus, the p channel MOS transistor PQ in the word driver WDA is turned on so that the high voltage Vpp is supplied to the word line WLA from the corresponding sub Vpp line. As a result, the potential on the word line WLA is raised up to the high voltage Vpp level. With an increase in the potential on the word line WLA, the p channel MOS transistor 403 is turned off so that the internal node 405 is discharged to the ground potential level. Now, the way address signal Ag supplied to the gate of the n channel MOS transistor 402 is at the source voltage Vcc level and the high voltage Vpp is not supplied back to the output of the NAND gate 401. Thereafter, the sense amplifiers 410 and 412 are activated in response to the sense amplifier activation signals SN and SP so that the difference (developed according to data stored in each memory cell MC) in potential between the bit lines BL and /BL is amplified and latched. Afterwards, a data writing or reading is performed through an unillustrated path.

When the active cycle is completed, the precharge signal /PC is first brought to the low level indicative of the active state, and the internal node 405 is charged to the high voltage Vpp level to reduce the potential on the word line WLA. Thereafter, the sense amplifier activation signals SN and SP are rendered inactive. Next, the equalize signal EQ is brought into an active state so that the bit lines BL and /BL are equalized and precharged to the intermediate potential VBL.

By providing the single row decoder corresponding to the two word lines and decoding the output signal of the row decoder in response to the way address signals Ag and /Ag, the number of bits of an address signal to be predecoded can be reduced and the number of row decoders (or row predecoders) can be reduced, thereby making it possible to reduce the areas occupied by row address decoding circuitry. Further, a single row decoder RD is simply disposed for the two word lines. Even in the case of a high-density and high-integration device, each row decoder RD can be disposed with a sufficient margin.

Figure 48:
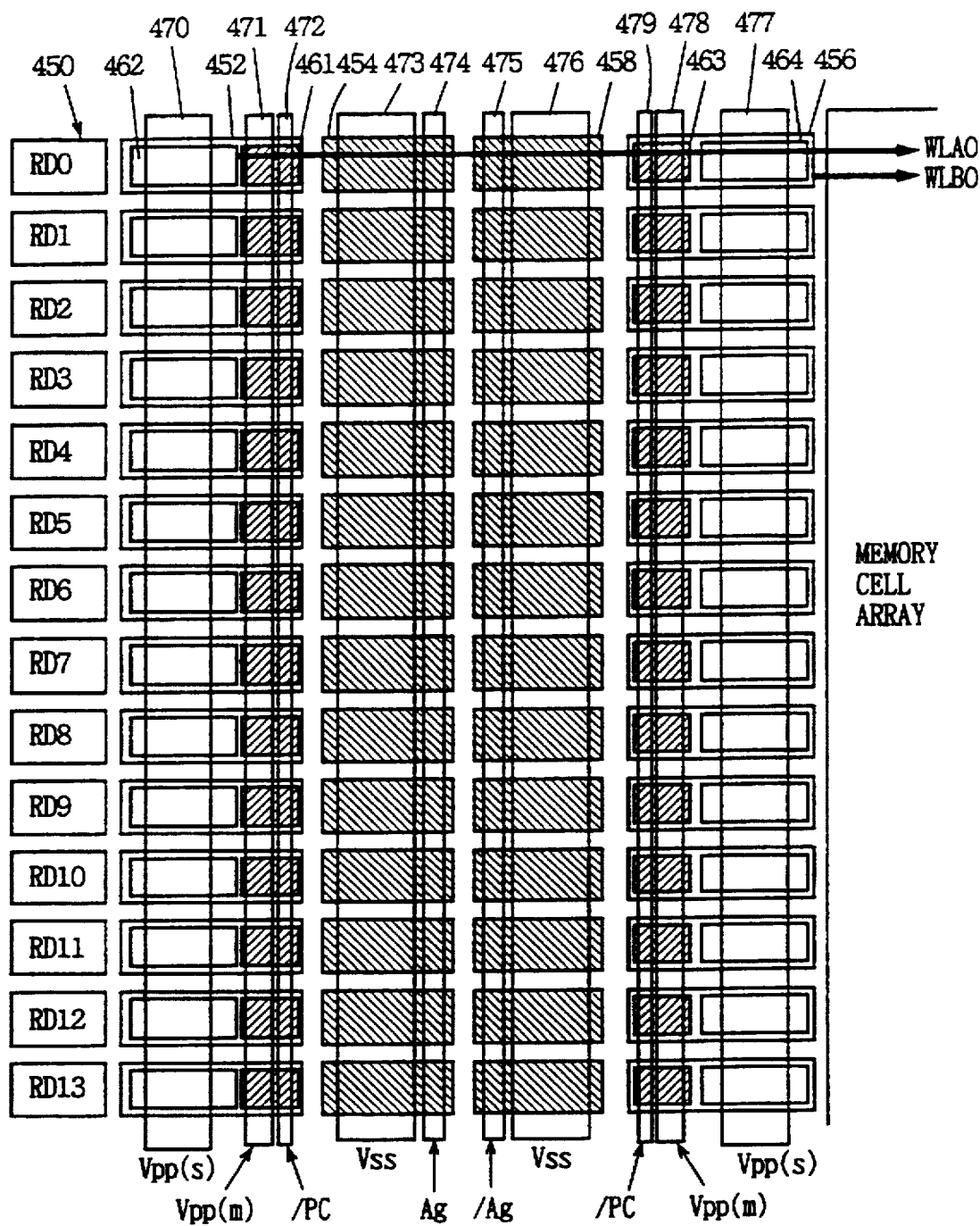
FIG. 48 is a view showing plan layouts of row decoders, way decoders and word drivers shown in FIG. 47.

FIG. 48 shows one example of layouts of word drivers, row decoders and way decoders. Layouts of components provided for fourteen row decoders, i.e., twenty-eight word lines are typically illustrated in FIG. 48.

In FIG. 48, row decoders RD0 through RD13 are provided corresponding to respective sets of two word lines, and are respectively disposed within row decoder forming regions 450 provided at left ends shown in FIG. 48. A region 452 for forming a first transistor bringing one of two word lines of a corresponding set into a selected state is disposed adjacent to a corresponding row decoder forming region 450. Further, a second transistor forming region 454 is disposed adjacent to the first transistor forming region 452. A charging transistor for charging a word line WLA to high voltage Vpp level when the word line WLA (only WLA0 is representatively shown in FIG. 48) is selected, and a transistor for charging an internal node to the high voltage Vpp level are formed in the first transistor forming region 452. Namely, only p channel MOS transistors are formed in the first transistor forming region 452. A decoding transistor for passing an output signal of a corresponding row decoder to the internal node and a transistor for discharging the corresponding word lien WLA to the ground potential level are formed in the second transistor forming region 454. Namely, only n channel MOS transistors are formed in the second transistor forming region 454.

Further, a third transistor forming region 456 and a fourth transistor forming region 458 for forming transistors bringing the other word line WLB0 of the two word lines WLA0 and WLB0 into a selected state are formed. The third transistor forming region 456 includes region 464 for forming a p channel MOS.transistor bringing a corresponding word line WLB into selected state (for supplying a high voltage Vpp) and a region 463 for forming a transistor precharging and equalizing the internal node. Namely, only p channel MOS transistor are disposed in the third transistor forming region 456. A transistor for discharging the word line WLB0 to the ground potential level and a transistor for decoding a way address signal, i.e., supplying the output signal of the corresponding row decoder to the internal node are formed in the fourth transistor forming region 458. Namely, n channel MOS transistors are formed in the fourth transistor forming region 458. The row decoder and the first through fourth transistor forming regions are arranged in a line along a row direction (i.e., along a word line extending direction).

A sub Vpp line 470, a main Vpp line 471 and a signal line 472 for transmitting a precharge signal /PC are disposed crossing over the first transistor forming region 452. The sub Vpp line 470 is disposed on the transistor forming region 462 in the first transistor forming region 452. The main Vpp line 471 and the precharge signal transmission signal line 472 are disposed crossing over the transistor forming region 461. Further, a ground line 473 for transmitting ground voltage Vss and an address signal line 474 for transmitting a way address signal Ag are disposed extending along a column direction to cross over the second transistor forming region 454.

A ground line 476 and a way address signal 475 are disposed crossing over the fourth transistor forming region 458 and extending along the column direction.

A precharge signal transmission line 479, a main Vpp line 478 and a sub Vpp line 477 are disposed extending along the column direction to cross over the third transistor forming region 456. The sub Vpp line 477 is disposed crossing the transistor forming region 464, whereas the main Vpp line 478 and the precharge signal transmission line 479 are disposed crossing over the transistor forming region 463.

These conductors 470, 471, 472, 473, 474, 475, 476, 477, 478 and 479 are all disposed in parallel with one another.

These conductor lines 470 through 479 are disposed symmetrically with a region defined between the second and fourth transistor forming regions 454 and 458. Laying out these conductor lines 470 through 479 is made easy owing to such a symmetrical arrangement. The transistor regions in the transistor forming regions are also disposed symmetrically about the region between the second and fourth transistor forming regions. Layout patterns are rendered regular owing to such a symmetrical arrangement and hence the transistors can be efficiently disposed. Since the regions 454 and 458 for forming the n channel MOS transistors are centrally disposed, it is unnecessary to provide a region between the regions 454 and 458 for separating the region for formation of the p channel MOS transistor and the region for the n channel MOS transistor from each other. Further, areas occupied by row selection system circuits can be reduced.

The main Vpp line 471 and the sub Vpp line 470 may be connected to each other by a switching transistor. Similarly, the main Vpp line 478 and the sub Vpp line 477 may be coupled to each other by a switching transistor. As will be described later, main Vpp line may be directly connected to an additionally-provided global Vpp line (an output node of a Vpp generating circuit) and then the sub Vpp line may be connected to the global Vpp line.

Figure 49:
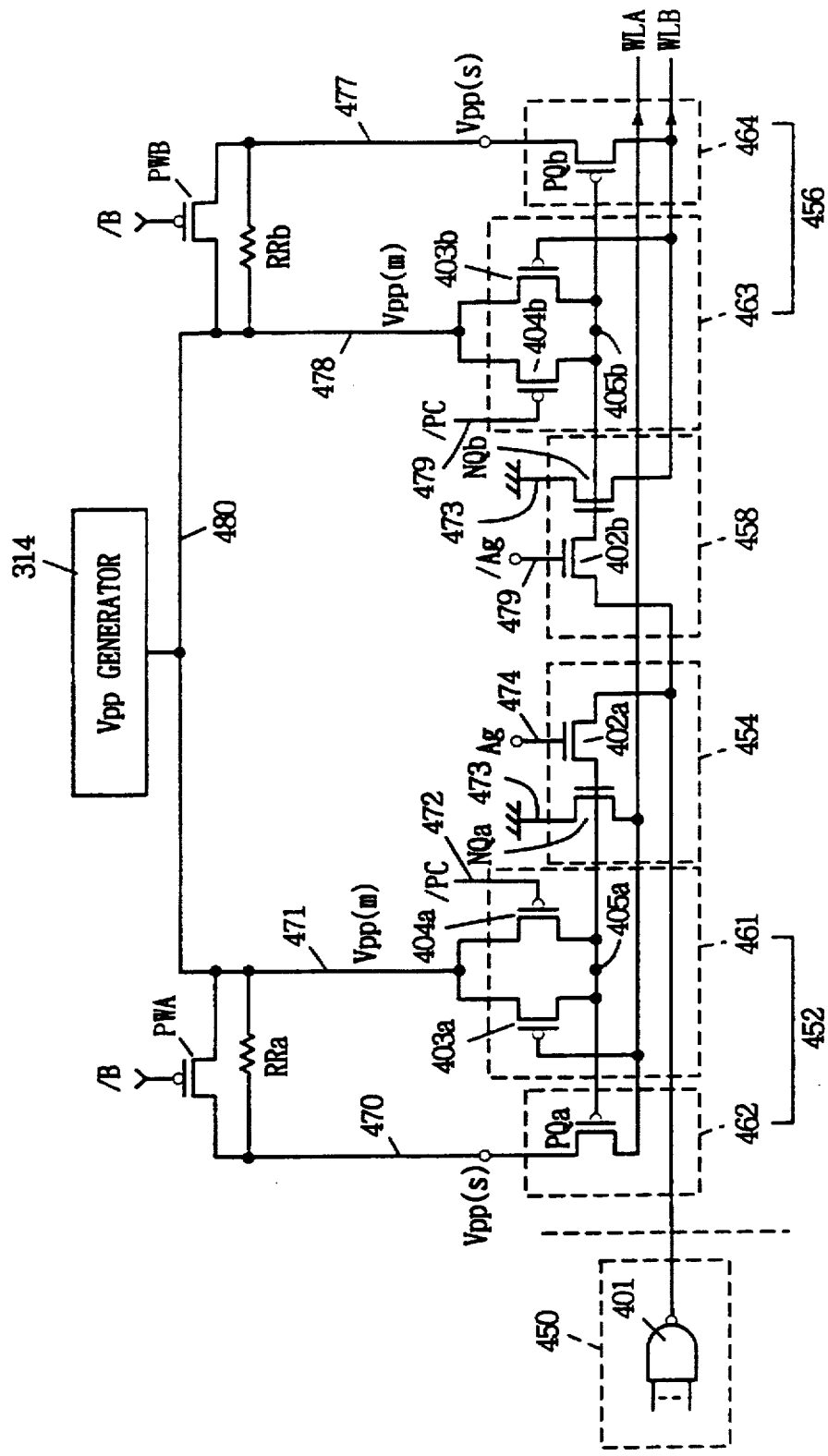
FIG. 49 is a diagram illustrating arrangements of transistors for the row decoders, the way decoders and the word drivers shown in FIG. 20, in the layouts shown in FIG. 48, and arrangements of main Vpp lines and sub Vpp lines in the layouts shown in FIG. 48.

FIG. 49 is a diagram showing an arrangement of circuit portions corresponding to two word lines in more details. In FIG. 49, a NAND gate 401 is formed in a transistor forming region 450. A p channel MOS transistor PQa rendered conductive in response to a signal potential on an internal node 405a is formed in transistor region 462 provided adjacent to the transistor forming region 450. The transistor PQa supplies a voltage Vpp(s) on sub Vpp line 470 to its corresponding word line WLA upon its conduction.

A p channel MOS transistor 404a rendered conductive in response to precharge signal /PC on signal line 472 to supply a voltage Vpp(m) on main Vpp line 471 to the internal node 405a, and a p channel MOS transistor 403a rendered conductive in response to a signal potential on the word line WLA to supply the voltage Vpp(m) on the main Vpp line 471 to the internal node 405a are formed in transistor region 461. The transistor regions 461 and 462 constitute the first transistor forming region 452.

An n channel MOS transistor 402a for transmitting a signal outputted from a row decoder (NAND gate 401) to the internal node 405a in response to way address signal Ag supplied onto signal line 474 and an n channel MOS transistor NQa for supplying ground voltage Vss on ground line 473 to the word line WLA in response to the signal potential on the internal node 405a are formed in second transistor forming region 454.

A p channel MOS transistor 404b rendered conductive in response to precharge signal /PC on signal line 479 to supply a high voltage Vpp(m) on main Vpp line 478 to internal node 405b and a p channel MOS transistor 403b rendered conductive in response to a signal potential on word line WLB to supply the high voltage Vpp(m) on the main Vpp line 478 to the internal node 405b are formed in transistor region 463.

A p channel MOS transistor PQb for supplying high voltage Vpp(s) on a sub Vpp line 477 in response to a potential on the internal node 405b is formed in transistor region 464. The transistor regions 463 and 464 constitute the third transistor forming region 456.

An n channel MOS transistor 402b for transmitting the output signal of the row decoder (NAND gate 401) to the internal node 405b in response to way address signal /Ag supplied onto signal line 479 and an n channel MOS transistor NQb for supplying the ground voltage Vss on the ground line 473 to the word line WLB in response to the signal potential on the internal nod 405b are formed in fourth transistor forming region 458.

As is apparent from FIG. 49, the transistors are disposed symmetrically about a region formed between the second and fourth transistor forming regions 454 and 458. Thus, layout patterns of transistors can be rendered regular so that layouts of the transistors can be made easy and the transistors can be efficiently disposed.

The main Vpp lines 471 and 478 are connected to a global Vpp line 480 coupled to an output node of a Vpp generating circuit 314. The sub Vpp line 470 is electrically connected to the main Vpp line 471 (or global Vpp line 480) through a switching transistor PWA and a resistive element RRa. The sub Vpp line 470 is electrically coupled to the main Vpp line 478 or the global Vpp line 480 through a switching transistor PWB and a resistive element RRb. The switching transistors PWA and PWB are rendered conductive in response to a group selection signal /B.

In the arrangement shown in FIG. 49, the sub Vpp lines 470 and 477 are respectively shown being connected to the global Vpp line 480 or the main Vpp lines 471 and 478. However, the switching element PWA and the resistive element RRa, and the switching element PWB and the resistive element RRb may be respectively disposed between the main Vpp line 471 and the sub Vpp line 470 and between the main Vpp line 478 and the sub Vpp line 477 a t predetermined intervals. Load capacitances of the sub Vpp lines can be further reduced and the voltage on each sub Vpp line can be stabilized (recovered at high speed).

In the structure shown in FIG. 49, the current regulating elements described in the previous embodiments may be used as an alternative to the resistive elements RRa and RRb.

[Modification]

Figure 50:
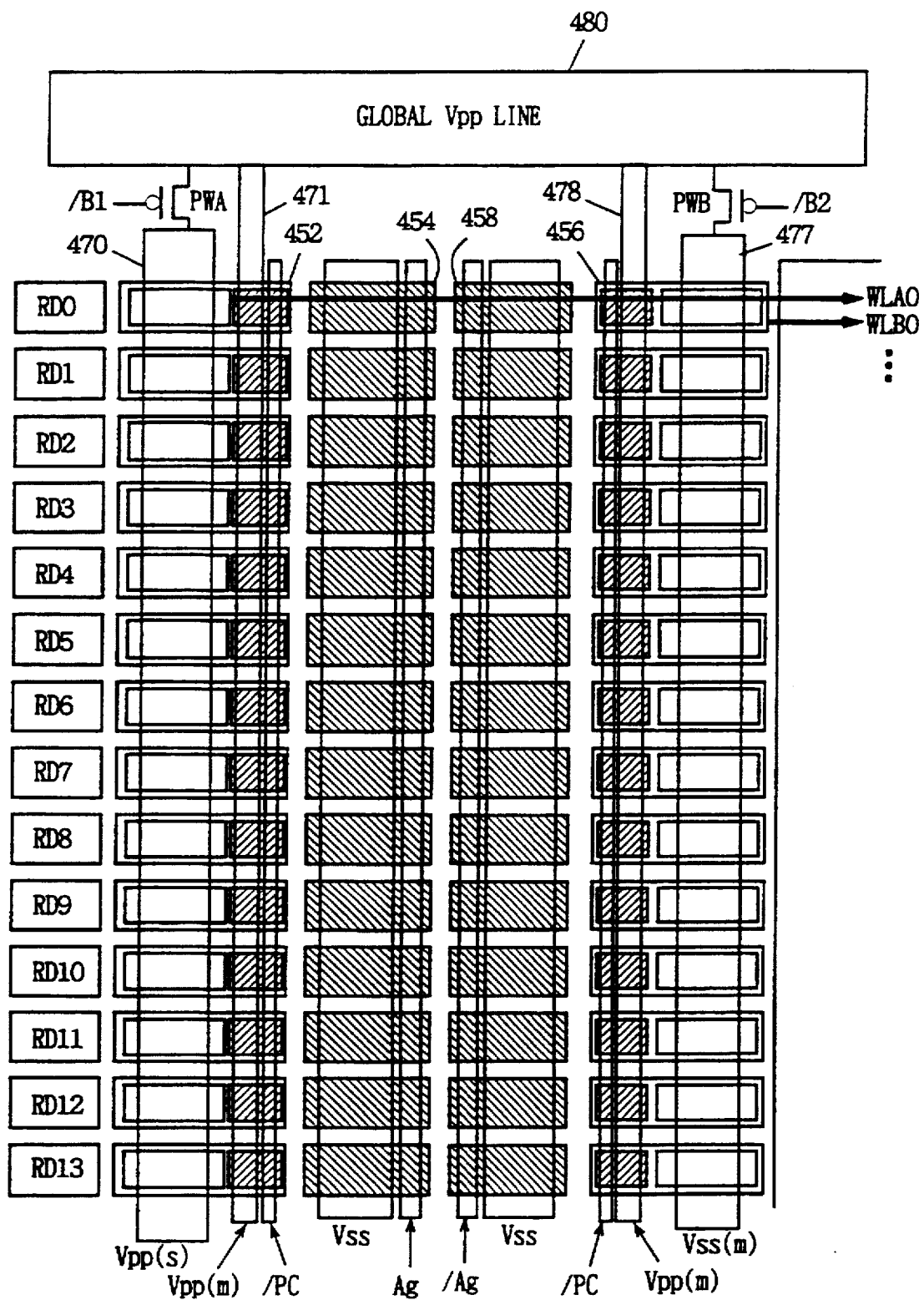
FIG. 50 is a view showing a layout of a modification of the twenty-third embodiment of the present invention.

FIG. 50 is a view showing the structure of a modification of the twenty-third embodiment of the present invention. In the structure shown in FIG. 50, a switching transistor PWA provided between sub Vpp line 470 and global Vpp line 480 receives a group selection signal /B1 at its gate. A switching transistor PWB for electrically connecting sub Vpp line 477 to the global Vpp line 480 receives a group selection signal /B2 at its gate. The group selection signals /B1 and /B2 are generated using a group selection signal /B and way address signals Ag and /Ag. Only a sub Vpp line provided corresponding to a word line group designated by the way address signals Ag and /Ag is connected to the global Vpp line 480 through a corresponding switching transistor. Thus, a sub Vpp line for word drivers provided corresponding to non-selected word lines is brought into a floating state so that current consumption is reduced (because it is unnecessary to supply a current from the global Vpp line 480 to each sub Vpp line corresponding to a non-selected group).

In the layout shown in FIG. 50, other configurations are identical to those shown in FIG. 48. Components corresponding to those shown in FIG. 48 are identified by like reference numerals and their description will therefore be omitted.

According to the twenty-third embodiment of the present invention, as described above, a large-storage capacity semiconductor memory device can be realized in which word lines can be disposed in high density and formed into high integration. A semiconductor memory device operating with low current consumption, can be realized by efficiently disposing sub Vpp lines, a global Vpp line and main Vpp lines.

Although the global Vpp line 480 is disposed only in the neighborhood of the output node of the Vpp generating circuit, but it may be provided for each block in a semiconductor memory device of a block division system, which will be described later.

Twenty-Fourth Embodiment

Figure 51:
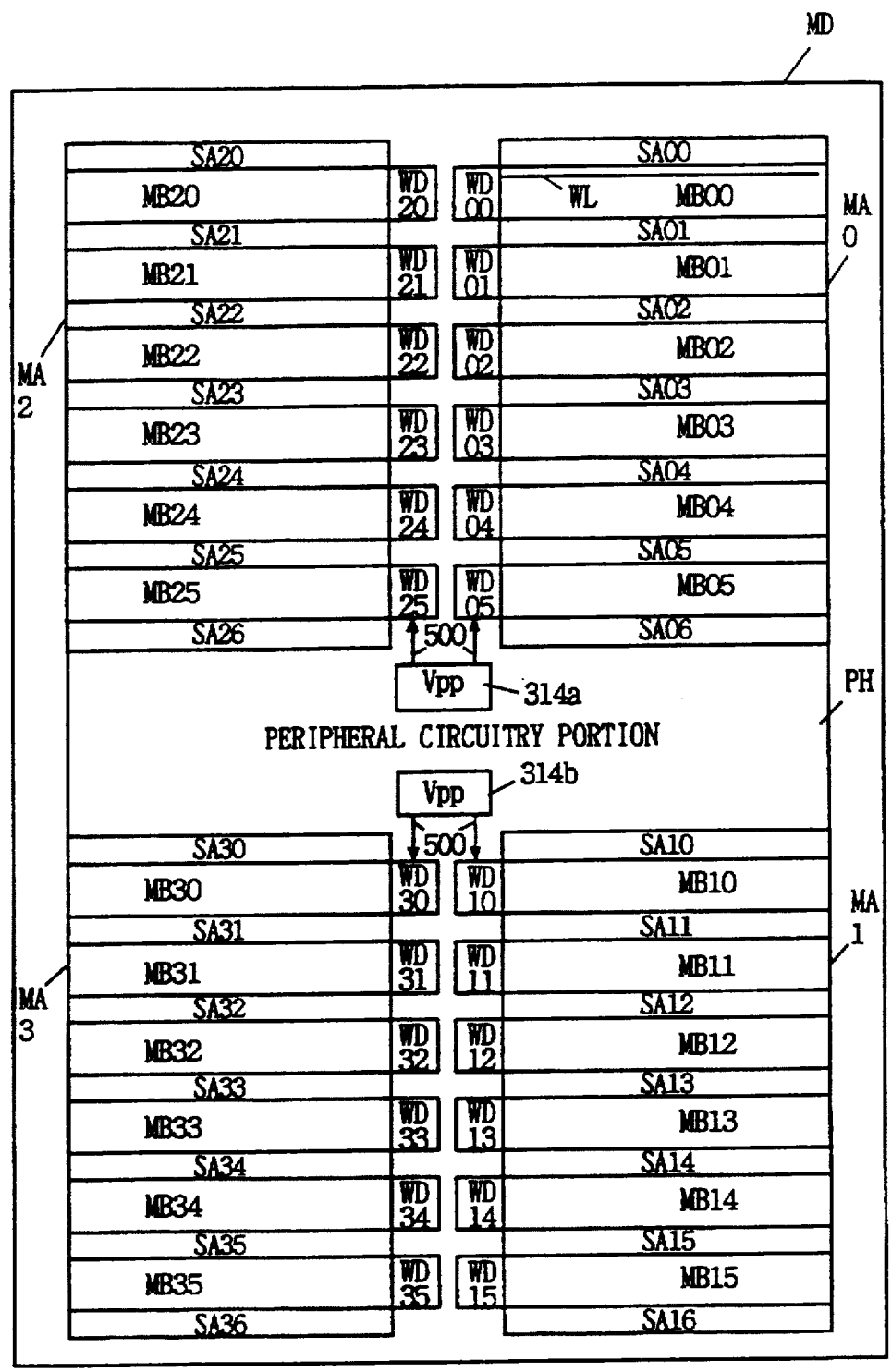
FIG. 51 is a diagram schematically illustrating the overall structure of a semiconductor memory device according to a twenty-fourth embodiment of the present invention.

FIG. 51 is a diagram schematically showing the overall structure of a semiconductor memory device according to a twenty-fourth embodiment of the present invention. In FIG. 51, the semiconductor memory device MD includes four memory mats MA0 through MA3. The four memory mats MA0 through MA3 each are divided into a plurality of arrays. The memory mats MAi (i=0 through 3) include six memory arrays MBi0 through MBi5. Sense amplifier bands Sai1 through Sai5 are provided between the adjacent memory arrays. Further, sense amplifier bands SAi0 and SAi6 are provided adjacent to the outsides of the memory arrays MBi0 and the memory arrays MBi5. Each sense amplifier band disposed between two arrays is shared between memory arrays provided on both sides thereof. Namely, the semiconductor memory device shown in FIG. 51 has a configuration of a so-called "shared sense amplifier arrangement".

Row word line drive circuits WDi0 through WDi5 are respectively provided corresponding to the memory arrays MBi0 through MBi5. The word line drive circuits WDi0 through WDi5 include word drivers respectively provided corresponding to word lines WL included in the corresponding memory block array.

Although not shown in FIG. 51, each row decode circuit is provided within a region between the memory mats adjacent to one another along the horizontal direction in FIG. 51.

Upon a word line selecting operation, only a single memory array may be selected from a single memory mat. Alternatively, a plurality of memory arrays may be selected from a single memory mat. However, only one of memory arrays between which a sense amplifier band is shared in a single memory mat, is brought into a selected state. Further, only a single memory mat may be selected or a plurality of memory mats may be simultaneously selected. Any configurations may be used.

A peripheral circuit section PH is disposed in the center of the semiconductor memory device MD. The peripheral circuit section PH includes an address input buffer, a control signal generating circuit and a column decoder. However, only Vpp generating circuits 314a and 314b for generating high voltages Vpp are representatively illustrated in FIG. 51. The high voltage Vpp generated from the Vpp generating circuit 314a is supplied to the word line drive circuits WD00 through WD05 and WD20 through WD26 provided corresponding to the memory mats MA0 and MA2. The high voltage Vpp generated from the Vpp generating circuit 314b is supplied to the word line drive circuits WD10 through WD15 and WD30 through WD35 provided corresponding to the memory mat MA1 and MA3.

Sub Vpp lines may be provided corresponding to the memory arrays respectively. In the twenty-fourth embodiment, however, the sub Vpp lines are divided into a plurality of groups for the respective memory arrays. One group in each memory array can be identified by using a predetermine number of least significant bits of a row address signal designating or specifying a word line.

Figure 52:
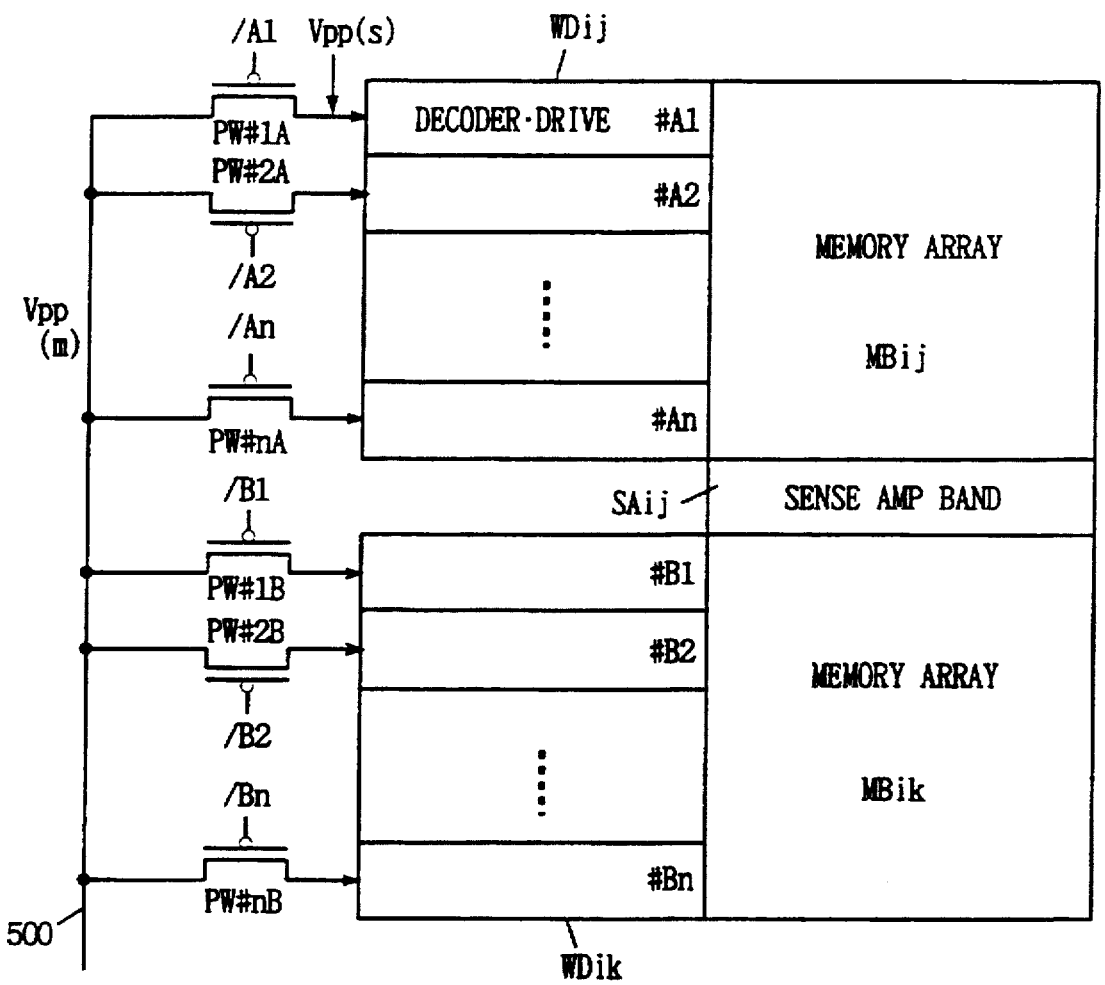
FIG. 52 is a diagram showing the layout of distributed of sub Vpp lines employed in the semiconductor memory device shown in FIG. 51.

FIG. 52 is a diagram schematically showing configurations of word line drive circuits and row decode circuits with respect to two memory arrays. The configurations of the word line drive circuits provided for the two memory arrays MBij and MBik are illustrated in FIG. 52. A sense amplifier band SAij is disposed between the memory array MBij and MBik. Operations of the memory arrays between which the sense amplifier band SAij is shared, will be described in detail later.

A word line drive circuit WDij provided for the memory array MBij is divided into n groups #A1 through #An. In FIG. 52, respective groups are represented as decoder-drives. This is because the groups include way decoders and word drivers (see FIG. 47). A word line drive circuit WDik provided for the memory array MBik is also divided into n decoder-drive groups #B1 through #Bn. Switching transistors PW#1A through PW#nA are respectively provided corresponding to the decoder-drive groups #A1 through #An. The switching transistors PW#1A through PW#nA are respectively made conductive when group selection signals #A1 through #An are activated, to supply a high voltage Vpp(m) on a main Vpp line (or a global Vpp line) 500 to the corresponding decoder-drive groups #A1 through #An. Although sub Vpp lines are not distinctly shown in FIG. 52, they are represented by one conduction terminals of the switching transistors PW#1A through PW#nA.

A word line drive circuit WDik provided for the memory array MBik is also divided into n decoder-drive groups #B1 through #Bn. Switching transistors PW#1B through PW#nB for supplying the voltage Vpp(m) on the main Vpp line (or global Vpp line) 500 to their corresponding decoder-drive groups #B1 through #Bn are respectively provided corresponding to the decoder-drive groups #B1 through #Bn. Group selection signals /B1 through /Bn are supplied to the gates of corresponding switching transistors PW#1B through PW#nB.

By further dividing the word line drive circuits provided for each memory array into groups and disposing sub Vpp lines for each group as shown in FIG. 52, the load on each sub Vpp line can be further reduced, and the voltage on each sub Vpp line during an active cycle can be recovered at high speed.

Either of a resistive element and a MOS transistor may be used as a current regulating element provided between each sub Vpp line and the main Vpp line (or global Vpp line) 500 (all the previous embodiments can be applied).

Although the main Vpp lines are further disposed for the decoder-drive groups #A1 through #An and #B1 through #Bn, these main Vpp lines are not shown in FIG. 52 for brevity of the drawing. The main Vpp lines may be respectively disposed for the memory array MBij and MBik so that a voltage is supplied from the global Vpp line to the main Vpp lines. In this case, voltage taking out lines extend into regions of the sense amplifier band SAij from the global Vpp line 500, and the main Vpp lines extending from the global Vpp line from which the voltage taking out lines extend, are respectively disposed to the word line drive circuits WDij and WDik.

Figure 53:
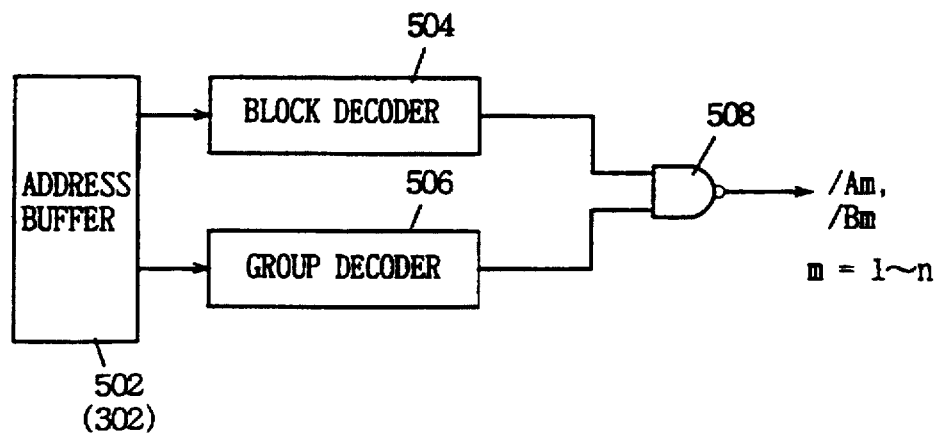
FIG. 53 is a diagram illustrating one example of a configuration for generating a group selection signal shown in FIG. 52.

FIG. 53 is a diagram showing a configuration for generating group selection signals /Am and /Bm. Portions for generating the group selection signals /Am and /Bm (m=any of 1 to n) are identical in circuit configuration to each other and hence both are represented one circuit block. In FIG. 53, a group selection signal generation system includes a block decoder 504 for decoding an array address specifying a memory array supplied from an address buffer 502, to generate a signal specifying the memory array, a group decoder 506 for decoding a group address signal specifying a group in the corresponding memory array supplied from the address buffer 502, to generate a signal for specifying a decoder-drive group, and a NAND gate 508 for negative-ANDing a signal outputted from the block decoder 504 and a signal outputted from the group decoder 506.

The block decoder 504 generates a signal for specifying one memory array (which is selected in a single memory mat) and the group decoder 506 generates a signal for specifying one group in the corresponding memory array. The group selection signals /Am and /Bm are selected only for a decoder-drive group designated by the group decoder 506 in the memory array specified by the block decoder. Thus, the load on each sub Vpp line is reduced and the switching transistors between the sub Vpp lines for the non-selected decoder-drive groups and the non-selected memory arrays and the main Vpp line (or global Vpp line) are turned off, so that the high voltage on each sub Vpp line is not consumed, thereby making it possible to greatly reduce current consumption.

Twenty-Fifth Embodiment

Figure 54:
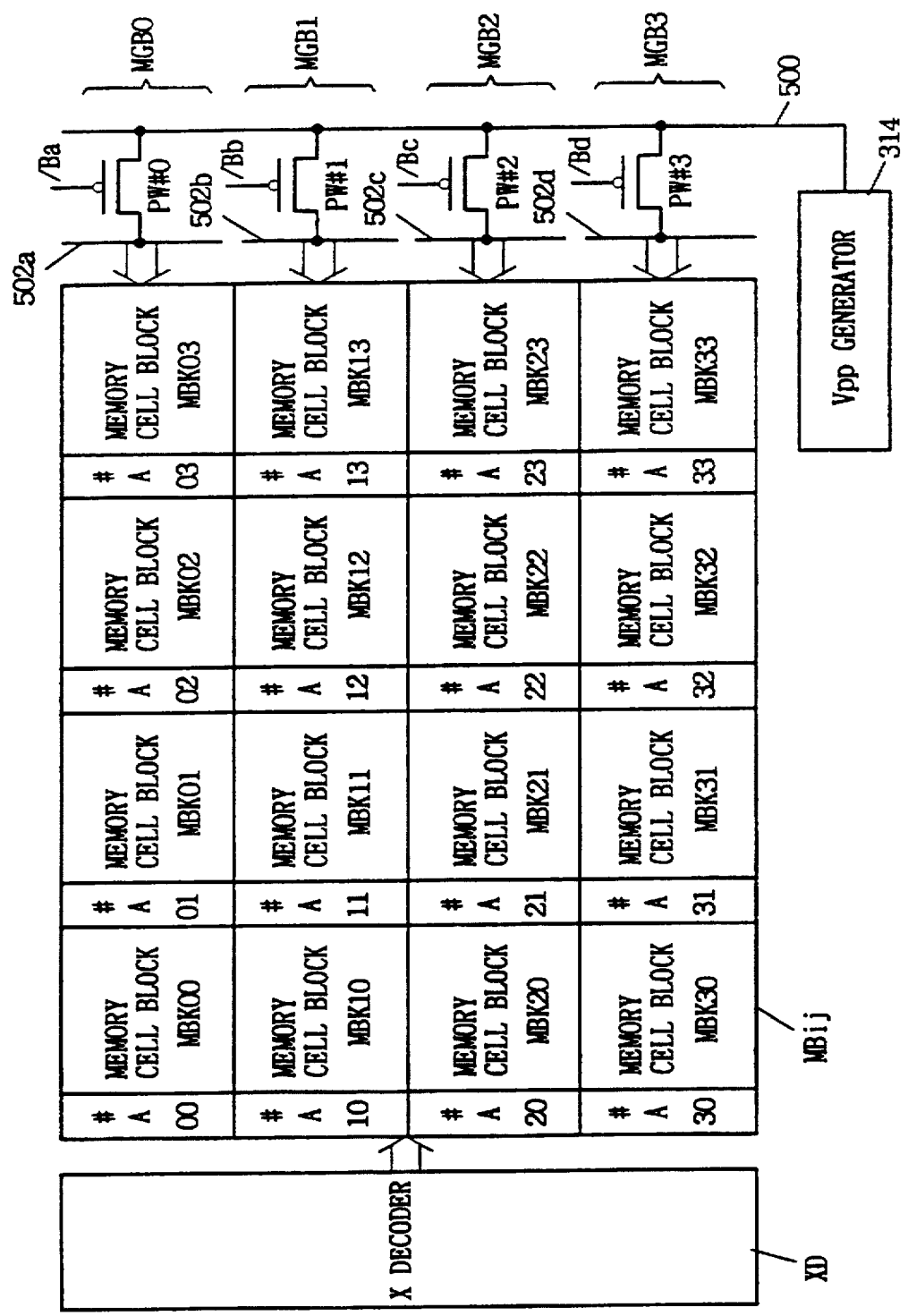
FIG. 54 is a diagram schematically depicting the structure of a principal part of a semiconductor memory device according to a twenty-fifth embodiment of the present invention.

FIG. 54 is a diagram showing the structure of a principal part of a semiconductor memory device according to a twenty-fifth embodiment of the present invention. In FIG. 54, configurations of portions related to one memory array of the semiconductor memory device shown in FIG. 51 are schematically illustrated. A memory array MBij is divided into a plurality of memory groups each including a plurality of rows. A state in which the memory array MBij is divided into four memory groups MGB0 through MGB3, is shown in FIG. 54 as one example. The memory groups MGB0 through MGB3 are respectively divided into a plurality of column blocks. Similarly, a state in which each memory group is divided into four column blocks, is shown in FIG. 54 as one example. Memory groups MGBk (k=0 to 3) each include four memory cell blocks MBKk0 through MBKk3. Word driver groups are disposed corresponding to the memory cell blocks. Namely, word drivers #Akh are respectively disposed corresponding to memory cell blocks MBKkh (k, h=0 to 3). The word driver groups are supplied with a signal outputted from an X decoder XD, as will be described later. The X decoder XD includes row decoders and way decoders.

Sub Vpp lines 502a, 502b, 502c and 502d are respectively disposed corresponding to the memory groups MGB0 through MGB3. The sub Vpp lines 502 (502a through 502d) respectively supply high voltage Vpp commonly to all the word drivers #A included in the corresponding memory groups MGB (MGB0 through MGB3). For example, the sub Vpp line 502a supplies the high voltage Vpp to the word drivers #A00 through #A03 included in the memory group MGB0.

Switching transistors PW#0, PW#1, PW#2 and PW#3 respectively rendered conductive in response to group selection signals /Ba, /Bb, /Bc and /Bd are respectively disposed between the sub Vpp lines 502a through 502d and a main Vpp line (or global Vpp line) 500. The main Vpp line (or global Vpp line) 500 is supplied with high voltage Vpp generated from Vpp generating circuit 314. Various current regulating elements or resistive elements described in the previous embodiments may be connected between each of the sub Vpp lines 502a through 502d and the main Vpp line (or global Vpp line) 500 in parallel with the switching transistors. The length of a word line connected to one word driver is made short and correspondingly an output load of the word driver is reduced. Thus, the potential on the selected word line can be raised up to high voltage Vpp level at high speed.

Figure 55:
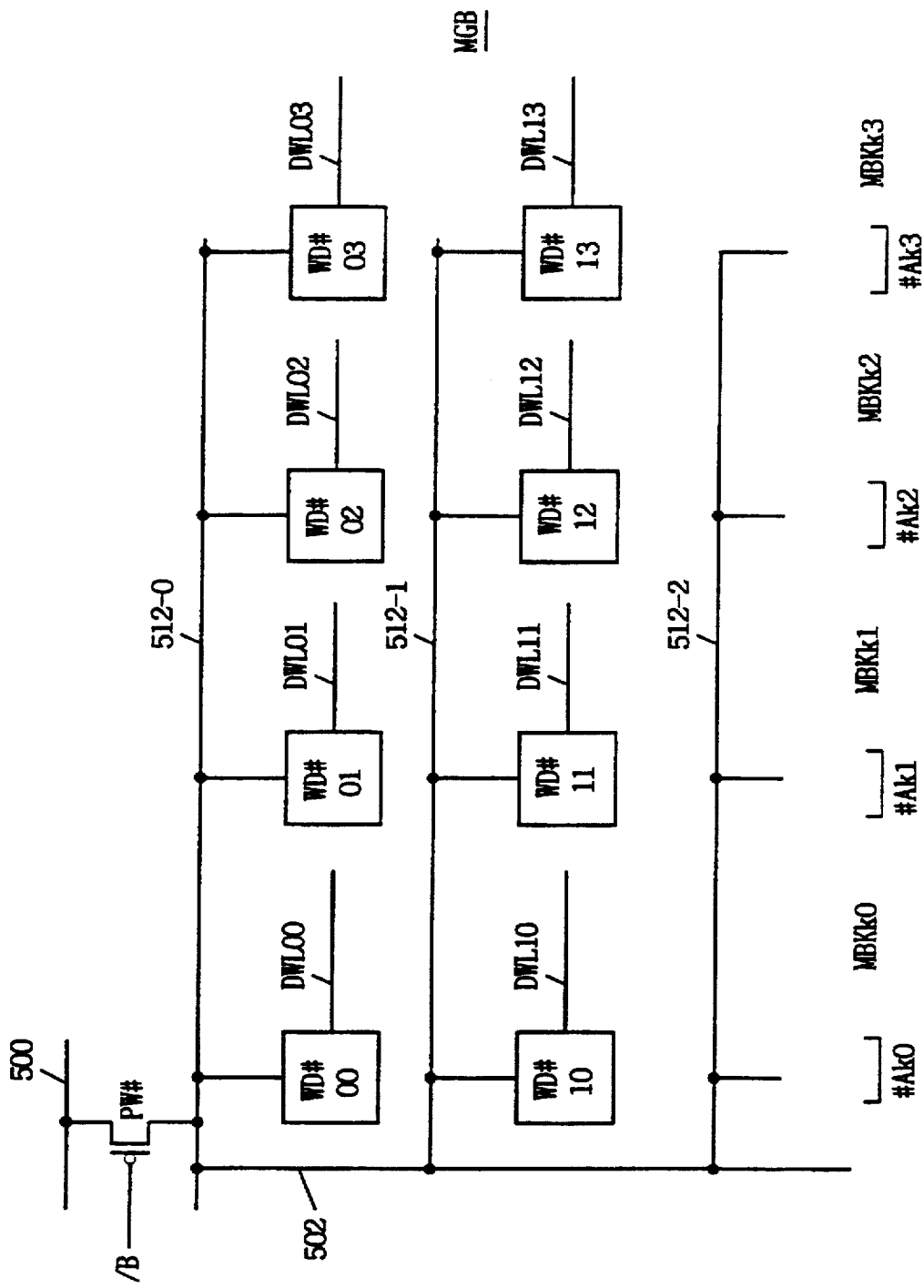
FIG. 55 is a diagram illustrating one example of a layout of a sub Vpp line corresponding to a single memory cell group shown in FIG. 54.

FIG. 55 is a diagram showing one example of a layout of sub Vpp lines. A layout of the sub Vpp line disposed for three rows in one memory group MGB is shown in FIG. 55.

Word lines DWL0h through DWL1h connecting memory cells on corresponding rows are disposed in every memory blocks MBKkh (h=0 to 3). Word drivers WD#00 through WD#03 are respectively disposed corresponding to word lines DWL00 through DWL03. Further, word drivers WD#10 through WD#13 are respectively disposed corresponding to word lines DWL10 through DWL13. The word driver WD#00 and WD#10 are included in word driver group #Ak0 and the word drivers WD#01 and WD#11 are included word driver group #Ak1. Further, the word drivers WD#02 and WD#12 are included in word driver group #Ak2 and the word drivers WD#03 and WD#13 are included in word driver group #Ak3.

A switching transistor PW# (corresponding to each of PW#0 through PW#3) rendered conductive in response to a group selection signal /B supplies the high voltage on main Vpp line (or global Vpp line) 500 to its corresponding sub Vpp line 502. The sub Vpp line 502 extends in a memory array group along the column direction (the direction intersecting each word line). Local Vpp lines 512-0 through 512-2 are respectively disposed corresponding to rows. The local Vpp lines 512-0 through 512-2 are electrically connected to the sub Vpp line 502 to be supplied with high voltage Vpp through the sub Vpp line 502. The local Vpp line 512-0 serves to supply the high voltage Vpp to the word drivers WD#00 through WD#03, whereas the local Vpp line 512-1 serves to apply the high voltage Vpp to the word drivers WD#10 through WD#13. Further, the local Vpp line 512-2 serves to supply the high voltage to word drivers respectively disposed for unillustrated word lines.

The local Vpp lines 512 are disposed in parallel to the respective rows and are electrically connected to the sub Vpp line 502. Owing to this structure, voltage noise developed in a local Vpp line is absorbed by the sub Vpp line 502, so that the influence of the voltage noise is not supplied to other local Vpp lines, thereby making it possible to realize a high-voltage supply arrangement which is resistant against the voltage noise.

Figure 56A:
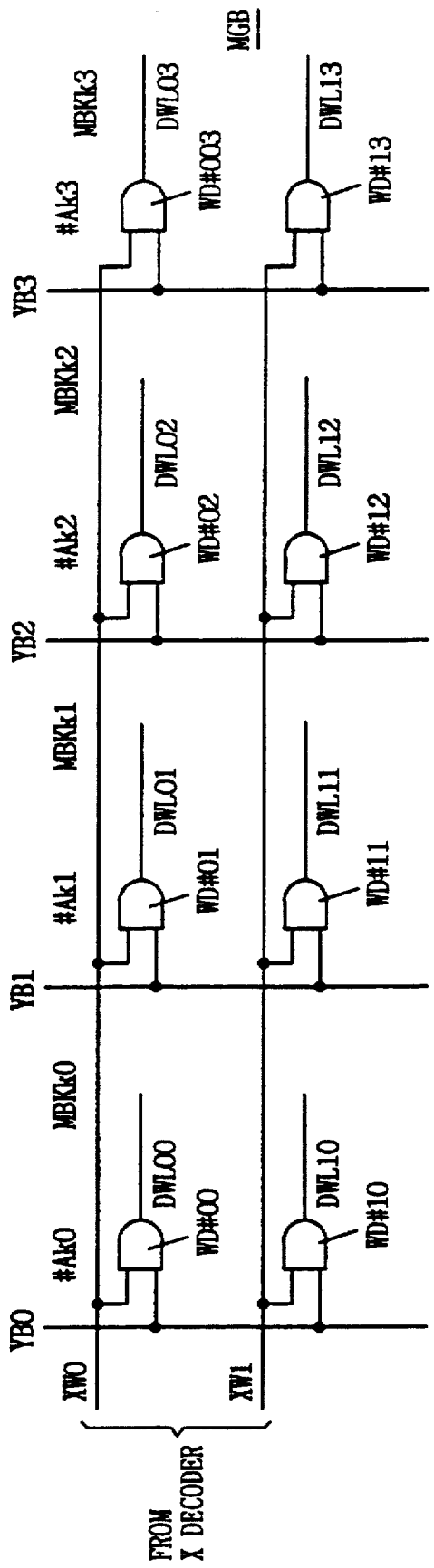
FIGS. 56A and 56B are respectively diagrams showing the arrangement of distribution of signals outputted from X decoders provided for the arrangement of word drivers shown in FIG. 55.
Figure 56B:
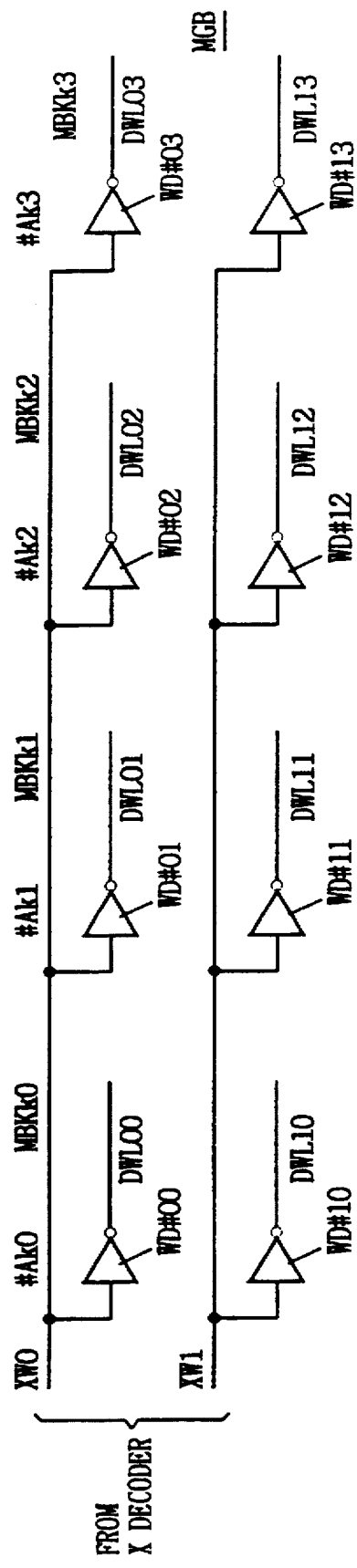

FIGS. 56A and 56B are diagrams showing specific configurations of the word drivers WD#00 through WD#17 shown in FIG. 55. In FIG. 56A, each of the word drivers WD#00 through WD#13 is comprised of a two-input AND gate. A signal XW0 outputted from the X decoder is commonly supplied to the word drivers WD#00 through WD#03, whereas a decode signal XW1 produced from the X decoder is commonly supplied to the word drivers WD#10 to WD#13.

A block selection signal is commonly supplied to the word drivers included in the same word driver group. Namely, a block selection signal YB0 is supplied to the word drivers WD#00 and WD#10 included in the word driver group #Ak0. A block selection signal YB1 is supplied to the word drivers WD#01 and WD#11 included in the word driver group #Ak1. A block selection signal YB2 is supplied to the word drivers WD#02 and WD#12 included in the word driver group #Ak2. A block selection signal YB3 is supplied to the word drivers WD#03 and WD#13 included in the word driver group #Ak3. When each of the word drivers WD#00 through WD#13 receives at both inputs thereof, signals at high level indicative of an active state, the corresponding word driver (WD#00 through WD#13) drives the corresponding word line (DWL00 through DWL13) into a selected states. Namely, in the configuration shown in FIG. 56A, one memory cell block is selected in a memory group MGB and one word line is selected in the selected memory cell block. Current consumption can be greatly reduced owing to such a block division and partial activation system.

Each of the block selection signals YB0 through YB3 is generated by decoding a predetermined number of bits, e.g., most significant bits of a column address signal.

In the configuration shown in FIG. 56B, the word drivers WD#00 through WD#13 each are comprised of an inverter (CMOS inverter). The word drivers WD#00 through WD#03 arranged in the same row are commonly supplied with the signal XWO outputted from the X decoder. Further, the word drivers WD#10 through WD#13 are commonly supplied with the signal XW1 outputted from the X decoder.

In the configuration shown in FIG. 56B, the word lines disposed corresponding to a row specified by the X decoder are selected in each memory cell block in the memory group MGB. In the structure shown in FIG. 56B, each of memory blocks MBKk0 through MBKk3 is brought into a selected state and the respective word drivers in the word driver groups #Ak0 through #Ak3 are driven. Since each word driver is comprised of one inverter, areas occupied by components can be reduced.

[First Modification]

Figure 57:
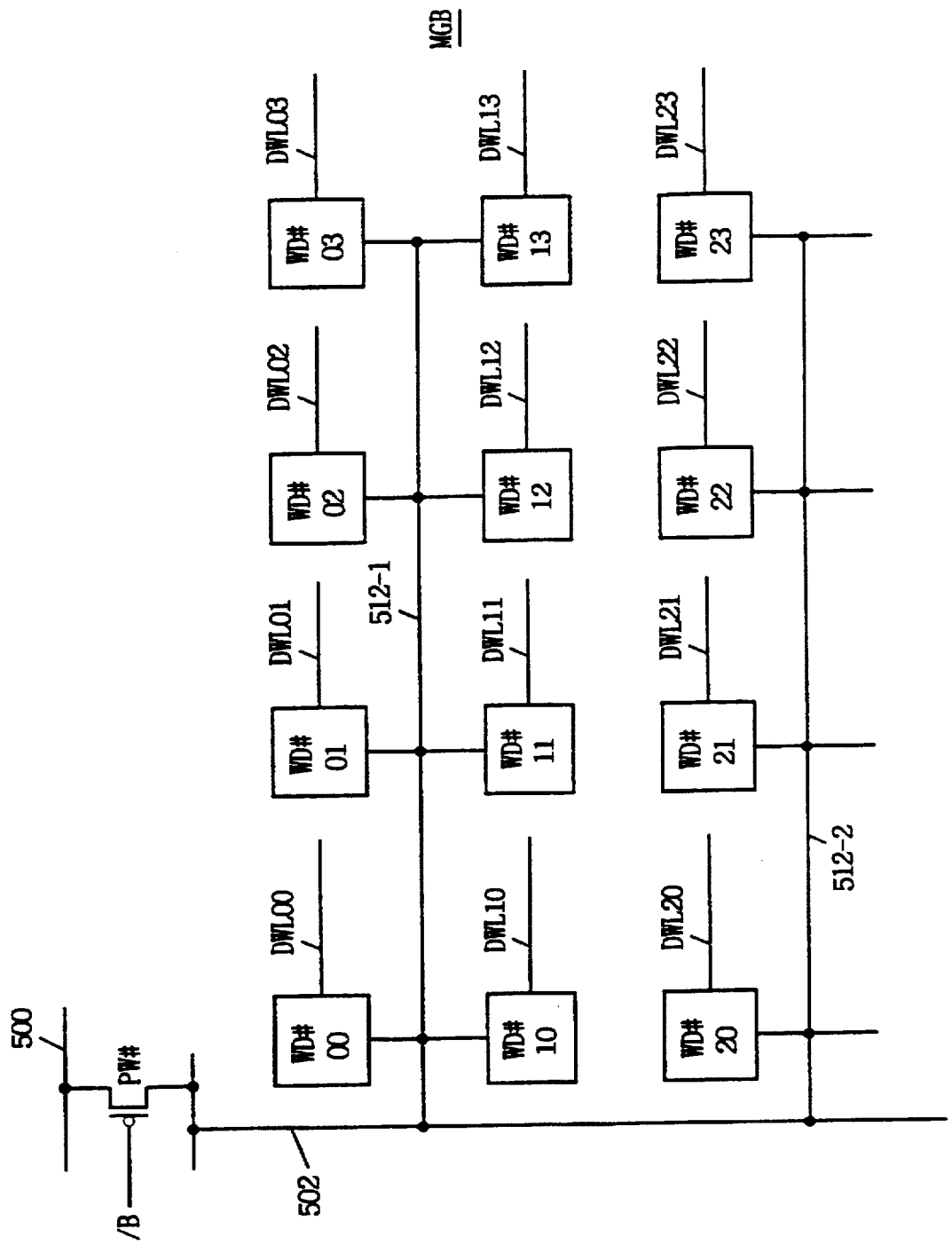
FIG. 57 is a diagram illustrating another arrangement of a sub Vpp line provided corresponding to a memory cell group employed in the semiconductor memory device shown in FIG. 54.

FIG. 57 is a diagram showing the structure of a first modification of the twenty-fifth embodiment of the present invention. In a layout shown in FIG. 57, a local Vpp line is disposed being shared between adjacent word drivers arranged in two rows. Namely, a local Vpp line 512-1 electrically connected to sub Vpp line 502 serves so as to supply high voltage Vpp to each of word drivers WD#00 through WD#03 and WD#10 through WD#13. A local Vpp line 512-2 serves to supply the high voltage supplied from the sub Vpp line to each of word drivers WD#20 through WD#23 and WD#30 through WD#33 (not shown).

Since each of the local Vpp lines is disposed being shared between the word drivers arranged in two rows as shown in FIG. 57, pitch conditions for the local Vpp lines are relaxed so that high voltage supply line can be easily laid out.

In the layout shown in FIG. 57, the sub Vpp line 502 may be disposed in the central portion of the local Vpp lines.

[Second Modification]

Figure 58:
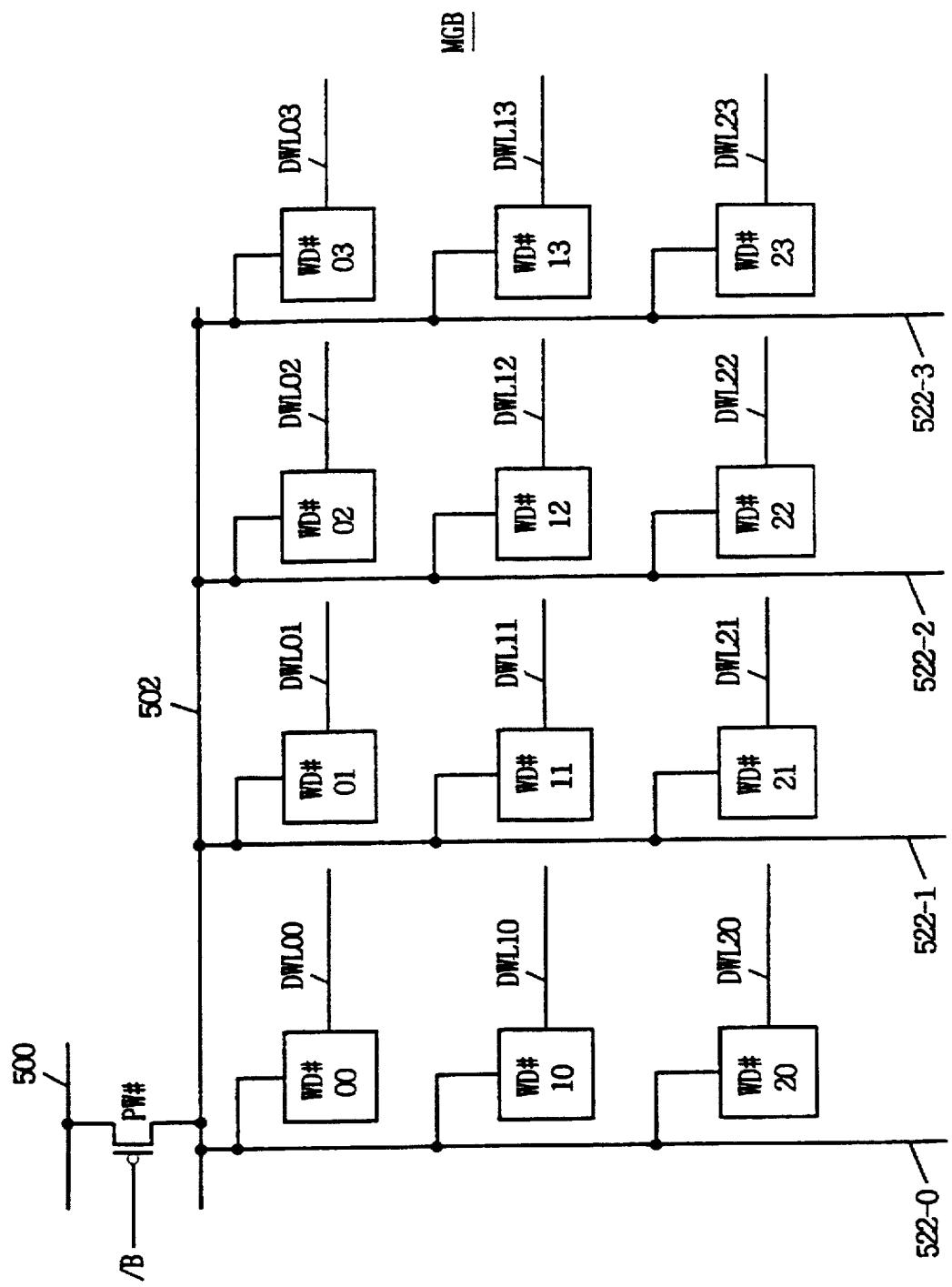
FIG. 58 is a diagram showing a further arrangement of a sub Vpp line provided corresponding to a memory cell group shown in FIG. 54.

FIG. 58 is a diagram illustrating the structure of a second modification of the twenty-fifth embodiment of the present invention. Configurations of word drivers arranged in three rows within one memory cell group are representatively illustrated in FIG. 58.

In FIG. 58, a sub vpp line 502 electrically connected to main Vpp line (or global Vpp line) 500 through a switching transistor PW# is disposed commonly to a plurality of memory cell blocks along a row direction. Local Vpp lines 522-0 through 522-3 are respectively provided corresponding to the memory cell blocks. Namely, the local Vpp line 522-0 serves to supply a high voltage Vpp to each of word drivers WD#00, WD#10 and WD#20 provided for a first memory block. The local Vpp line 522-1 serves to supply the high voltage Vpp to each of word drivers WD#01, WD#11 and WD#21 provided for a second memory block. The local Vpp line 522-2 serves to supply the high voltage Vpp to each of word drivers WD#02, WD#12 and WD#22provided for a third memory block. The local Vpp line 522-3 serves so as to supply the high voltage Vpp to each of word drivers WD#03, WD#13 and WD#23 provided for a fourth memory block.

In the structure shown in FIG. 58, a variation in the voltage on a local Vpp line is absorbed by the sub Vpp line 502 and the voltage variation is not transmitted to other local Vpp lines. Further, the voltage applied to each of other local Vpp lines can be stably maintained. Since the local Vpp lines are disposed for each block in the case of the layout shown in FIG. 58, each local Vpp line can be provided at a boundary between the adjacent blocks and conductor lines for supplying the high voltage can be laid out without exerting any influence on a word line pitch and a bit line pitch.

According to the twenty-fifth embodiment of the present invention, as described above, since the row is further divided into the plurality of blocks and the word drivers are provided in association with the blocks to be supplied with the high voltage through the sub/local Vpp lines, an output load of one word driver is reduced and each word line can be raised at quick speed.

Twenty-Sixth Embodiment

Figure 59:
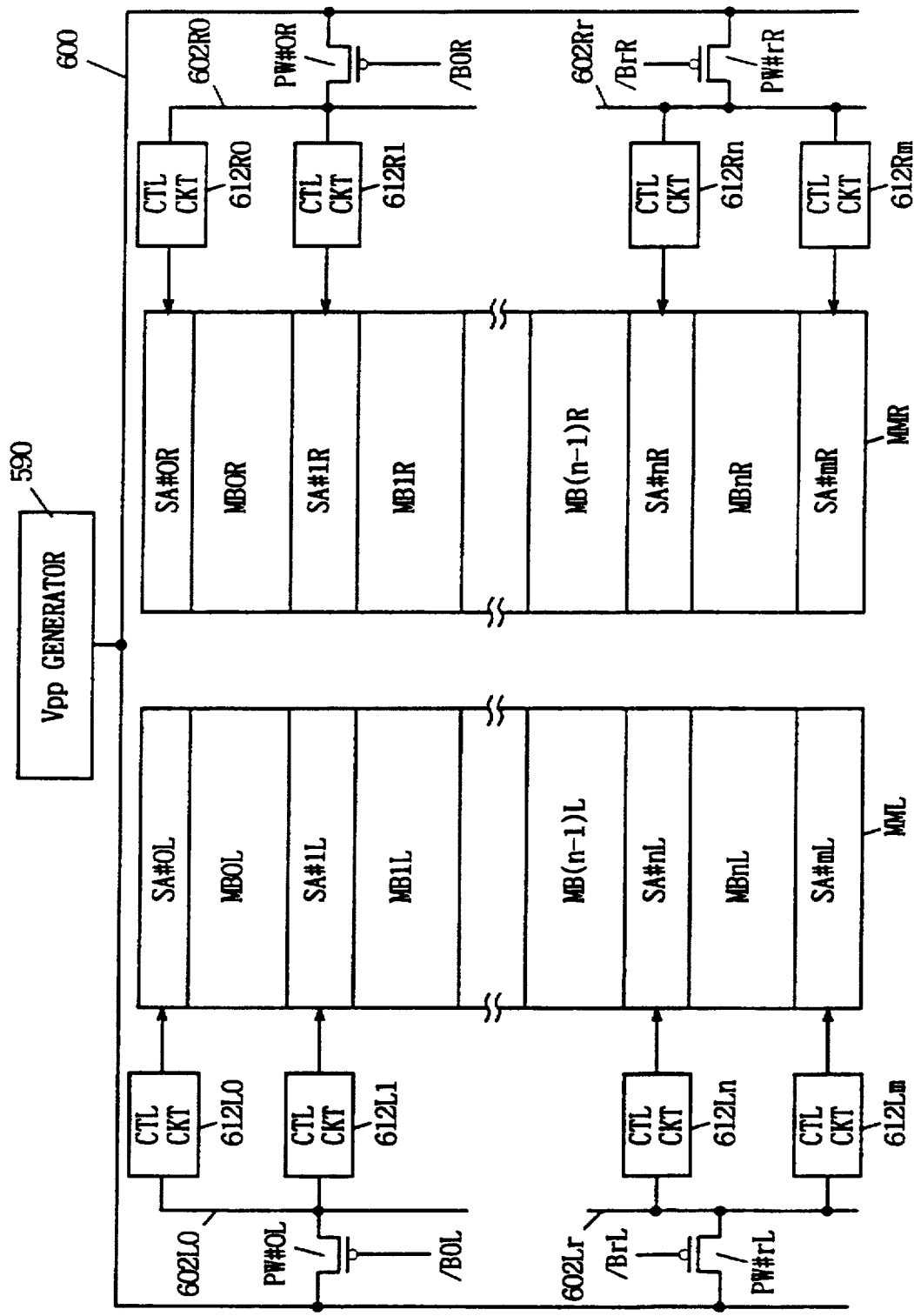
FIG. 59 is a diagram schematically illustrating the structure of a principal part of a semiconductor memory device according to a twenty-sixth embodiment of the present invention.

FIG. 59 is a diagram schematically showing the overall structure of a semiconductor memory device according to a twenty-sixth embodiment of the present invention. In FIG. 59, configurations of two memory mats MML and MMR are shown. The memory mat MML includes memory arrays MB0L through MBnL, and the memory mat MMR includes memory arrays MB0R through MBnR. Sense amplifier bands SA#1L through SA#nL are respectively disposed between the adjacent memory arrays MB0L through MBnL. Sense amplifier bands SA#1R through SA#nR are respectively disposed between the adjacent memory arrays MB0R through MBnR. Sense amplifier bands SA#0L and SA#0R are respectively provided adjacent to outer peripheries of the memory arrays MB0L and MB0R. Sense amplifier bands SA#mL and SA#mR are respectively disposed adjacent to outer peripheries of the memory arrays MBnL and MBnR. In the layout shown in FIG. 59, a so-called "alternate arrangement type shared sense amplifier" configuration is provided. Namely, each sense amplifier disposed between the adjacent memory arrays is shared between the two memory arrays on both sides thereof and sense amplifiers provided on both sides with respect to one memory array are simultaneously activated. The sense amplifiers are alternately disposed on both sides of each column of memory arrays.

Control circuits 612L0 through 612Lm are respectively disposed corresponding to the sense amplifier bands SA#0L through SA#mL. Similarly, control circuits 612R0 through 612Rm are respectively disposed corresponding to the sense amplifier bands SA#0R through SA#mR. The control circuits 612L0 through 612Lm and 612R0 through 612Rm control activation/inactivation of sense amplifiers (N sense amplifiers and P sense amplifiers (active restore circuits)) of the corresponding sense amplifier bands and control electrical connections between the sense amplifiers and bit line pairs. Specific configurations of the control circuits will be described later in detail.

The control circuits 612L0 through 612Lm are divided into a plurality of groups and sub Vpp lines are respectively disposed corresponding to the groups. A state in which a common sub Vpp line 602L0 is disposed for the control circuits 612L0 and 612L1 and a common sub Vpp line 602Lr is disposed for the control circuits 612Ln and 612Lm, is illustrated in FIG. 59 as one example. The sub Vpp lines 602L0 and 602Lr are respectively electrically connected to a main Vpp line 600 through switching transistors PW#0L and PW#rL. The switching transistors PW#0L and PW#rL are supplied with group selection signals /B0L and /BrL respectively.

Similarly, the control circuits 612R0 through 612Rm are divided into a plurality of groups and sub Vpp lines are respectively disposed corresponding to the groups. In FIG. 59, a common sub Vpp line 602R0 is disposed for the control circuits 612R0 and 612R1, and a common sub Vpp line 602Rr is provided for control circuits 612Rn and 612Rm. The sub Vpp lines 602R0 and 602Rr are respectively electrically connected to the main Vpp line 600 through switching transistors PW#0R and PW#rR. The switching transistors PW#0R and PW#rR are supplied with group signals /B0R and /BrR respectively. The group selection signals /B0L, /BrL, /B0R and /BrR are generated based on an array address signal. The main Vpp line 600 is supplied with high voltage Vpp from a Vpp generating circuit 590. Specific configurations of the control circuits 612L0 through 612Lm and 612R0 through 612Rm will now be described.

[Sense Amplifier Activating Circuit]

Figure 60:
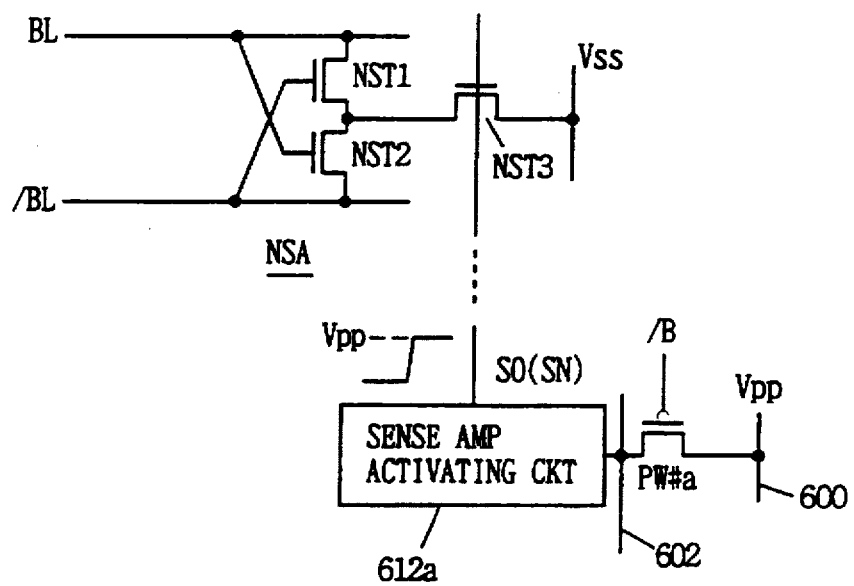
FIG. 60 is a diagram depicting a first specific configuration of a control circuit shown in FIG. 59.

FIG. 60 is a diagram showing the configuration of n sense amplifier activating circuits respectively included in the control circuits shown in FIG. 59. Sense amplifier NSA including n channel MOS transistors NST1 and NTS2 is disposed between bit lines BL and /BL. In an alternate arrangement type sense amplifier configuration, sense amplifiers NSA are disposed at alternate columns (bit line pairs) in the respective sense amplifier bands. The sense amplifiers are provided on both sides of each bit line pair. Only one sense amplifier NSA provided for a pair of bit lines is representatively illustrated in FIG. 60. The gate of the MOS transistor NST1 is connected to the bit line /BL and the drain thereof is connected to the bit line BL. The gate of the MOS transistor NST2 is connected to the bit line /BL and the drain thereof is connected to the bit line /BL. The sources of the MOS transistors NST1 and NST2 are commonly connected to each other and are electrically connected to a ground line through an n channel MOS transistor NST3 for activation of the sense amplifier.

A sense amplifier activation signal SO (SN) generated from a sense amplifier activating circuit 612a is supplied to the gate of the n channel MOS transistor NST3 for activation of the sense amplifier. The sense amplifier activating circuit 612a is supplied with high voltage Vpp from a sub Vpp line 602. The sub Vpp line 602 is electrically connected to a main Vpp line 600 through a switching transistor PW#a. The gate of the switching transistor PW#a is supplied with a group selection signal /B. The operation of each sense amplifier activating circuit will now be described in brief.

During a standby cycle, the group selection signal /B is high in level and the switching transistor PW#a is in an off state. During the standby cycle, the sense amplifier activation signal SO outputted from the sense amplifier activating circuit 612a is low in level and the n channel MOS transistor NST3 is in an off state. When an active cycle is started, a memory cell is selected and the voltage between the bit lines BL and /BL varies according to data stored in the selected memory cell, and the sense amplifier activating circuit 612a is activated.

Before the activation of the sense amplifier activating circuit 612a, the group selection signal /B is brought into a low level indicative of an active state so that the switching transistor PW#a is turned on. As a result, a current is supplied to the sub Vpp line 602 from the main Vpp line 600 so that the voltage on the sub Vpp line 602 is set to high voltage Vpp level. The sense amplifier activation signal SO outputted from the activated sense amplifier activating circuit 612a is brought to a high level corresponding to high voltage Vpp level, so that the n channel MOS transistor NST3 is turned on. The n channel MOS transistor NST3 receives the high voltage Vpp at the gate to have an on-resistance of sufficiently reduced, so that the sources of the MOS transistors NST1 and NST2 can be discharged to the ground potential level at high speed. Thus, each sense amplifier NSA is activated so that a low-potential bit line of the bit lines BL and /BL is discharged to the ground potential level. Thereafter, when the writing/reading of data is performed and one memory cycle is completed, the sense amplifier activation signal SO is brought to a low level indicative of an inactive state, so that the n channel MOS transistor NST3 is turned off. Thereafter, the group selection signal /B is brought to the high level to turn off the switching transistor PW#a.

By setting the sense amplifier activation signal SO to the high voltage Vpp level as in the case of the configuration shown in FIG. 60, the on-resistance of each MOS transistor can be reduced so that a sensing operation can be performed at quick speed. A sub-threshold current that flows in the sense amplifier activating circuit during the standby cycle (for a period preceding a starting of sense operation) can be reduced by employing a hierarchical source configuration of the main Vpp line/sub Vpp line in such sense amplifier activating circuit.

[Circuit for Activating Active Restore Circuit (P Sense Amplifier)]

Figure 61:
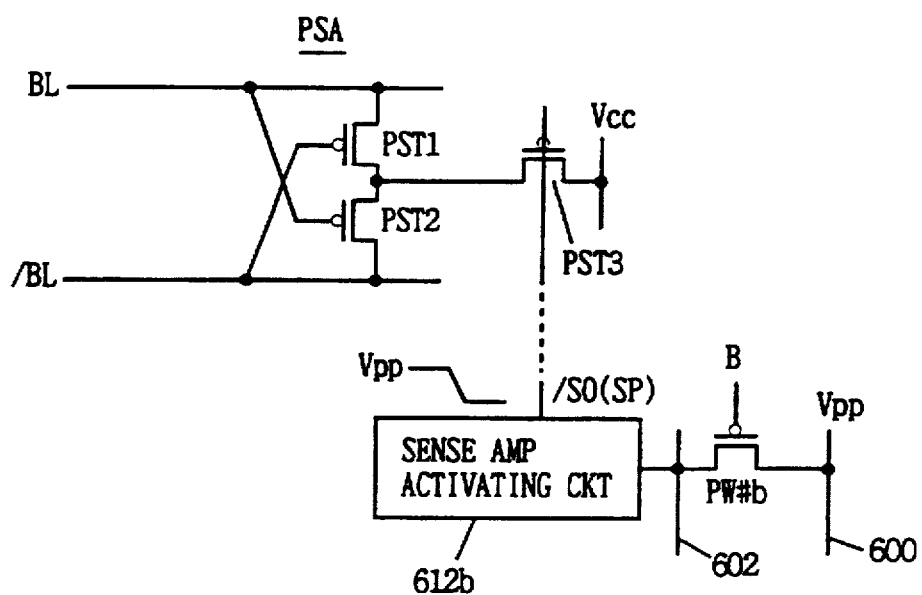
FIG. 61 is a diagram showing a second specific configuration of the control circuit shown in FIG. 59.

FIG. 61 is a diagram showing the configuration of portions for controlling restore circuits (P sense amplifiers), which are respectively included in the control circuits shown in FIG. 59. As shown in FIG. 61, an active restore circuit (P sense amplifier) PSA for setting a potential of a high-potential bit line of bit lines BL and /BL to source voltage Vcc level is disposed between the bit lines BL and /BL. The active restore circuit PSA includes a p channel MOS transistor PST1 whose gate is connected to the bit line /BL and whose one conduction terminal is connected to the bit line BL, and a p channel MOS transistor PST2 whose gate is connected to the bit line BL and whose one conduction terminal is connected to the bit line /BL. Both of other conduction terminals of the p channel MOS transistors PST1 and PST2 are electrically coupled to a power source line through an activating p channel MOS transistor PST3.

The gate of the p channel MOS transistor PST3 is supplied with a sense activation signal /SO outputted from a P sense amplifier activating circuit 612b. The sense activation signal /SO is brought to high voltage Vpp level upon inactivation. The sense amplifier activating circuit 612b is supplied with high voltage Vpp through sub Vpp line 602 connected to main Vpp line 600 via switching transistor PW#b. The gate of the switching transistor PW#b is supplied with a group selection signal B. The group selection signal B is brought to a low level upon standby of the memory device. P sense amplifier activating circuit 612b is activated when the group selection signal B is rendered high in level. The active restore circuit PSA is included in each sense amplifier band shown in FIG. 59. The operation of the P sense amplifier activating circuit will now be described in brief.

Upon standby of the memory device, the group selection signal B is low in level and the switching transistor PW#b is in an on state. Further, the sub Vpp line 602 is maintained at the level of the high voltage Vpp on the main Vpp line 600. In this condition, the sense activation signal /SO outputted from the sense amplifier activating circuit 612b is at the high voltage Vpp level and the p channel MOS transistor PST3 is brought into a deep off state. Thus, a sub-threshold current that flows from the source line Vcc to the p channel MOS transistors PST1 and PST2, can be reduced. During the standby cycle, each of the bit lines BL and /BL is precharged to an intermediate voltage VBL (corresponding to a Vcc/2 voltage level, which will be described later), and a node where the p channel MOS transistors PST1 and PST2 are electrically connected to each other, is precharged to the intermediate potential VBL.

When an active cycle is started, a memory cell is selected and a potential difference corresponding to data stored in the selected memory cell is developed between the bit lines BL and /BL. Then, the group selection signal B is brought to a high level so that the switching transistor PW#b is turned off. In this condition, the sense amplifier activating circuit 612b is activated to reduce the sense activation signal /SO to a low level corresponding to the ground voltage level, thereby turning on the p channel MOS transistor PST3. At this time, a charging transistor included in the sense amplifier activating circuit 612b is turned off to be operated in the sub-threshold current region. By turning off the switching transistor PW#b, the level of the voltage on the sub Vpp line 602 is reduced so that the charging transistor included in the sense amplifier activating circuit 612b is brought into a deeper off state, resulting in a reduction in the sub-threshold current.

When the sense activation signal /SO is rendered low in level, the active restore circuit (P sense amplifier) PSA is activated so that a high-potential bit line of the bit lines BL and /BL is charged to the source voltage Vcc level. When the writing/reading of data is performed and one memory cycle is completed, the group selection signal B is brought to the low level so that the switching transistor PW#b is turned on. As a result, the high voltage Vpp on the main Vpp line 600 is supplied to the sub Vpp line 602. Next, the sense amplifier activating circuit 612b is rendered inactive so that the sense activation signal /SO is driven into the high level (high voltage Vpp level) indicative of the inactive state.

By supplying the high voltage Vpp to the gates of the transistors for activating the active restore circuit as described above, a leakage current that flows through the active restore circuit as well as through the P sense amplifier activating circuit upon standby, can also be reduced.

[Circuit 2 for Activating Active Restore Circuit (P Sense Amplifier)]

Figure 62:
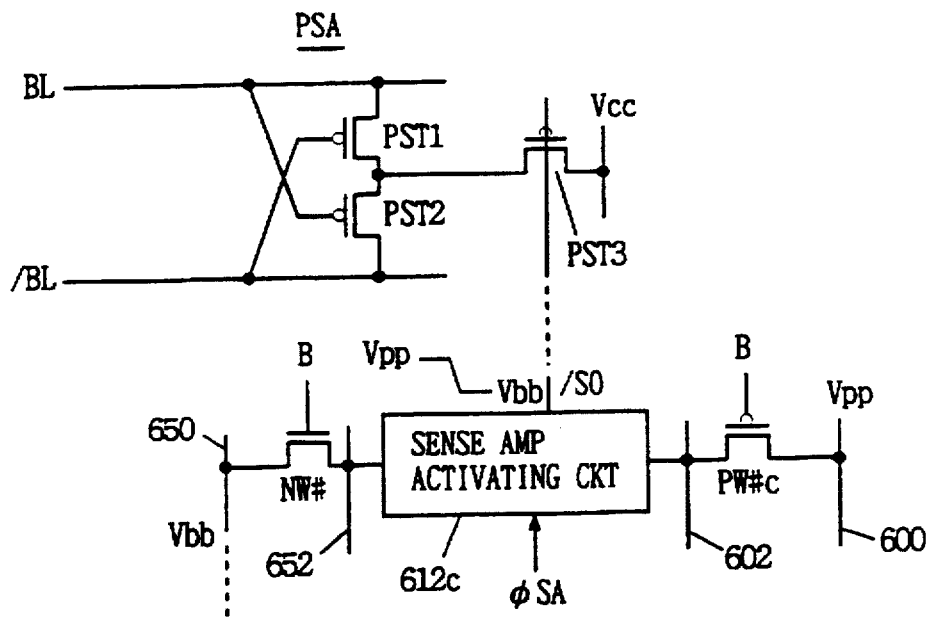
FIG. 62 is a diagram illustrating a third specific configuration of the control circuit shown in FIG. 59.

FIG. 62 is a diagram showing another configuration of a portion for controlling activation/inactivation of active restore circuits. In the configuration shown in FIG. 62, a sense amplifier activating circuit 612c for generating a sense activation signal /SO for activating each active restore circuit (P sense amplifier) operates with a voltage supplied to a sub Vbb line 652 from a main Vbb line 650 for transmitting a negative voltage Vbb via a switching transistor NW# as other operating source voltage. The sense amplifier activating circuit 612c accepts as one operating source voltage, a high voltage Vpp supplied to a sub Vpp line 602 from a main Vpp line 600 through a switching transistor PW#c.

Upon standby (during a period of the standby cycle and a period prior to the activation of the sense amplifier), a group selection signal B is low in level. In this condition, the sense amplifier activating circuit 612c outputs a sense activation signal /SO indicative of an inactive state at the level of the high voltage Vpp in accordance with the high voltage Vpp supplied to the sub Vpp line 602 through the switching transistor PW#c that has been turned on. In this condition, a sense amplifier activating transistor PST3 is brought into a much deeper off state.

Before a sense timing signal φSA is activated, the group selection signal B is rendered high in level so that the switching transistor PW#c is turned off and the switching transistor NW# is turned on. Thus, the negative voltage Vbb supplied to the main Vpp line 650 is supplied to the sub Vpp line 652. In response to the activation of the sense timing signal φSA, the sense activation signal /SO outputted from the sense amplifier activating circuit 612c is brought to a low level corresponding to negative voltage Vbb level, so that the sense amplifier activating transistor PST3 is deeply turned on to supply the source voltage Vcc on the source line to the active restore circuit (P sense amplifier) PSA at quick speed. As a result, the active restore circuit (P sense amplifier) is activated.

When one memory cycle is completed, the sense timing signal φSA is rendered inactive and the group selection signal B is rendered low in level. Thus, the switching transistor PW#c is turned on again, whereas the switching transistor NW# is turned off, thereby resetting the sense activation signal /SO to the high voltage Vpp level again.

By generating the sense activation signal /SO of the high voltage Vpp level upon standby and generating the sense activation signal /SO of the negative voltage Vbb level during the active cycle as in the case of the configuration shown in FIG. 62, each active restore circuit can be driven at high speed. Further, a current used up by the sense amplifier activating circuit 612c and a leakage current that flows through the sense amplifier activating circuit PST3, can be reduced, thereby making it possible to realize a sense amplifier circuit capable of providing low current consumption.

Figure 63:
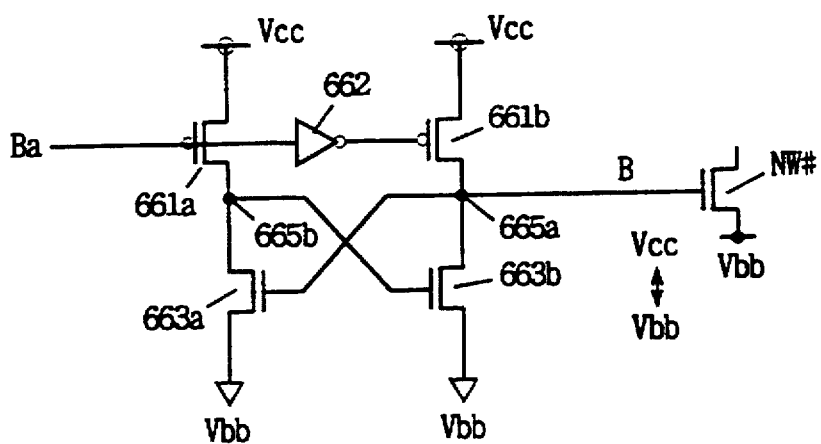
FIG. 63 is a diagram showing one example of a circuit configuration for performing level conversion on a group selection signal supplied to a switching transistor provided to a negative voltage transmission line shown in FIG. 62.

FIG. 63 is a diagram showing a configuration of a circuit for converting the level of the group selection signal B supplied to the switching transistor NW# shown in FIG. 62. In FIG. 63, the level converting circuit includes a p channel MOS transistor 661a for receiving a group selection signal Ba of a high level at source voltage Vcc level, an inverter 662 for inverting the group selection signal Ba, and a p channel MOS transistor 661b for receiving a signal outputted from the inverter 662 at the gate thereof. The p channel MOS transistor 661a charges an internal node 665b to the source voltage Vcc level upon conduction. The p channel MOS transistor 661b charges a node 665a to the source voltage Vcc level upon conduction.

Further, the level converting circuit includes an n channel MOS transistor 663a whose gate is supplied with a signal voltage on the node 665a and which discharges the potential at the node 665b to negative voltage Vbb level upon conduction, and an n channel MOS transistor 663b whose gate is supplied with a signal voltage on the node 665b and which discharges the voltage on the node 665a to the negative voltage Vbb level. The group selection signal B supplied to switching transistor NW# is outputted from the node 665a. The operation of the level converting circuit will now be described in brief.

The inverter 662 operates with source voltage Vcc and ground voltage Vss as one and another operating source voltages. When the group selection signal Ba is low in level, the p channel MOS transistor 661a is turned on and the p channel MOS transistor 661b is turned off. In this condition, the node 665b is charged by the p channel MOS transistor 661a so that the potential on the node 665b is raised. The n channel MOS transistor 663b discharges the node 665a to the negative voltage Vbb level in accordance with a rise in the potential on the node 665b. The n channel MOS transistor 663a is brought into an off state with a decrease in the potential on the node 665a. Finally, the node 665a is brought to the negative voltage Vbb level and the node 665b is brought to the source voltage Vcc level. Since the gate of the n channel MOS transistor 663a is supplied with the negative voltage Vbb, the n channel MOS transistor 663a is completely turned off. In this condition, the group selection signal B is brought to the negative voltage Vbb level to turn off the switching transistor NW#.

When the group selection signal Ba is high in level, the p channel MOS transistor 661a is turned off and the p channel MOS transistor 661b is turned on. In this condition, the node 665a is charged by the p channel MOS transistor 661b so that the potential on the node 665a is increased. Accordingly, the n channel MOS transistor 663a discharges the node 665b to the negative voltage Vbb level. The node 665a is brought to the source voltage Vcc level and the node 665b is brought to the negative voltage Vbb level. When the switching transistor NW# receives the group selection signal B of the source voltage Vcc level at the gate thereof, the switching transistor NW# is turned on.

The level converting circuit shown in FIG. 63 is simply used to control the switching transistor NW#. The group selection signal B supplied to the switching transistor PW# (PW#C) shown in FIG. 62 may have a swing between the high voltage Vpp level and the ground voltage Vss level. The generation of a signal having an amplitude between the high voltage Vpp level and the negative voltage Vbb level, which is supplied commonly to the switching transistors PW# and NW#, will be described later.

The group selection signal Ba is rendered active in accordance with an array address signal. As a level converting circuit for converting a control signal having an amplitude of Vcc to a signal having an amplitude of Vpp, the level converting circuit shown in FIG. 37 can be used.

Figure 64:
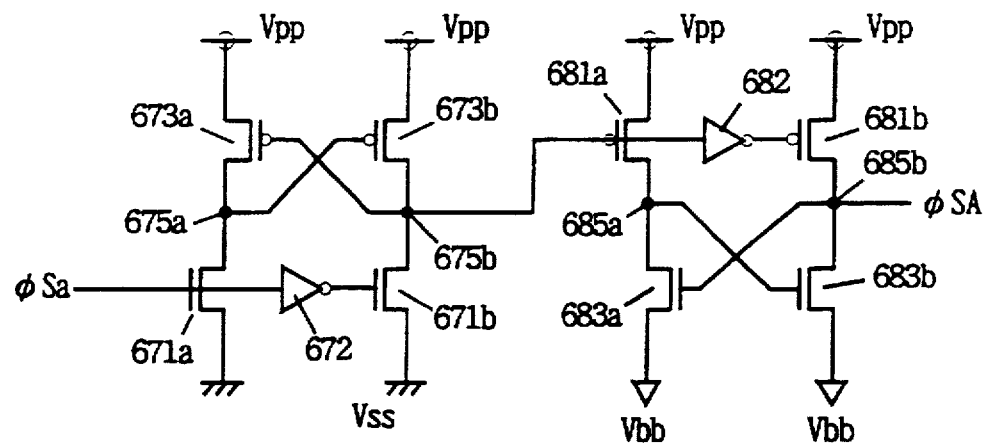
FIG. 64 is a diagram depicting one example of a circuit configuration for performing level conversion on a sense timing signal supplied to a sense amplifier activation circuit shown in FIG. 62.

FIG. 64 is a diagram showing a circuit configuration for converting the level of the sense timing signal φSA shown in FIG. 62. In FIG. 64, a sense timing signal φSa of an amplitude of Vcc level is converted into the sense timing signal φSA of an amplitude of Vpp-Vbb level.

The level converting circuit shown in FIG. 64 includes an n channel MOS transistor 671a whose gate is supplied with the sense timing signal φSa, an inverter 672 for inverting the sense timing signal φSa, and an n channel MOS transistor 671b whose gate is supplied with a signal outputted from the inverter 672. Upon conduction, the n channel MOS transistor 671a discharges a node 675a to ground voltage Vss level. The n channel MOS transistor 671b discharges a node 675b to the ground voltage Vss level when it is brought into a conducting state.

The level converting circuit includes a p channel MOS transistor 673b whose gate is supplied with a signal potential on the node 675a and which supplies a high voltage Vpp to the node 675b upon conduction thereof, and a p channel MOS transistor 673a whose gate is supplied with a signal voltage on the node 675b and which supplies the high voltage Vpp to the node 675a upon conduction thereof. The level converting circuit composed of the transistors 671a through 673b and the inverter 672 is identical to the level converting circuit shown in FIG. 37. The operation of the level converting circuit will not be repeatedly described. When the sense timing signal φSa is at a source voltage Vcc level, a signal of high voltage Vpp level is generated at the node 675b. When the sense timing signal φSa is at the ground voltage Vss level, the node 675b is brought to the ground voltage Vss level.

Further, the level converting circuit includes a p channel MOS transistor 681a whose gate is supplied with a signal potential on the node 675b, an inverter 682 for inverting the logic of the signal potential on the node 675b, and a p channel MOS transistor 681b whose gate is supplied with a signal outputted from the inverter 682. The inverter 682 operates with the high voltage Vpp as one operating source voltage thereof to output a signal having an amplitude of Vpp. The p channel MOS transistor 681a supplies the high voltage Vpp to a node 685a when it conducts. The p channel MOS transistor 681b supplies the high voltage Vpp to a node 685b when it conducts.

Furthermore, the level converting circuit includes an n channel MOS transistor 685b whose gate is supplied with a signal potential on the node 685a and which discharges the node 685b to the negative voltage Vbb level upon conduction thereof, and an n channel MOS transistor 683a whose gate is supplied with a signal potential on the node 685b and which discharges the node 685a to the negative voltage Vbb level upon conduction thereof.

When the potential on the node 675b is at high voltage Vpp level, the p channel MOS transistor 681a is turned off and the p channel MOS transistor 681b is turned on so that the node 685b is charged to the high voltage Vpp level. At this time, transistor 683a is turned on so that the node 685a is discharged to the negative voltage Vbb level, and the transistor 683b is turned off.

When the potential on the node 675b is at the ground voltage Vss level, the p channel MOS transistor 681a is turned on and the p channel MOS transistor 681b is turned off. As a result, the node 685a is brought to the high voltage Vpp level. In this condition, the transistor 683b is turned on so that the node 685b is discharged to the negative voltage Vbb level, and the transistor 683a is brought into an off state.

Owing to such two-stage level conversion, the sense timing signal φSA having the amplitude of Vpp-Vbb is generated.

A circuit configuration for generating the group selection signal B shown in FIG. 62 may use the level converting circuit shown in FIG. 64.

[Sense Connection Control Circuit]

Figure 65:
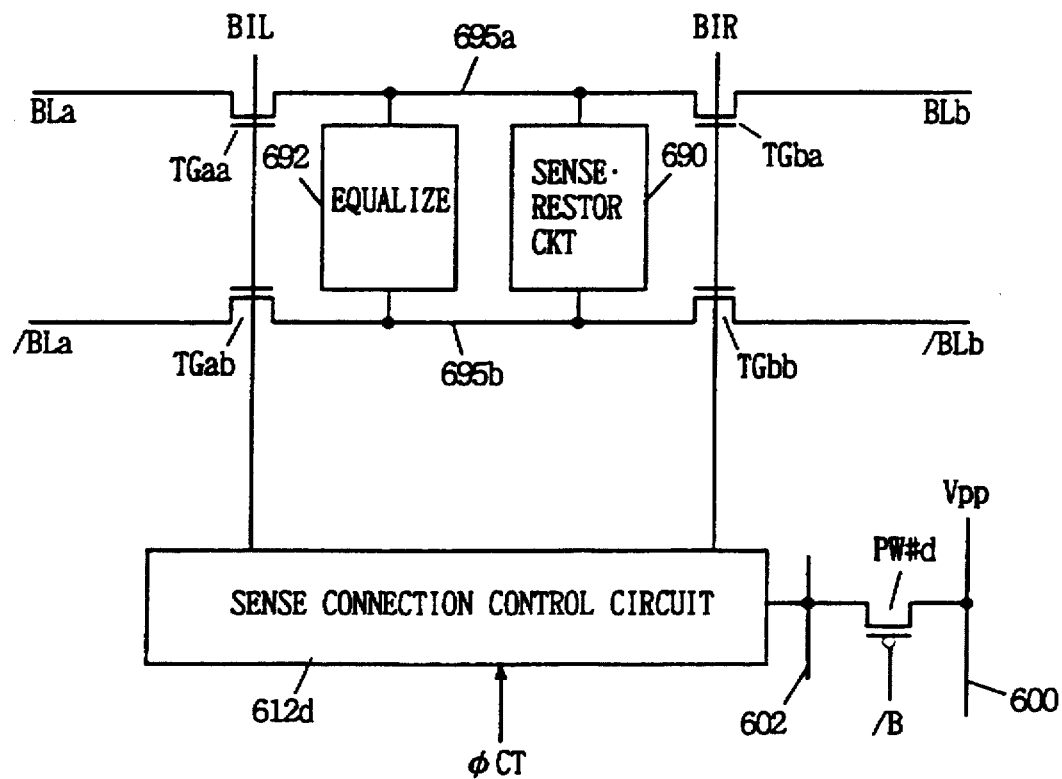
FIG. 65 is a diagram showing a further configuration of the control circuit shown in FIG. 59.

FIG. 65 is a diagram showing a circuit configuration for controlling electrical connections between each of sense amplifiers in a sense amplifier band and its corresponding bit line pair. In FIG. 65, pairs of bit lines included in adjacent two memory arrays are shown.

Bit lines BLa and /BLa included in one memory array are respectively electrically connected to nodes 695a and 695b through connecting gates TGaa and TGab. Bit lines BLb and /BLb included in the other memory array are respectively electrically connected to nodes 695a and 695b through connecting gates TGba and TGbb. A sense-restore circuit 690 including N sense amplifier and an active restore circuit and an equalize circuit 692 whose configuration will be described later in detail, are connected between the nodes 695a and 695b.

A sense connection control circuit 612d supplies a connection control signal BIL to the connecting gates TGaa and TGab. Similarly, sense connection control circuit 612d supplies a connection control signal BIR to the connecting gates TGba and TGbb. The sense connection control circuit 612d sets activation/inactivation of the connection control signals BIL and BIR in response to a connection control signal φCT. The sense connection control circuit 612d is operated with a voltage on a sub Vpp line 602 as one operating source voltage. The sub Vpp line 602 is electrically connected to main Vpp line 600 through a switching transistor PW#d. A signal /B supplied to the switching transistor PW#d is set to a low level upon standby. The connection control signals BIL and BIR each having a high voltage Vpp level are supplied from the sense connection control circuit 612d.

In operation, a connection control signal is maintained at the high voltage Vpp level only with respect to one memory array including a selected word line. A connection control signal relative to the other memory array is set to ground voltage Vss level. Each connection control signal is generated based on the connection control signal φCT produced in accordance with an array address and an operation timing signal. When the selected word lines are included in neither memory arrays, the connection control signals BIL and BIR are both maintained at a high level indicative of a standby state. By maintaining the connection control signals BIL and BIR at the high voltage Vpp level, a voltage having a source voltage Vcc level can be written into its corresponding memory cell when the sense-restore circuit 690 is operated. Further, a voltage on a selected bit line pair can be supplied to the sense-restore circuit 690 at quick speed.

Here, the sub Vpp line 602 is normally supplied with the voltage having the source voltage Vcc level. During a standby cycle, the connection control signals BIL and BIR each having the source voltage Vcc level are outputted. During an active cycle, and only the connection control signal for the selected memory array is set to the high voltage Vpp level and the other non-selected memory array have the related connection control signal discharged may be used so as to be discharged to the ground voltage level. At this time, the switching transistor PW#d is turned off during the standby cycle, and is turned on during the active cycle.

In either case, a sub-threshold current that flows through the sense connection control circuit 612d, can be reduced.

[Equalize Control Circuit]

Figure 66:
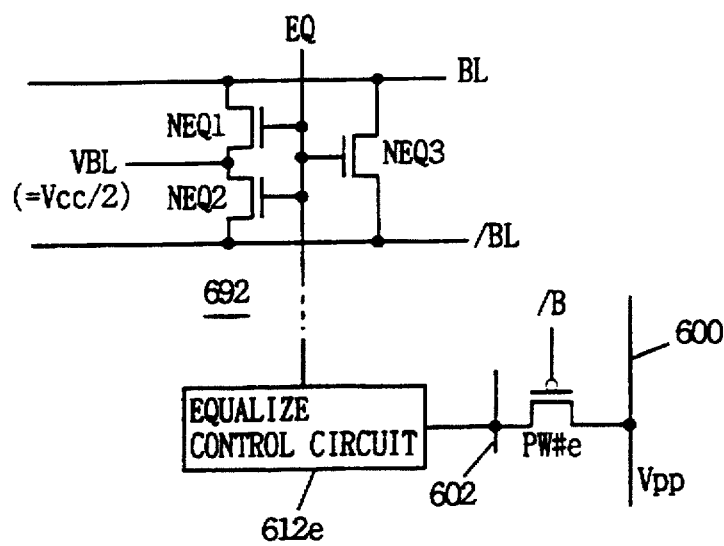
FIG. 66 is a diagram illustrating a still further configuration of the control circuit shown in FIG. 59.

FIG. 66 is a diagram showing a configuration of a portion for controlling equalize/precharge of each bit line. In FIG. 66, an equalize circuit 692 is disposed to each pair of bit lines BL and /BL (see FIG. 65). The equalize circuit 692 is not necessarily limited in the arrangement to a shared sense amplifier arrangement shown in FIG. 65. A configuration may be used in which sense amplifiers are respectively provided corresponding to pairs of bit lines. Therefore, the equalize circuit 692 is generically shown being provided in association with the bit line pair BL and /BL in FIG. 66. The equalize circuit 692 includes n channel MOS transistors NEQ1 and NEQ2 brought into a conductive state in response to an equalize signal EQ to supply a predetermined precharge voltage VBL (=Vcc/2) to the bit lines BL and /BL, and an n channel MOS transistor NEQ3 rendered conductive in response to the equalize signal EQ to electrically short-circuit the bit lines BL and /BL.

An equalize control circuit 612e operates with a voltage on a sub Vpp line 602 as one operating source voltage. A voltage on main Vpp line 600 is supplied to the sub Vpp line 602 through a switching transistor PW#e. A group selection signal /B supplied to the switching transistor PW#e is brought to a low level indicative of an active state during a standby cycle. During an active cycle, the group selection signal /B for a selected memory array is brought to a high level indicative of an inactive state. The operation of the equalize control circuit 612e will now be described in brief.

During the standby cycle, the group selection signal /B is low in level and the sub Vpp line 602 is supplied with high voltage Vpp from the main Vpp line 600. Further, the equalize control circuit 612e outputs the equalize signal EQ having high voltage Vpp level. In response to the equalize signal EQ having the high voltage Vpp level, the n channel MOS transistors NEQ1 through NEQ3 are all turned on so that the bit lines BL and /BL are charged to predetermined precharge voltage VBL level. The following advantages can be brought about by outputting the equalize signal EQ having the high voltage Vpp level.

Even when a power source voltage Vcc is set to 1.5 V, for example and the difference between the source voltage Vcc and the precharge voltage VBL becomes small, the intermediate voltage VBL can be reliably supplied to the bit lines BL and /BL without being affected by a loss of a threshold voltage of each of the n channel MOS transistors NEQ1 through NEQ3 for precharge/equalize of the bit lines BL and /BL, thereby making it possible to precharge and equalize the bit lines BL and /BL to the intermediate voltage VBL level.

When the active cycle is started, the group selection signal /B is rendered high in level so that the switching transistor PW#e is turned off. Then, the equalize signal EQ outputted from the equalize control circuit 612e is brought to a low level so that the n channel MOS transistors NEQ1 through NEQ3 are turned off. In this condition, an output charging transistor in the equalize control circuit 612e is operated in the sub-threshold region. However, the switching transistor PW#e is in an off state and a sub-threshold current flowing therethrough is sufficiently suppressed. Thereafter, a memory cell is selected and the writing or reading of data with respect to the selected memory is performed.

When a memory cycle is completed, the group selection signal /B is first rendered low in level so that the switching transistor PW#e is turned on. Thus, the equalize control circuit 612e is operated with high voltage Vpp supplied to the sub Vpp line 602 as one operating source voltage to output equalize signal EQ having high voltage Vpp level. Thus, the transistors NEQ1 through NEQ3 are turned on at high speed and the bit lines BL and /BL are precharged and equalized to predetermined voltage VBL at quick speed, due to an effect caused by the high voltage Vpp level of the equalize signal EQ (because on-resistances of the transistors NEQ1 through NEQ3 become small as compared with the case of use of the equalize signal EQ having the source voltage Vcc level).

By providing the sub Vpp line and the main Vpp line for the equalize control circuit 612e as described above, an equalize control circuit can be realized which provides low current consumption and precharges the bit lines BL and /BL at high speed.

Twenty-Seventh Embodiment

Figure 67:
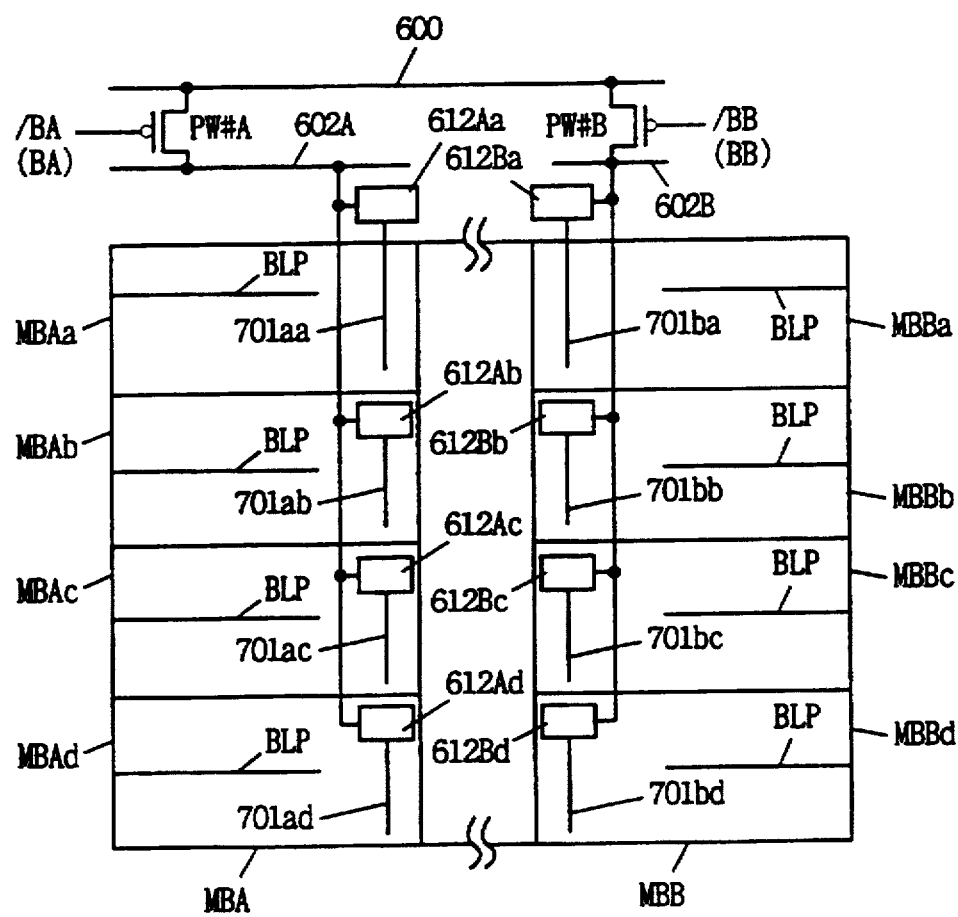
FIG. 67 is a diagram showing the arrangement of distributed sub Vpp lines and control circuits in a single memory block employed in a semiconductor memory device according to a twenty-seventh embodiment of the present invention.

FIG. 67 is a diagram showing the structure according to a twenty-seventh embodiment of the present invention. Two memory arrays MBA and MBB are shown in FIG. 67. The memory array MBA is divided into a plurality of memory column blocks MBAa through MBAd (four memory column blocks in FIG. 67). The memory column blocks MBAa through MBAd each include a plurality of bit line pairs BLP. Similarly, the memory array MBB is divided into a plurality of memory column blocks MBBa through MBBd (four memory blocks in FIG. 67).

Corresponding to the memory block division, sense amplifiers and equalize circuits are divided into a plurality of column blocks in the same manner as described above.

Sense/equalize control circuits 612Aa through 612Ad are respectively disposed corresponding to the memory column blocks MBAa through MBAd. The sense/equalize control circuits 612Aa through 612Ad each are supplied with high voltage Vpp from a sub Vpp line 602A. The sense/equalize control circuits 612Aa through 612Ad control operations of sense amplifiers and equalize circuits in their corresponding memory column blocks MBAa through MBAd. In FIG. 67, signal conductor lines 701aa through 701ad are shown as lines for the transmission of control signals of the sense/equalize control circuits 612Aa through 612Ad. The sub Vpp line 602A is electrically connected to a main Vpp line 600 through a switching transistor PW#A.

The switching transistor PW#A is supplied with a group selection signal /BA (or BA) according to an operating mode and is rendered conductive in the standby cycle or in an active cycle depending on the operation mode (see the embodiment shown in FIGS. 60 through 65).

Sense/equalize control circuits 612Ba through 612Bd are respectively disposed corresponding to the memory column blocks MBBa through MBBd. The high voltage Vpp is supplied to the sense/equalize control circuits 612Ba through 612Bd through a sub Vpp line 602B. The sense/equalize control circuits 612Ba through 612Bd control operations of sense amplifiers and equalize circuits in their corresponding memory column blocks MBBa through MBBd.

In FIG. 67, signal conductor lines 701ba through 701bd are illustrated as lines for the transmission of control signals of the sense/equalize control circuits 612Ba through 612Bd. The sub Vpp line 602B is electrically connected to the main Vpp line 600 through a switching transistor PW#B. The switching transistor PW#B is supplied with a group selection signal /BB (or BB) and is rendered conductive in an active cycle or in a standby cycle depending on the operation mode.

In the configuration shown in FIG. 67, the sense/equalize control circuits 612Aa through 612Ad and 612Ba through 612Bd may simply control the operations of the sense amplifiers and the equalize circuits in their corresponding memory column blocks. The load capacitance of each signal line for transmitting each control signal can be reduced. Thus, the loads on the outputs of the sense/equalize control circuits 612Aa through 612Ad and 612Ba through 612Bd are reduced so that their corresponding signal lines 701aa through 701ad and 701ba through 701bd can be driven into predetermined states at high speed. Since the loads on the outputs of the sense/equalize control circuits 612Aa through 612Ad and 612Ba through 612Bd are reduced, driving capabilities of the sense/equalize control circuits can be relatively small and the sense/equalize control circuits 612Aa through 612Ad and 612Ba through 612Bd can be decreased in size, thereby making it possible to suppress an increase in the area occupied by each array.

Twenty-Eighth Embodiment

Figure 68A:
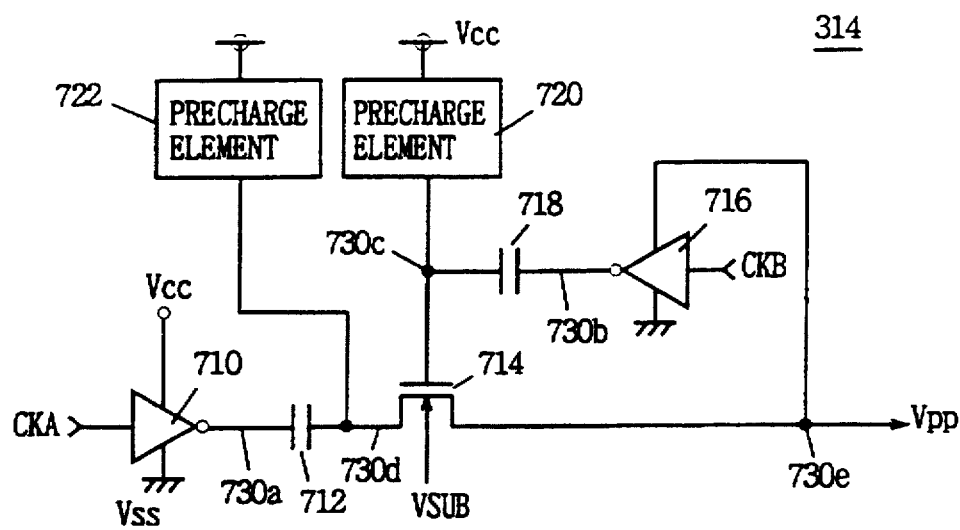
FIGS. 68A and 68B are respectively diagrams showing a configuration of a high voltage generating circuit employed in the present invention and a signal waveform chart for describing the operation of the high voltage generating circuit.
Figure 68B:
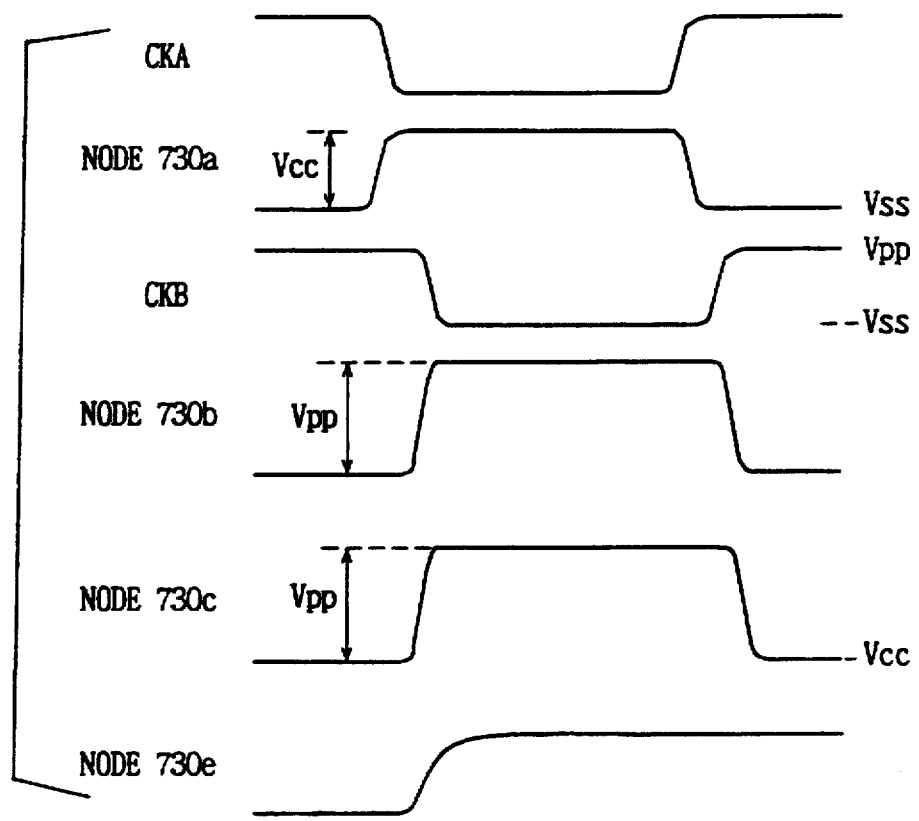

FIGS. 68A and 68B are respectively diagrams for illustrating a configuration and operation of a Vpp generating circuit employed in a twenty-eighth embodiment of the present invention. In FIG. 68A, a Vpp generating circuit 314 includes an inverter 710 operating with source voltage Vcc and ground voltage Vss as operating source voltages to invert a clock signal CKA, a capacitor 712 for performing a charge pump operation in response to a signal outputted from the inverter 710, an n channel MOS transistor 714 for conducting an electric charge supplied from the capacitor 712 to an output node 730e, an inverter 716 operating with a voltage on the output node 730e as one operating source voltage to invert a clock signal CKB, a capacitor 718 for performing a charge pump operation in response to a signal outputted from the inverter 716 to supply an electric charge to a node 730c, a precharge element 720 for precharging the node 730c to source voltage Vcc level, and a precharge element 722 for precharging a node 730d to the source voltage Vcc level. The operation of the Vpp generating circuit shown in FIG. 68A will now be described with reference to an operation waveform chart shown in FIG. 68B.

The clock signals CKA and CKB are in phase with each other but are off set in phase. When the clock signal CKA falls from a high level to a low level, the level of a potential on an output node 730a of the inverter 710 rises from a low level corresponding to ground voltage Vss level to a high level corresponding to the source voltage Vcc level. Since the node 730d is precharged to the source voltage Vcc level by the precharge element 722, the level of the voltage on the internal node 730d is raised to about 2·Vcc level when the potential on the node 730a is increased. Then, the clock signal CKB is lowered from the high level corresponding to the source voltage Vcc level to the low level so that the level of a voltage on a node 730b is raised to a high level corresponding to a voltage level on the output node 730e.

The node 730c is precharged to the source voltage Vcc level by the precharge element 720. Thus, when the output signal of the inverter 716 is rendered high in level, the voltage level on the node 730c is brought to Vcc+Vpp level by the charge pump operation of the capacitor 718. Vcc+Vpp>2·Vcc and hence electric charges having a 2·Vcc level supplied to the internal node 730d are supplied to the output node 730e through the n channel MOS transistor 714. Thus, the level of the voltage on the output node 730e is raised. When the output node 730d becomes identical in voltage level to the output node 730e, the charge supplying operation of the n channel MOS transistor 714 is stopped. Then, the clock signal CKA rises from the low level to the high level so that the level of the voltage on the node 730a is reduced to the ground voltage Vss level. With a fall in the voltage level at the node 730a, the voltage level at the node 730d is reduced but charged to the source voltage Vcc level by the precharge element 722 again.

Then, the clock signal CKB rises from the low level to the high level so that the output signal of the inverter 716 is rendered low in level. Similarly, the voltage level at the node 730c is reduced. The amplitude of the output signal of the inverter 716 is equivalent to voltage Vpp level at the output node 730e. Accordingly, the level of the voltage on the node 730c is reduced below the source voltage Vcc level. This is because the voltage Vpp on the output node 730e at the time when the output signal of the inverter 716 is low in level, is different in level from the voltage Vpp on the output node 730e at the time when the output signal of the inverter 716 is next raised to the high level, and the latter is higher. The node 730c is precharged to the source voltage Vcc level by the precharge element 720 again. In this condition, the n channel MOS transistor 714 is maintained at an off state because the voltage level at the node 730e is higher than the voltage levels at the nodes 730c and 730d. By subsequently repeating this operation, the voltage Vpp on the output node 730e can be brought to a predetermined voltage level.

By supplying the output signal of the inverter which operates with the voltage developed at the output node as the one operating source voltage, to the gate of the transistor for supplying the electric charges to the output node through the capacitor as illustrated in FIG. 68A, the potential applied to the gate of the charge transfer transistor can be efficiently raised. Correspondingly, the electric charges can be efficiently supplied from the internal node 730d to the output node 730e.

Figure 69A:
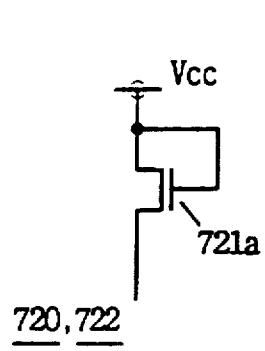
FIGS. 69A and 69B are respectively diagrams showing examples of configurations of precharge elements shown in FIG. 68A.
Figure 69B:
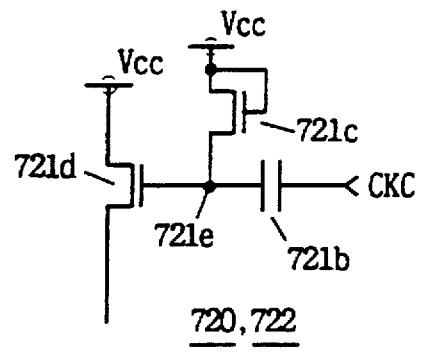

FIGS. 69A and 69B each are diagrams showing an example of configurations of the precharge elements 720 and 722 shown in FIG. 68A. In FIG. 69A, the precharge element 720 and/or 722 includes a diode-connected n channel MOS transistor 721a. In the configuration of the precharge element shown in FIG. 69A, a voltage of Vcc −Vth level is supplied to the node 730c and/or 730d. Here, Vth represents a threshold voltage of a transistor 721a.

The precharge element 720 and/or 722 shown in FIG. 69B includes a capacitor 721b for performing a charge pump operation in response to a clock signal CKC to supply an electric charge to a node 721e, a diode-connected n channel MOS transistor 721c for clamping a voltage level at the node 721e to the source voltage level, and an n channel MOS transistor 721d for supplying source voltage Vcc in response to a signal potential on the node 721e.

In the configuration shown in FIG. 69B, the voltage level at the node 721e is precharged to the Vcc−Vth level by the n channel MOS transistor 721c. Therefore, the voltage level at the node 721e is driven into a voltage level higher than the level of the source voltage Vcc when the clock signal CKC rises. Accordingly, the source voltage Vcc can be supplied through the n channel MOS transistor 721d and the charge can be more efficiently supplied from the node 730d to the node 730e by increasing the potential at the gate of the transistor 714 shown in FIG. 68A.

[Vbb Generating Circuit]

Figure 70:
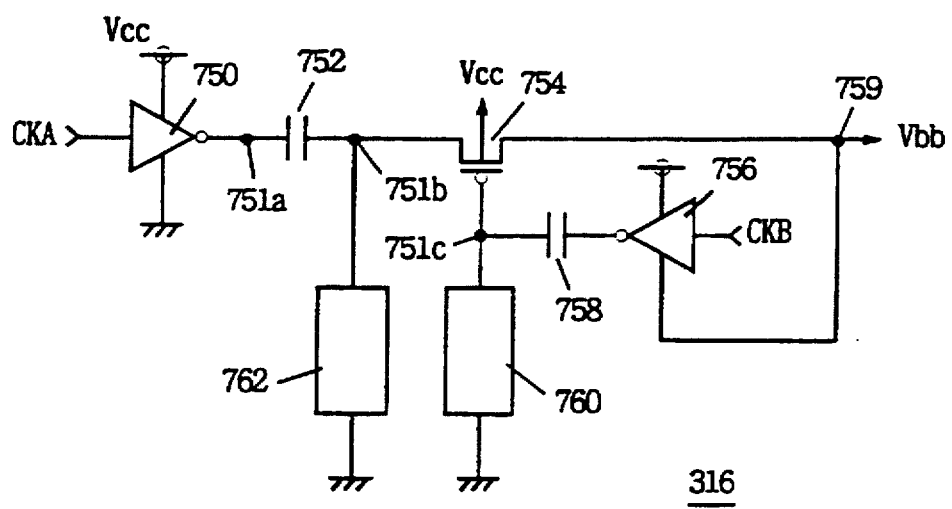
FIG. 70 is a diagram illustrating one example of a configuration of a negative voltage generating circuit employed in the semiconductor memory device of the present invention.
Figure 71:
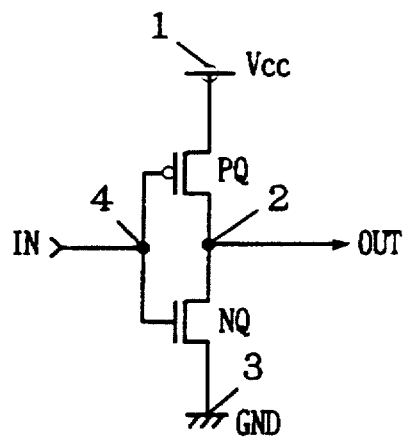
FIG. 71 is a diagram showing one example of a configuration of a conventional logic gate.
Figure 72:
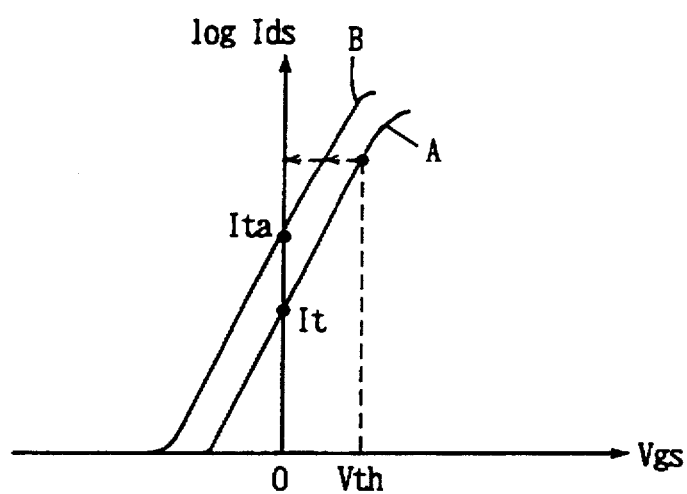
FIG. 72 is a graph illustrating drain current-to-gate/source voltage characteristics for describing problems on the conventional logic gate circuit.
Figure 73:
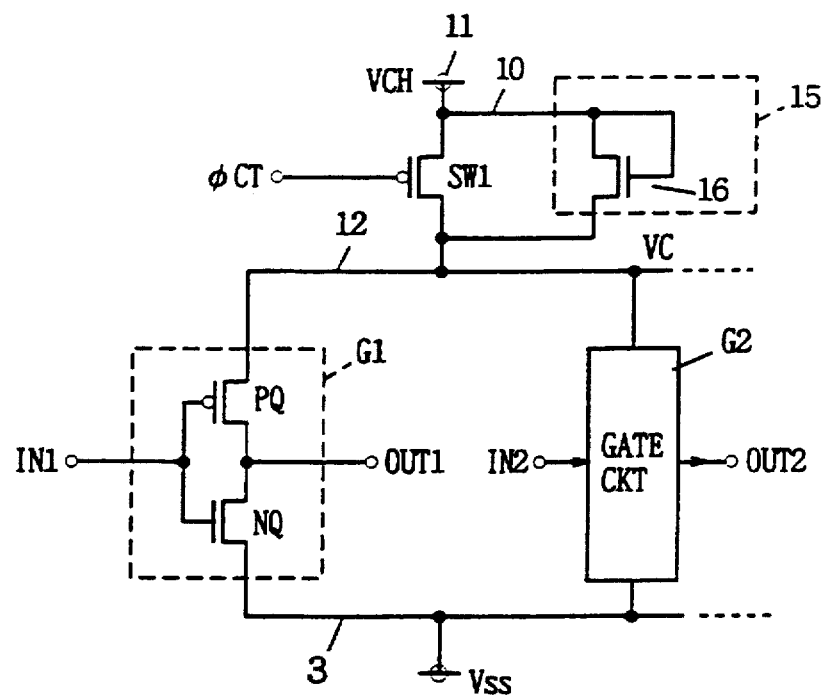
FIG. 73 is a diagram showing a conventional hierarchical power source configuration.
Figure 74:
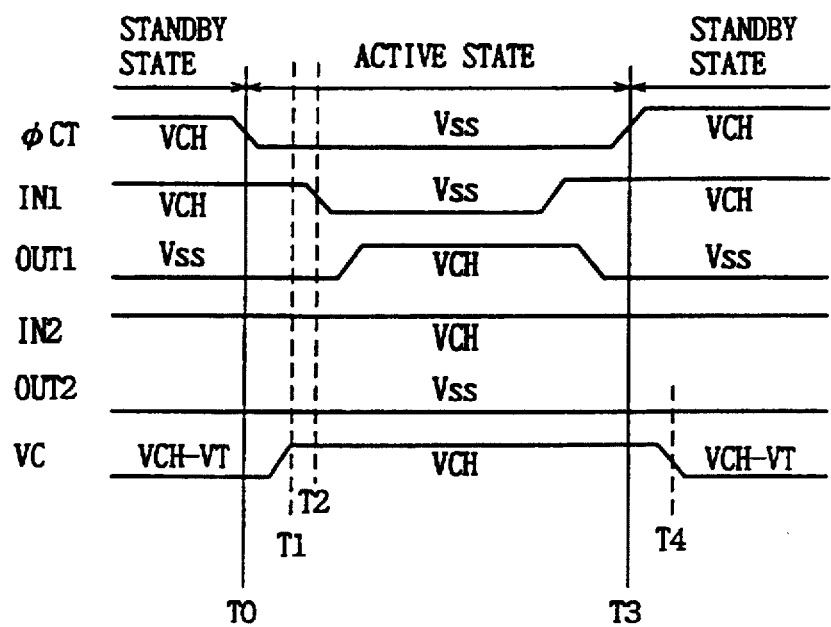
FIG. 74 is a waveform chart for describing the operation of the hierarchical source configuration shown in FIG. 73.

FIG. 70 is a diagram showing an example of the configuration of the Vbb generating circuit 316 shown in FIG. 32. In FIG. 70, the Vbb generating circuit 316 includes an inverter 750 operating with source voltage Vcc and ground voltage Vss as operating source voltages to invert a clock signal CKA, a capacitor 752 for performing a charge pump operation in response to a signal outputted from the inverter 750 to supply an electric charge to a node 751b, a p channel MOS transistor 754 for supplying the electric charge stored on the node 751b to an output node 759, an inverter 756 operating with a voltage on the output node 759 and the source voltage Vcc as operating source voltages to invert a clock signal CKB, a capacitor 758 for performing a charge pump operation in response to a signal outputted from the inverter 756 to supply an electric charge to a gate electrode node 751c of the p channel MOS transistor 754, a precharge element 762 for precharging the node 751b to ground voltage Vss level, and a precharge element 760 for precharging the gate electrode node 751c to the ground voltage Vss level.

The Vbb generating circuit shown in FIG. 70 is substantially operated in a manner similar to the Vpp generating circuit shown in FIG. 68A. The voltage generated from the Vbb generating circuit shown in FIG. 70 is simply different in polarity from that generated from the Vpp generating circuit shown in FIG. 68A. The amplitude of the voltage on the node 751b is represented as −Vcc+Vss. The amplitude of the output signal of the inverter 756 is represented as Vcc−Vbb. Accordingly, the amplitude of the voltage on the gate electrode node 751c is obtained as −Vcc+Vbb+Vss. −Vcc<Vcc+Vbb, and a negative voltage Vbb supplied to the output node 759 can reach −Vcc voltage level. The Vpp generating circuit shown in FIG. 68A can generate a high voltage Vpp having a 2·Vcc voltage level. In either case, a sufficient amount of charges can be supplied to an output node during a single clock signal cycle and a high voltage Vpp and a negative voltage Vbb each having a predetermined voltage level can be generated at quick speed.

According to the twenty-eighth embodiment of the present invention, as described above, since the electric charge is supplied to the gate of the transistor for supplying the electric charge to the output node by performing the charge pump operation in response to the output of the inverter operating with the voltage developed on the output node as the one operating source voltage, the electric charge can be efficiently supplied to the output node and the high voltage Vpp and the negative voltage Vbb each having the predetermined voltage level can be generated stably and at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a main voltage transmission node for supplying a voltage of a first logic level:

a sub voltage transmission node;

a voltage supply node for supplying a voltage of a second logic level;

a logic gate receiving a voltage on said sub voltage transmission node and a voltage on said voltage supply node both as operating source voltages to perform a predetermined logic process on a received signal for outputting; and a variable conductance element connected between said sub voltage transmission node and said main voltage transmission node and coupled to have a conductance value thereof increased in accordance with a transition of a signal outputted from said logic gate being to the first logic level.

2. The semiconductor integrated circuit device as claimed in claim 1, wherein said variable conductance element comprises a depletion type insulated gate field effect transistor having a gate receiving said signal outputted.

3. The semiconductor integrated circuit device as claimed in claim 1, further comprising:
an insulated gate type field effect transistor having a threshold voltage and connected between said main voltage transmission node and said sub voltage transmission node, said insulated gate field effect transistor having a gate supplied with a voltage between the sum of a voltage on said main voltage transmission node and the threshold voltage, and the voltage on the said main voltage transmission node.

4. The semiconductor integrated circuit device as claimed in claim 1, further comprising:
a second main voltage transmission line for transmitting the voltage of the second logic level; and
a second variable conductance element provided between said second main voltage transmission line and said voltage supply node, said second variable conductance element being coupled to have a conductance value increased in accordance with a transition of the output signal of said logic gate being to the second logic level.

5. The semiconductor integrated circuit device as claimed in claim 4, further comprising:
an insulated gate type field effect transistor having a threshold voltage and connected between said second main voltage transmission line and said voltage supply node, said insulated gate type field effect transistor having a gate supplied with a level of a voltage between the sum of a voltage on said second main voltage transmission line and the threshold voltage, and the voltage on said second main voltage transmission line.

6. The semiconductor integrated circuit device as claimed in claim 4, wherein said second variable conductance element comprises a depletion type insulated gate type field effect transistor having a gate receiving said output signal.

7. A semiconductor integrated circuit device according to claim 1, wherein said variable conductance means comprises,
an insulated gate type field effect transistor connected between said main voltage transmission node and said sub voltage transmission node, and having a gate connected to said sub voltage transmission node, said insulated gate type field effect transistor causing a punchthrough phenomenon when the difference between a voltage on said main voltage transmission node and the voltage on said sub voltage transmission node reaches a predetermined value or greater in accordance with the transition of the output signal of said logic gate to the first logic level.

8. The semiconductor integrated circuit device as claimed in claim 7, further comprising:
a second main voltage transmission node for supplying the voltage of the second logic level; and
a second insulated gate field effect transistor having one conduction electrode node connected to said voltage supply node, another conduction electrode node connected to said second main voltage transmission node and a gate electrode node connected to said voltage supply node, said second insulated gate field effect transistor causing a punchthrough phenomenon when the difference between the voltage on said voltage supply node and a voltage on said second main voltage transmission node reaches a predetermined value or greater in accordance with the transition of said output signal to the second logic level.

9. The semiconductor integrated circuit device as recited in claim 1, wherein said variable conductance means comprises a variable resistance element having a resistance value thereof reduced while the output signal of said logic gate is at the first logic level.

10. The semiconductor integrated circuit device as recited in claim 4, wherein said second variable conductance means comprises a variable resistance element having a resistance value thereof reduced while the output signal of said logic gate is at the second logic level.

11. The semiconductor integrated circuit device as recited in claim 7, wherein said logic gate includes a field effect transistor of the insulated gate type having a first gate length, and said insulated gate type field effect transistor has a second gate length shorter than said first gate length.

12. The semiconductor integrated circuit device as recited in claim 8, wherein said logic gate includes a field effect transistor of the insulated gate type having a first gate length, and said second insulated gate type field effect transistor has a second gate length shorter than said first gate length.

* * * * *